(12) United States Patent
Kobayashi et al.

(10) Patent No.: US 11,848,340 B2
(45) Date of Patent: Dec. 19, 2023

(54) IMAGING DEVICE AND ELECTRONIC DEVICE

(71) Applicant: SEMICONDUCTOR ENERGY LABORATORY CO., LTD., Atsugi (JP)

(72) Inventors: Hidetomo Kobayashi, Kanagawa (JP); Yuki Tamatsukuri, Kanagawa (JP); Naoto Kusumoto, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/705,479

(22) Filed: Mar. 28, 2022

(65) Prior Publication Data

US 2022/0216254 A1    Jul. 7, 2022

Related U.S. Application Data

(63) Continuation of application No. 16/628,073, filed as application No. PCT/IB2018/054915 on Jul. 3, 2018, now Pat. No. 11,302,726.

(30) Foreign Application Priority Data

Jul. 14, 2017    (JP) ................. 2017-137861

(51) Int. Cl.
*H01L 27/146*    (2006.01)
*H01L 31/0272*    (2006.01)
*H01L 31/02*    (2006.01)

(52) U.S. Cl.
CPC .. *H01L 27/14614* (2013.01); *H01L 27/14643* (2013.01); *H01L 27/14689* (2013.01); *H01L 31/02016* (2013.01); *H01L 31/0272* (2013.01)

(58) Field of Classification Search
CPC ......... H01L 27/14614; H01L 27/14643; H01L 27/14689
See application file for complete search history.

(56) References Cited

U.S. PATENT DOCUMENTS 7,375,753 B2    5/2008    Mabuchi
8,390,714 B2    3/2013    Mabuchi
(Continued)

FOREIGN PATENT DOCUMENTS

CN    201048431 Y    4/2008
CN    205029751 U    2/2016
(Continued)

OTHER PUBLICATIONS

International Search Report (Application No. PCT/IB2018/054915) dated Oct. 2, 2018.
(Continued)

*Primary Examiner* — David A Zarneke
(74) *Attorney, Agent, or Firm* — Fish & Richardson P.C.

(57) ABSTRACT

An imaging device capable of executing image processing is provided. A structure is employed in which a photoelectric conversion element, a first transistor, a second transistor, and an inverter circuit are included; one electrode of the photoelectric conversion element is electrically connected to one of a source and a drain of the first transistor; the other of the source and the drain of the first transistor is electrically connected to one of a source and a drain of the second transistor; the one of the source and the drain of the second transistor is electrically connected to an input terminal of the inverter circuit; and data obtained by photoelectric conversion is binarized and output.

14 Claims, 31 Drawing Sheets

(56) References Cited

U.S. PATENT DOCUMENTS

| | | |
|---|---|---|
| 9,883,129 B2 | 1/2018 | Kurokawa |
| 2005/0128331 A1 | 6/2005 | Yoshida et al. |
| 2006/0072025 A1 | 4/2006 | Kakumoto et al. |
| 2009/0091806 A1 | 4/2009 | Inuiya |
| 2011/0108836 A1 | 5/2011 | Koyama et al. |
| 2014/0054446 A1 | 2/2014 | Aleksic |
| 2015/0279884 A1 | 10/2015 | Kusumoto |
| 2016/0172410 A1 | 6/2016 | Kurokawa |
| 2016/0219234 A1 | 7/2016 | Nishihara |
| 2016/0269657 A1 | 9/2016 | Nishihara |
| 2017/0094220 A1 | 3/2017 | Kurokawa |

FOREIGN PATENT DOCUMENTS

| | | |
|---|---|---|
| EP | 1475962 A | 11/2004 |
| EP | 2093997 A | 8/2009 |
| JP | 63-299268 A | 12/1988 |
| JP | 06-098079 A | 4/1994 |
| JP | 2011-119711 A | 6/2011 |
| JP | 2013-009194 A | 1/2013 |
| JP | 2015-195378 A | 11/2015 |
| JP | 2016-123087 A | 7/2016 |
| JP | 2017-063420 A | 3/2017 |
| KR | 2004-0081781 A | 9/2004 |
| KR | 2007-0026964 A | 3/2007 |
| WO | WO-2015/145306 | 10/2015 |

OTHER PUBLICATIONS

Written Opinion (Application No. PCT/IB2018/054915) dated Oct. 2, 2018.

Zhao.X et al., "An Analysis of Multivalued nMOS Basic Circuit Units", Journal of Hangzhou University(Natural Science), 1993, vol. 20, No. 1, pp. 36-42.

Chinese Office Action (Application No. 201880045604.4) dated Oct. 8, 2021.

$a = x_1 w_1 + x_2 w_2 + b$

FIG. 30A1
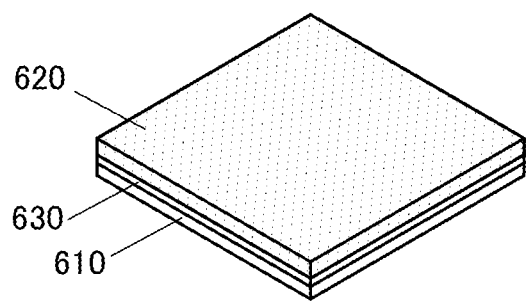
FIG. 30B1
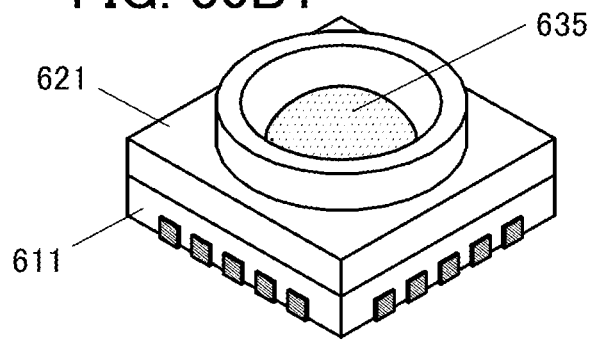
FIG. 30A2
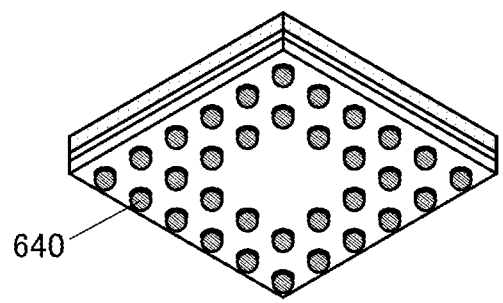
FIG. 30B2
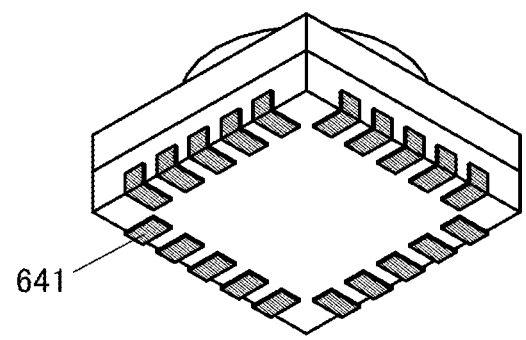
FIG. 30A3
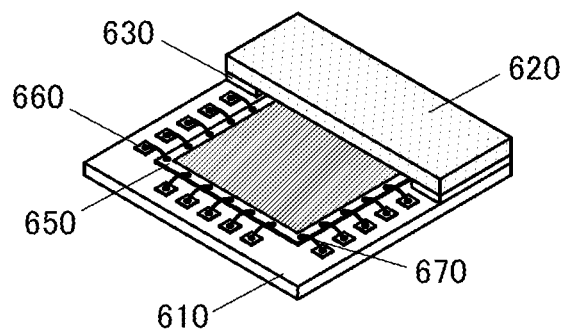
FIG. 30B3
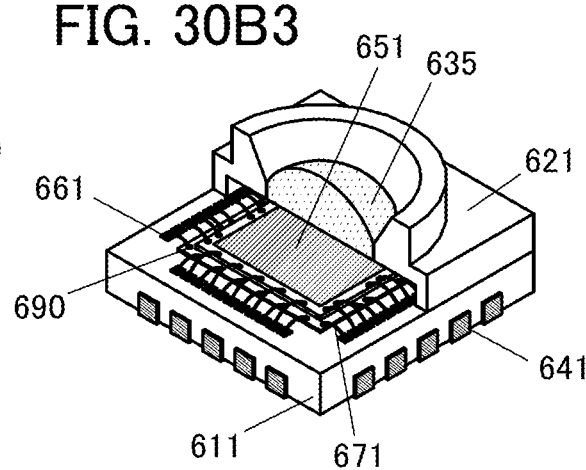

IMAGING DEVICE AND ELECTRONIC DEVICE

CROSS REFERENCE TO RELATED APPLICATIONS

This application is a continuation of U.S. application Ser. No. 16/628,073, filed Jan. 2, 2020, now allowed, which is a U.S. National Phase Application under 35 U.S.C. § 371 of International Application PCT/IB2018/054915, filed on Jul. 3, 2018, which is incorporated by reference, and which claims the benefit of a foreign priority application filed in Japan on Jul. 14, 2017, as Application No. 2017-137861.

TECHNICAL FIELD

One embodiment of the present invention relates to an imaging device.

Note that one embodiment of the present invention is not limited to the above technical field. The technical field of one embodiment of the invention disclosed in this specification and the like relates to an object, a method, or a manufacturing method. Alternatively, one embodiment of the present invention relates to a process, a machine, manufacture, or a composition of matter. Thus, more specifically, a semiconductor device, a display device, a liquid crystal display device, a light-emitting device, a lighting device, a power storage device, a memory device, an imaging device, a driving method thereof, or a manufacturing method thereof can be given as an example of the technical field of one embodiment of the present invention disclosed in this specification.

Note that in this specification and the like, a semiconductor device refers to all devices that can function by utilizing semiconductor characteristics. A transistor and a semiconductor circuit are embodiments of semiconductor devices. Furthermore, in some cases, a memory device, a display device, an imaging device, or an electronic device includes a semiconductor device.

BACKGROUND ART

A technique for forming a transistor by using an oxide semiconductor thin film formed over a substrate has attracted attention. For example, an imaging device with a structure in which a transistor including an oxide semiconductor and having an extremely low off-state current is used in a pixel circuit is disclosed in Patent Document 1.

A technique for adding an arithmetic function to an imaging device is disclosed in Patent Document 2.

REFERENCES

Patent Documents

[Patent Document 1] Japanese Published Patent Application No. 2011-119711
[Patent Document 2] Japanese Published Patent Application No. 2016-123087

SUMMARY OF THE INVENTION

Problems to be Solved by the Invention

An image captured by an imaging device is used while having its shade levels reduced, in some cases. For example, in the case where electronic data is produced by reading characters or numerical values from an image, a binary image is preferred to a shades-of-gray image. Characters and the like only need to be recognized by their shapes, and the noise components, which affect a shades-of-gray image, are mostly eliminated in a binary image.

Software processing is used for the conversion to a binary image; the entire processing can be performed at a higher speed if hardware processing can be employed.

In image data analysis processing, analog data, which is original data, is converted to digital data; if complicated data processing can be performed in an analog data state, time required for data conversion can be shortened. In addition, the scale of a circuit used for the analysis can be reduced.

Therefore, an object of one embodiment of the present invention is to provide an imaging device capable of executing image processing. Another object is to provide an imaging device capable of binarizing obtained image data and outputting the data. Another object is to provide an imaging device capable of executing analysis processing of obtained image data. Another object is to provide an imaging device capable of executing arithmetic processing of analog data.

Another object is to provide an imaging device with low power consumption. Another object is to provide an imaging device capable of capturing an image with high sensitivity. Another object is to provide an imaging device with high reliability. Another object is to provide a novel imaging device or the like. Another object is to provide a method for driving the above imaging device. Another object is to provide a novel semiconductor device or the like.

Note that the descriptions of these objects do not disturb the existence of other objects. One embodiment of the present invention does not need to achieve all the objects. Objects other than these will be apparent from the descriptions of the specification, the drawings, the claims, and the like, and objects other than these can be derived from the descriptions of the specification, the drawings, the claims, and the like.

Means for Solving the Problems

One embodiment of the present invention relates to an imaging device capable of compressing data obtained by a pixel and outputting the data. Alternatively, one embodiment of the present invention relates to an imaging device capable of executing arithmetic processing on the compressed data.

One embodiment of the present invention is an imaging device in the first mode including a photoelectric conversion element, a first transistor, a second transistor, and a first inverter circuit, in which the first inverter circuit has a structure of a CMOS circuit, one electrode of the photoelectric conversion element is electrically connected to one of a source and a drain of the first transistor, the other of the source and the drain of the first transistor is electrically connected to one of a source and a drain of the second transistor, the one of the source and the drain of the second transistor is electrically connected to an input terminal of the first inverter circuit, and the first transistor and the second transistor are each a transistor containing a metal oxide in a channel formation region.

One embodiment of the present invention may be the imaging device in the second mode further including a second inverter circuit, in which the second inverter circuit has a structure of a CMOS circuit, and an input terminal of the second inverter circuit is electrically connected to an output terminal of the first inverter circuit.

In the first mode or the second mode, a third transistor may be further included, a gate of the third transistor may be electrically connected to an output terminal of the first inverter circuit, and one of a source and a drain of the third transistor may be electrically connected to the input terminal of the first inverter circuit.

In the second mode, a fourth transistor may be further included, a gate of the fourth transistor may be electrically connected to an output terminal of the second inverter circuit, and one of a source and a drain of the fourth transistor may be electrically connected to the input terminal of the first inverter circuit.

In the second mode, a first capacitor may be further included, one electrode of the first capacitor may be electrically connected to an output terminal of the second inverter circuit, and the other electrode of the first capacitor may be electrically connected to the input terminal of the first inverter circuit.

In the second mode, a second capacitor may be further included, one electrode of the second capacitor may be electrically connected to the output terminal of the first inverter circuit, and the other electrode of the second capacitor may be electrically connected to the input terminal of the first inverter circuit.

In the first mode, a fifth transistor, a sixth transistor, and a seventh transistor may be further included, one of a source and a drain of the fifth transistor may be electrically connected to the other of the source and the drain of the first transistor, the one of the source and the drain of the fifth transistor may be electrically connected to a gate of the sixth transistor, one of a source and a drain of the sixth transistor may be electrically connected to one of a source and a drain of the seventh transistor, and the one of the source and the drain of the sixth transistor may be electrically connected to a gate of the fifth transistor.

The sixth transistor preferably has an opposite polarity to the fifth transistor and the seventh transistor.

In the first mode, an eighth transistor and a ninth transistor may be further included, the other of a source and a drain of the eighth transistor may be electrically connected to the other of the source and the drain of the first transistor, one of a source and a drain of the ninth transistor may be electrically connected to one power supply terminal of the first inverter circuit, and the one of the source and the drain of the ninth transistor may be electrically connected to a gate of the eighth transistor.

An n-channel transistor included in the CMOS circuit preferably contains a metal oxide in a channel formation region.

The metal oxide preferably contains In, Zn, and M (M is Al, Ti, Ga, Sn, Y, Zr, La, Ce, Nd, or Hf).

The n-channel transistor included in the CMOS circuit preferably includes a first gate and a second gate, and the first gate and the second gate are preferably positioned to face each other with a semiconductor layer therebetween.

The photoelectric conversion element may contain selenium or a compound containing selenium.

Another embodiment of the present invention is an imaging device including a plurality of blocks each provided with a pixel portion and a memory portion; in the imaging device, the pixel portion has a function of obtaining first data by photoelectric conversion and a function of generating second data by binarizing the first data, and the memory portion has a function of storing third data and a function of performing a product-sum operation of the second data and the third data.

A structure can be employed in which the pixel portion includes a photoelectric conversion element, a first transistor, a second transistor, and an inverter circuit; one electrode of the photoelectric conversion element is electrically connected to one of a source and a drain of the first transistor; the other of the source and the drain of the first transistor is electrically connected to one of a source and a drain of the second transistor; the one of the source and the drain of the second transistor is electrically connected to an input terminal of the inverter circuit; the memory portion includes a capacitor, a third transistor, and a fourth transistor; one electrode of the capacitor is electrically connected to an output terminal of the inverter circuit; the other electrode of the capacitor is electrically connected to one of a source and a drain of the third transistor; and the one of the source and the drain of the third transistor is electrically connected to a gate of the fourth transistor.

Effect of the Invention

With the use of one embodiment of the present invention, an imaging device capable of executing image processing can be provided. Alternatively, an imaging device capable of binarizing obtained image data and outputting the data can be provided. Alternatively, an imaging device capable of executing analysis processing of obtained image data can be provided. Alternatively, an imaging device capable of executing arithmetic processing of analog data can be provided.

An imaging device with low power consumption can be provided. An imaging device capable of capturing an image with high sensitivity can be provided. An imaging device with high reliability can be provided. A novel imaging device or the like can be provided. A method for driving the above imaging device can be provided. A novel semiconductor device or the like can be provided.

BRIEF DESCRIPTION OF THE DRAWINGS

FIGS. 30A1, 30A2, 30A3, 30B1, 30B2, and 30B3 Perspective views of packages and modules in which imaging devices are placed.

MODE FOR CARRYING OUT THE INVENTION

Figure 1:
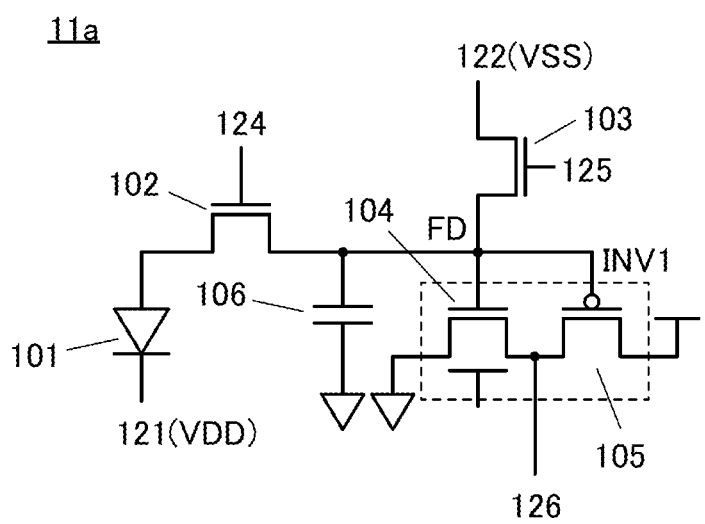
FIG. 1 A diagram illustrating a pixel circuit.

Embodiments will be described in detail with reference to drawings. Note that the present invention is not limited to the following description, and it will be easily understood by those skilled in the art that the modes and details can be modified in various ways without departing from the spirit and the scope of the present invention. Therefore, the present invention should not be interpreted as being limited to the description of the following embodiments. Note that in structures of the invention described below, the same reference numerals are commonly used, in different drawings, for the same portions or portions having similar functions, and description thereof is not repeated in some cases. Note that the hatching of the same element that constitutes a drawing is omitted or changed as appropriate in different drawings in some cases.

Embodiment 1

In this embodiment, an imaging device of one embodiment of the present invention will be described with reference to drawings.

One embodiment of the present invention is an imaging device including a pixel capable of performing a binary output operation of an image signal. A given analog potential obtained by photoelectric conversion is input to an inverter circuit, and a signal corresponding to binary data is output from the inverter circuit. Since an intermediate potential is hardly output, it can be regarded that image data is compressed and output.

In general, in the case where a character or a numerical value is read from an image, the image is binarized by executing image processing or the like by software, so that the reading accuracy is improved. In one embodiment of the present invention, an image can be binarized by hardware (in an imaging device); thus, image processing can be executed at a high speed.

Because shades-of-gray data needs not be used in image analysis in the case of using artificial intelligence (neural network), the number of steps of a learning operation can be reduced. Although there are a variety of factors of noise generation in an imaging device, binarization can reduce the effect of the noise; thus, the accuracy of image analysis can be increased. Furthermore, no consideration of noise is required for teaching data.

Structure Example 1

FIG. 1 is a diagram illustrating a pixel 11a that can be used for an imaging device of one embodiment of the present invention. The pixel 11a includes a photoelectric conversion element 101, a transistor 102, a transistor 103, an inverter circuit INV1, and a capacitor 106. The inverter circuit INV1 has a structure of a CMOS (complementary metal oxide semiconductor) circuit and includes an n-channel transistor 104 and a p-channel transistor 105. Note that a structure in which the capacitor 106 is not provided may be employed.

In the inverter circuit INV1, a gate of the transistor 104 and a gate of the transistor 105 are electrically connected to each other and function as an input terminal. Furthermore, one of a source and a drain of the transistor 104 and one of a source and a drain of the transistor 105 are electrically connected to each other and function as an output terminal.

One electrode of the photoelectric conversion element 101 is electrically connected to one of a source and a drain of the transistor 102. The other of the source and the drain of the transistor 102 is electrically connected to one electrode of the capacitor 106. The one electrode of the capacitor 106 is electrically connected to one of a source and a drain of the transistor 103. The one of the source and the drain of the transistor 103 is electrically connected to the input terminal of the inverter circuit INV1. Note that the one of the source and the drain of the transistor 103 may be electrically connected to the one electrode of the photoelectric conversion element 101.

Here, a point for connecting the other of the source and the drain of the transistor 102, the one electrode of the capacitor 106, the one of the source and the drain of the transistor 103, and the input terminal of the inverter circuit INV1 is referred to as a node FD.

The other electrode of the photoelectric conversion element 101 is electrically connected to a wiring 121. A gate of the transistor 102 is electrically connected to a wiring 124. The other of the source and the drain of the transistor 103 is electrically connected to a wiring 122. A gate of the transistor 103 is electrically connected to a wiring 125. The other of the source and the drain of the transistor 105 is electrically connected to a power supply line or the like for supplying a high potential (VDD), for example. The other electrode of the capacitor 106 is electrically connected to a reference potential line such as a GND wiring, for example. The output terminal of the inverter circuit INV1 is electrically connected to a wiring 126.

In the inverter circuit INV1, the other of the source and the drain of the transistor 104 is a low potential power supply terminal, and is electrically connected to a GND wiring or a low potential power supply line. The other of the source and the drain of the transistor 105 is a high potential power supply terminal, and is electrically connected to a high potential power supply line.

The wirings 121 and 122 can have functions of power supply lines. The potentials of the wirings 121 and 122 change depending on the connection direction of the photoelectric conversion element 101. The structure illustrated in FIG. 1 is a structure in which the anode side of the photoelectric conversion element 101 is electrically connected to the transistor 102 and the node FD is reset to a low potential in the operation; accordingly, the wiring 121 is set to a high potential (VDD) and the wiring 122 is set to a low potential (VSS). The wirings 124 and 125 can function as signal lines for controlling the electrical conduction of the respective transistors. The wiring 126 can function as an output line. The wiring 126 is preferably floating.

As the photoelectric conversion element 101, a photodiode can be used. In order that light detection sensitivity at low illuminance may be increased, an avalanche photodiode is preferably used.

The transistor 102 can have a function of controlling the potential of the node FD. The transistor 103 can have a function of initializing the potential of the node FD. The inverter circuit INV1 can have a function of outputting a binary signal based on the potential of the node FD to the wiring 126.

In the case where an avalanche photodiode is used as the photoelectric conversion element 101, a high voltage is applied in some cases and a transistor with a high withstand voltage is preferably used as a transistor connected to the photoelectric conversion element 101. As the transistor with a high withstand voltage, a transistor containing a metal oxide in a channel formation region (hereinafter, an OS transistor) or the like can be used, for example. Specifically, OS transistors are preferably used as the transistor 102 and the transistor 103.

The OS transistor also has a feature of an extremely low off-state current. When OS transistors are used as the transistors 102 and 103, a period during which charge can be retained at the node FD can be elongated greatly. Therefore, a global shutter system in which a charge accumulation operation is performed in all the pixels at the same time can be used without complicating the circuit configuration and operation method.

In addition, an OS transistor is preferably used as the transistor 104 in the inverter circuit INV1; the detailed operation will be described later. Because a semiconductor layer of an OS transistor can be formed using a thin film, a first gate and a second gate can be provided such that the semiconductor layer is positioned therebetween. Supply of a constant potential to one of the first gate and the second gate can facilitate the threshold voltage control of the transistor, leading to the control of a binary output operation described later.

Meanwhile, a transistor using silicon in its channel formation region (hereinafter, Si transistor), which can be easily formed as a p-channel transistor, is preferably used as the transistor 105.

Note that without limitation to the above, an OS transistor and a Si transistor may be freely used in combination. Furthermore, all the transistors may be either OS transistors or Si transistors.

Figure 2:
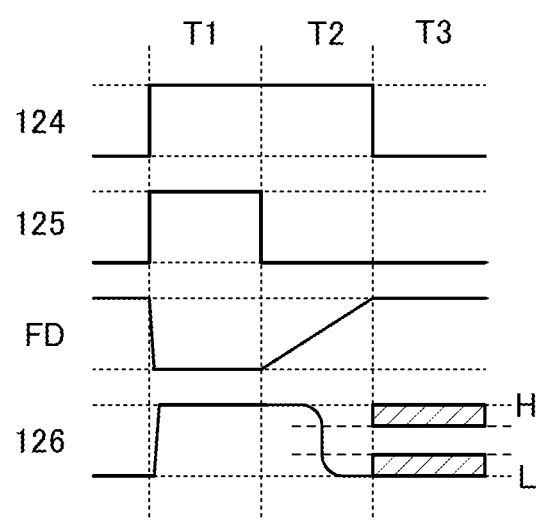
FIG. 2 A diagram illustrating the operation of a pixel circuit.

An example of the operation of the pixel 11a will be described with reference to a timing chart illustrated in FIG. 2. Note that in the following description, "H" represents a high potential and "L" represents a low potential.

In Period T1, when the potential of the wiring 124 is set to "H" and the potential of the wiring 125 is set to "H", the transistor 102 and the transistor 103 are brought into conduction and the node FD is reset to the potential "L" of the wiring 122 (reset operation). Since the transistor 105 is brought into conduction in the inverter circuit INV1 at this time, "H" is output to the wiring 126.

In Period T2, when the potential of the wiring 125 is set to "L", the potential of the node FD is increased in response to the operation of the photoelectric conversion element 101 (accumulation operation).

If the potential of the node FD is changed until being saturated in Period T2, the transistor 105 is gradually brought into non-conduction and the transistor 104 is gradually brought into conduction in the inverter circuit INV1. Thus, the potential output to the wiring 126 gradually changes from "H" to "L".

In Period T3, when the potential of the wiring 124 is set to "L", the potential of the node FD is retained and thus the potential output to the wiring 126 is fixed at "L". The read operation is performed after Period T3.

In the pixel 11a in Period T2, the potential of the node FD becomes "H" or in the vicinity thereof in a bright state, and "L" is output to the wiring 126. In a dark state, the potential of the node FD becomes "L" or in the vicinity thereof, and "H" is output to the wiring 126.

The inverter circuit INV1 becomes, in operation, a transient state in which both the transistor 104 and the transistor 105 are brought into conduction. Thus, when the potential of the node FD is intermediate between "H" and "L" or in the vicinity thereof, a potential that is in a range shaded in the drawing is output to the wiring 126 in some cases. Note that the output changes abruptly in the vicinity of the logic threshold value of the inverter circuit INV1; thus, a potential around the middle is hardly output. Hence, in a broad sense, the pixel 11a can perform a binary output operation.

Note that a range of the potential of the node FD that causes the transient state can be adjusted when the threshold voltage of the transistor 104 is controlled. For example, a negative potential with respect to a source potential is applied to the second gate when the node FD is connected to the first gate of the transistor 104, so that the threshold voltage can be shifted in the positive direction. The range of the potential of the node FD that causes the transient state can be narrowed when the threshold voltage of the transistor 104 is shifted in the positive direction, so that the accuracy of the binary output operation can be improved.

Each of the components of the pixel 11a, such as a transistor, might generate noise. However, when the noise added to the node FD is less than or equal to the logic threshold value of the inverter circuit INV1, the output is not affected.

Figure 3A:
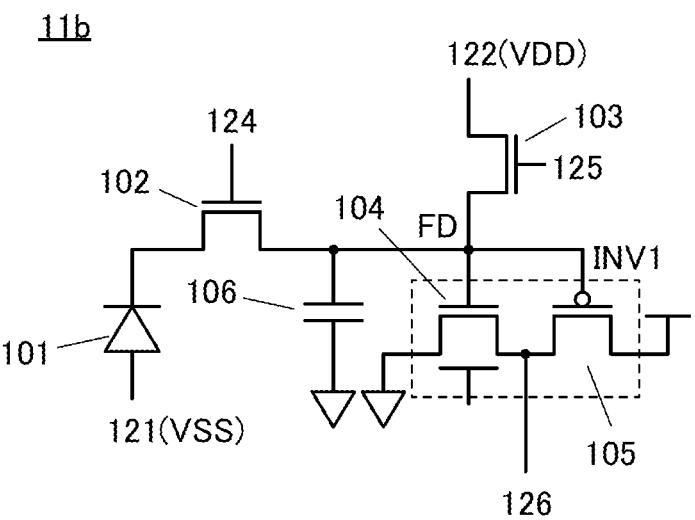
FIGS. 3A and 3B Diagrams illustrating a pixel circuit and the operation thereof.

FIG. 3(A) is a diagram illustrating a pixel 11b in which the connection direction of the photoelectric conversion element 101 is opposite to that in the pixel 11a. The cathode side of the photoelectric conversion element 101 is connected to the one of the source and the drain of the transistor 102, and the potential of the node FD is reset to a high potential in the operation. Thus, the wiring 121 is set to a low potential (VSS) and the wiring 122 is set to a high potential (VDD). The other structures are the same as those of the pixel 11a.

Figure 3B:
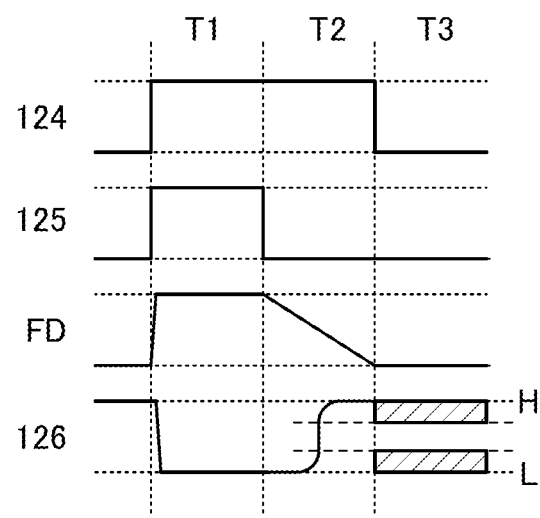

FIG. 3(B) is a timing chart showing the operation of the pixel 11b. The basic operation is the same as that of the pixel 11a, but the change in the potential of the node FD in response to the operation of the photoelectric conversion element 101 is opposite to that in the case of the pixel 11a. Accordingly, in the pixel 11a, the potential of the node FD becomes "L" or in the vicinity thereof in a bright state, and "H" is output to the wiring 126. In a dark state, the potential of the node FD becomes "H" or in the vicinity thereof, and "L" is output to the wiring 126.

Note that since the transistor 104 and the transistor 105 in the inverter circuit INV1 are brought into conduction in the transient state in the pixels 11a and 11b, power consumption is increased by shoot-through current. The potential of the node FD is retained after the read operation; thus, shoot-through current might keep flowing also in the case where an imaging operation is not performed.

Figure 4A:
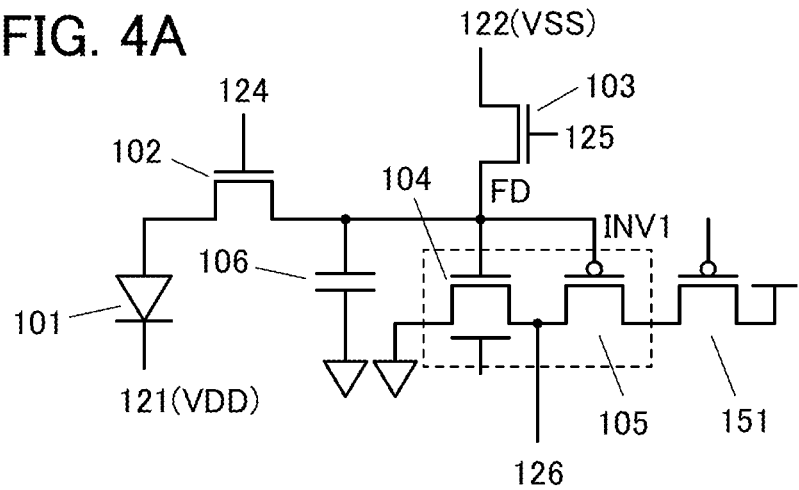
FIGS. 4A and 4B Diagrams illustrating pixel circuits.

For this reason, a structure may be employed in which a transistor 151 is added to the structure of the pixel 11a, as illustrated in FIG. 4(A). The transistor 151 is provided between the transistor 105 and the high potential power supply line and the transistor 151 is brought into non-conduction all the time except for the imaging operation period, so that shoot-through current can be inhibited. This structure can also be applied to the structures of the other pixels described in this embodiment.

Figure 4B:
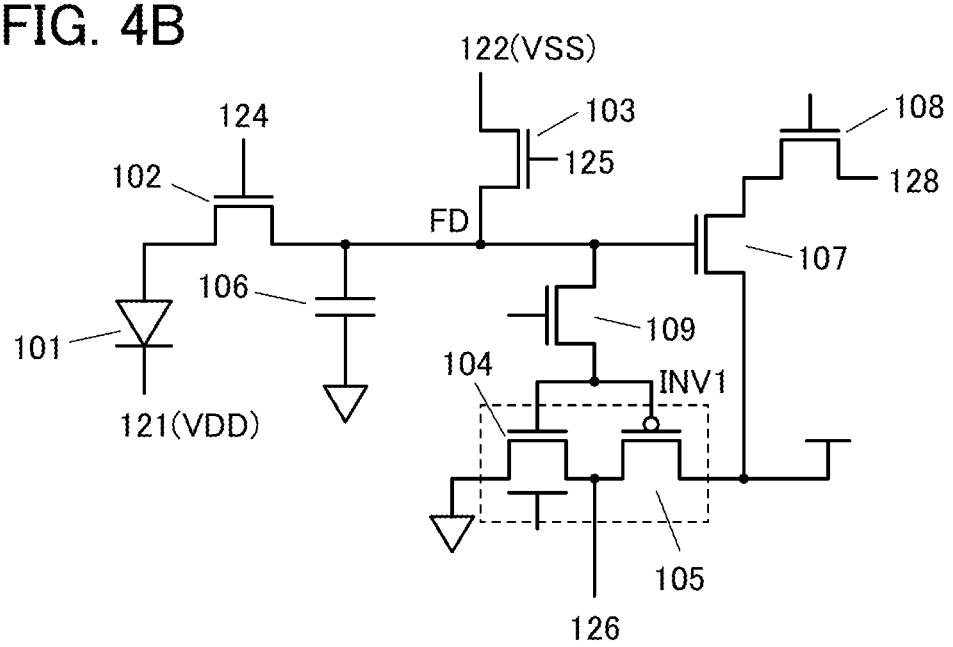

Alternatively, a structure may be employed in which transistors 107, 108, and 109 are added to the structure of the pixel 11a, as illustrated in FIG. 4(B).

A gate of the transistor 107 is electrically connected to the other of the source and the drain of the transistor 102. One of a source and a drain of the transistor 107 is electrically connected to one of a source and a drain of the transistor 108, and the other of the source and the drain of the transistor 107 is electrically connected to a power supply line or the like for supplying a high potential (VDD), for example. The other of the source and the drain of the transistor 108 is electrically connected to a wiring 128. One of a source and a drain of the transistor 109 is electrically connected to the other of the source and the drain of the transistor 102, and the other of the source and the drain is electrically connected to the input terminal of the inverter circuit INV1.

The transistor 107 can operate as a source follower circuit that outputs the potential of the node FD. The transistor 108 can operate as a pixel selection transistor.

Although the pixel 11a has a structure for outputting only binarized data, image data that is not binarized can be output to the wiring 128 owing to the above structure. Furthermore, image data to be binarized can be selectively obtained when the conduction of the transistor 109 is controlled. This structure can also be applied to the structures of the other pixels described in this embodiment.

Structure Example 2

Figure 5A:
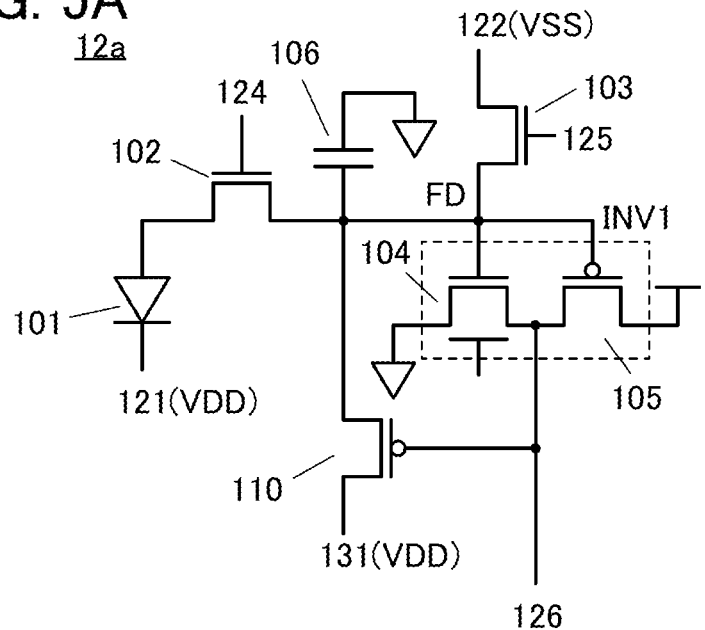
FIGS. 5A and 5B Diagrams illustrating a pixel circuit and the operation thereof.

FIG. 5(A) is a diagram illustrating a pixel 12a, which is a modification example of the pixel 11a. The pixel 12a has a structure in which a transistor 110 is added to the pixel 11a. A gate of the transistor 110 is electrically connected to the wiring 126. One of a source and a drain of the transistor 110 is electrically connected to the input terminal of the inverter circuit INV1, and the other of the source and the drain is electrically connected to a wiring 131. Note that in the structure of the pixel 12a, the transistor 110 is a p-channel transistor.

Figure 5B:
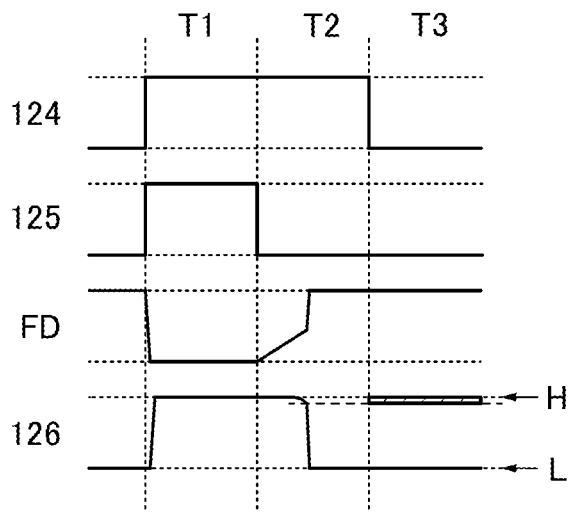

The operation of the pixel 12a will be described using a timing chart in FIG. 5(B).

In Period T1, when the potential of the wiring 124 is set to "H" and the potential of the wiring 125 is set to "H", the transistor 102 and the transistor 103 are brought into conduction and the node FD is reset to the potential "L" of the wiring 122 (reset operation). Since the transistor 105 is brought into conduction in the inverter circuit INV1 at this time, "H" is output to the wiring 126. Consequently, the transistor 110 is in a non-conduction state.

In Period T2, when the potential of the wiring 125 is set to "L", the potential of the node FD is increased in response to the operation of the photoelectric conversion element 101 (accumulation operation).

When the potential of the node FD reaches the threshold voltage of the transistor 104, the transistor 104 is brought into conduction and the potential of the wiring 126 starts to decrease. Then, when the potential of the wiring 126 reaches the threshold voltage of the transistor 110, the transistor 110 is brought into conduction and the potential of the node FD increases sharply. These operations are repeated, and the potential of the node FD is saturated rapidly.

Thus, the potential output to the wiring 126 suddenly changes from "H" to "L".

In Period T3, when the potential of the wiring 124 is set to "L", the potential of the node FD is retained and thus the potential output to the wiring 126 is fixed at "L". The read operation is performed after Period T3.

In the pixel 12a in Period T2, "H" is output to the wiring 126 until just before the transistor 110 is brought into conduction (corresponding to a dark state). In addition, "L" is output to the wiring 126 after the transistor 110 is brought into conduction (corresponding to a bright state).

The period until the transistor 110 is brought into conduction by the potential change of the node FD (corresponding to a dark state) includes the transient state. Thus, when the potential of the node FD is at a value in a specific range in a dark state, a potential that is in a range shaded in the drawing is output in some cases. Note that since the potential of the node FD increases sharply after the conduction of the transistor 110, a potential around the middle is not output and "L" is output when a bright state is detected. Hence, in a broad sense, the pixel 12a can perform a binary output operation.

Note that a range of the potential of the node FD that corresponds to a dark state can be adjusted when the threshold voltage of the transistor 104 is controlled. The range of the potential of the node FD that causes the transient state can be made small when the threshold voltage of the transistor 104 is increased.

Figure 6A:
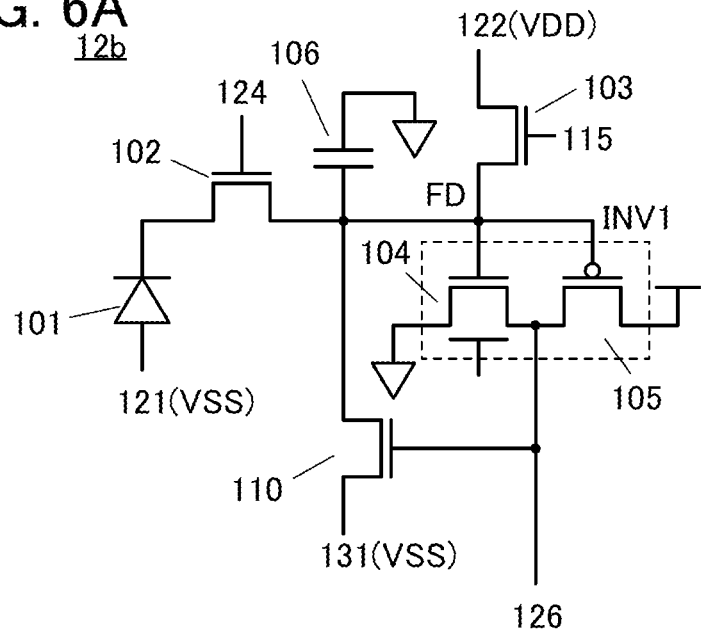
FIGS. 6A and 6B Diagrams illustrating a pixel circuit and the operation thereof.

FIG. 6(A) is a diagram illustrating a pixel 12b in which the connection direction of the photoelectric conversion element 101 is opposite to that in the pixel 12a. The cathode side of the photoelectric conversion element 101 is connected to the one of the source and the drain of the transistor 102, and the potential of the node FD is reset to a high potential in the operation. Thus, the wiring 121 is set to a low potential (VSS) and the wiring 122 is set to a high potential (VDD). The transistor 110 is an n-channel transistor. The other structures are the same as those of the pixel 12a.

Figure 6B:
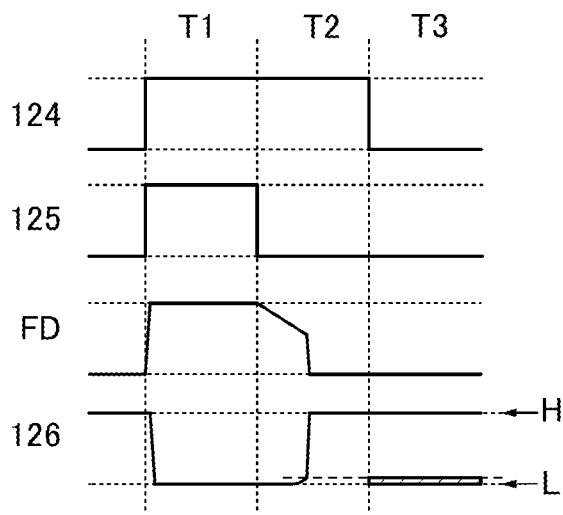

FIG. 6(B) is a timing chart showing the operation of the pixel 12b. The basic operation is the same as that of the pixel 12a, but the change in the potential of the node FD in response to the operation of the photoelectric conversion element 101 is opposite to that in the case of the pixel 12a. Accordingly, in the pixel 12b, "L" is output to the wiring 126 until just before the transistor 110 is brought into conduction (corresponding to a dark state). In addition, "H" is output to the wiring 126 after the transistor 110 is brought into conduction (corresponding to a bright state).

Structure Example 3

Figure 7A:
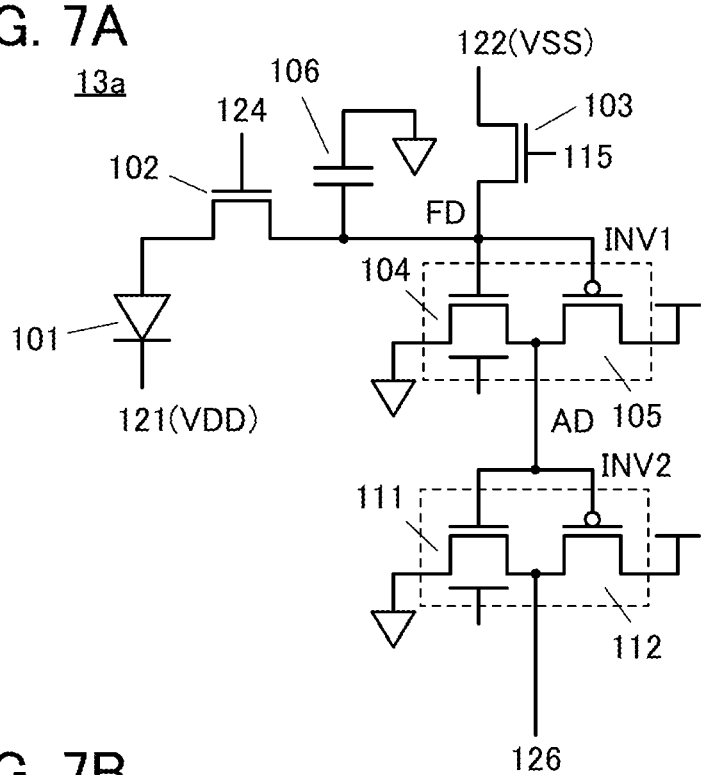
FIGS. 7A and 7B Diagrams illustrating a pixel circuit and the operation thereof.

FIG. 7(A) is a diagram illustrating a pixel 13a, which is a modification example of the pixel 11a. The pixel 13a has a structure in which an inverter circuit INV2 is added to the pixel 11a. An input terminal of the inverter circuit INV2 is electrically connected to the output terminal of the inverter circuit INV1. An output terminal of the inverter circuit INV2 is electrically connected to the wiring 126.

Note that the inverter circuit INV2 has a similar structure to the inverter circuit INV1, and includes an n-channel transistor 111 and a p-channel transistor 112. Here, a point for connecting the output terminal of the inverter circuit INV1 and the input terminal of the inverter circuit INV2 is referred to as a node AD.

Figure 7B:
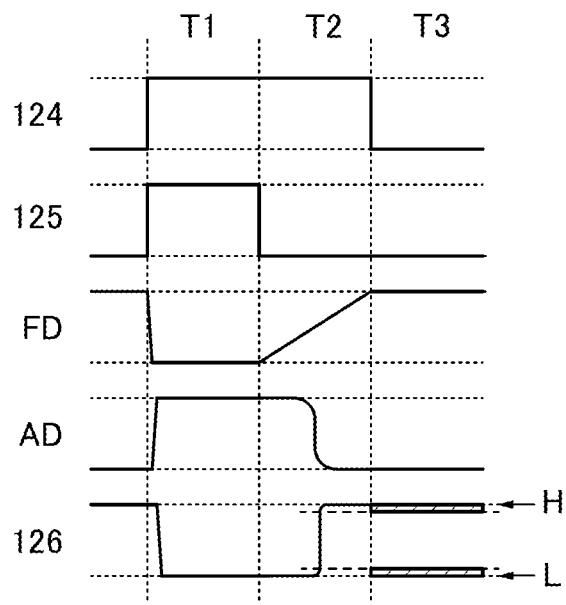

The operation of the pixel 13a will be described using a timing chart in FIG. 7(B).

In Period T1, when the potential of the wiring 124 is set to "H" and the potential of the wiring 125 is set to "H", the transistor 102 and the transistor 103 are brought into conduction and the node FD is reset to the potential "L" of the wiring 122 (reset operation). Since the transistor 105 is brought into conduction in the inverter circuit INV1 at this time, "H" is output to the node AD. Furthermore, since the transistor 111 is brought into conduction in the inverter circuit INV2, "L" is output to the wiring 126.

In Period T2, when the potential of the wiring 125 is set to "L", the potential of the node FD is increased in response to the operation of the photoelectric conversion element 101 (accumulation operation).

If the potential of the node FD is changed until being saturated in Period T2, the transistor 105 is gradually brought into non-conduction and the transistor 104 is gradually brought into conduction in the inverter circuit INV1; thus, the potential output to the node AD gradually changes from "H" to "L".

Because the potential of the node AD is output after being inverted in the inverter circuit INV2, the potential output to the wiring 126 gradually changes from "L" to "H".

In Period T3, when the potential of the wiring 124 is set to "L", the potential of the node FD is retained and thus the potential output to the wiring 126 is fixed at "H". The read operation is performed after Period T3.

Since inverter circuits in two stages are connected in series in the pixel 13a, the operation delays and a range of the potential of the node FD that causes the transient state in the inverter circuit INV2 can be small. Thus, when the potential of the node FD is intermediate between "H" and "L" or in the vicinity thereof, a potential that is in a range shaded in the drawing is output to the wiring 126 in some cases, but the range can be smaller than that in the case of the pixel 11a.

Figure 8A:
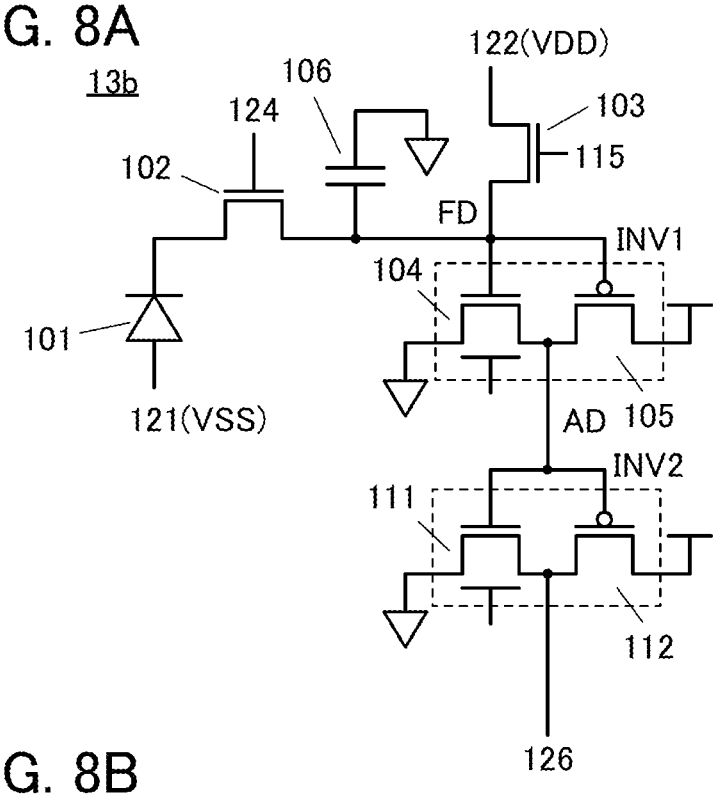
FIGS. 8A and 8B Diagrams illustrating a pixel circuit and the operation thereof.

FIG. 8(A) is a diagram illustrating a pixel 14b in which the connection direction of the photoelectric conversion element 101 is opposite to that in the pixel 13a. The cathode side of the photoelectric conversion element 101 is connected to the one of the source and the drain of the transistor 102, and the potential of the node FD is reset to a high potential in the operation. Thus, the wiring 121 is set to a low potential (VSS) and the wiring 122 is set to a high potential (VDD). The other structures are the same as those of the pixel 13a.

Figure 8B:
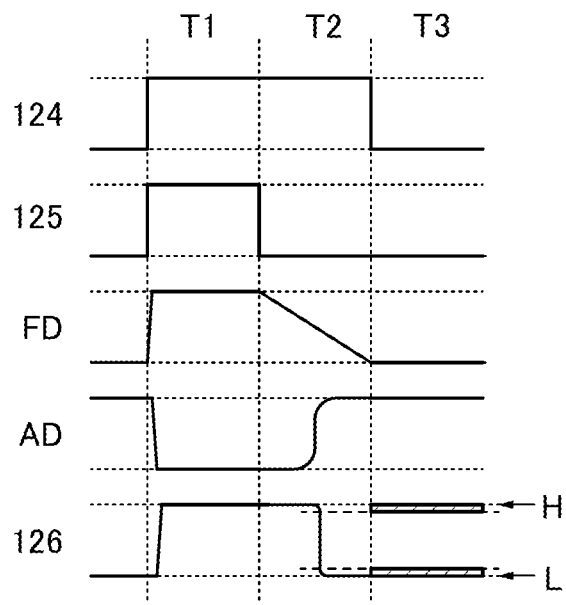

FIG. 8(B) is a timing chart showing the operation of a pixel 13b. The basic operation is the same as that of the pixel 13a, but the change in the potential of the node FD in response to the operation of the photoelectric conversion element 101 is opposite to that in the case of the pixel 13a. Thus, the potential output to the wiring 126 is also opposite to that in the case of the pixel 13a.

Structure Example 4

Figure 9A:
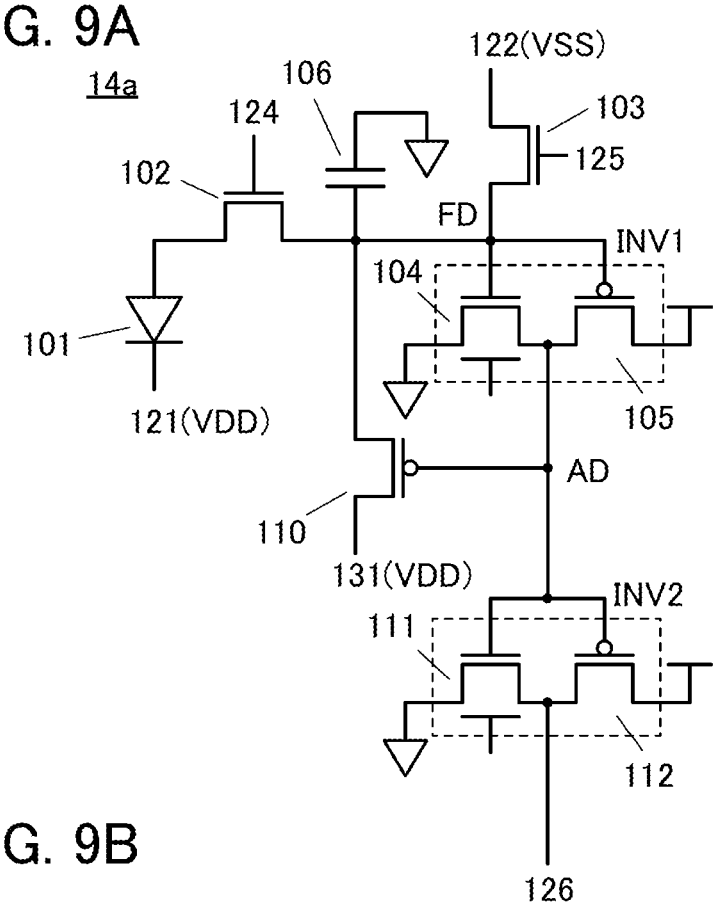
FIGS. 9A and 9B Diagrams illustrating a pixel circuit and the operation thereof.

FIG. 9(A) is a diagram illustrating a pixel 14a, which is a modification example of the pixel 12a and the pixel 13a.

The pixel 14a has a structure in which components of the pixel 12a and the pixel 13a are combined. The pixel 14a includes the transistor 110 and the inverter circuit INV2. The gate of the transistor 110 is electrically connected to the node AD. Note that in the structure of the pixel 14a, the transistor 110 is a p-channel transistor.

Figure 9B:
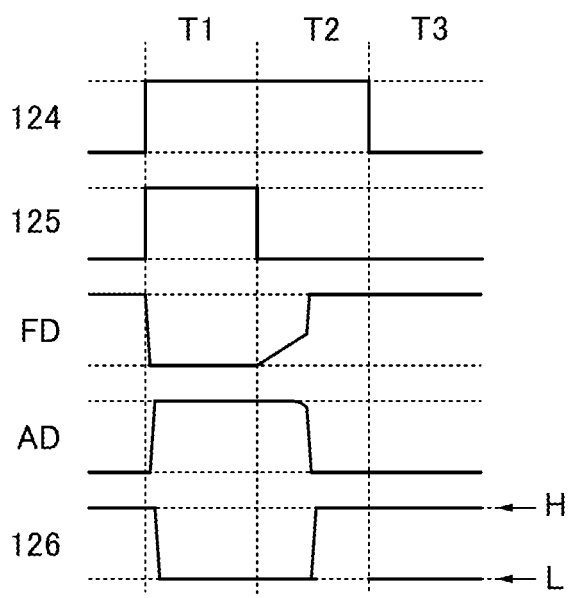

The operation of the pixel 14a will be described using a timing chart in FIG. 9(B).

In Period T1, when the potential of the wiring 124 is set to "H" and the potential of the wiring 125 is set to "H", the transistor 102 and the transistor 103 are brought into conduction and the node FD is reset to the potential "L" of the wiring 122 (reset operation). Since the transistor 105 is brought into conduction in the inverter circuit INV1 at this time, "H" is output to the node AD. Consequently, the transistor 110 is in a non-conduction state. In addition, "L" is output to the wiring 126.

In Period T2, when the potential of the wiring 125 is set to "L", the potential of the node FD is increased in response to the operation of the photoelectric conversion element 101 (accumulation operation).

When the potential of the node FD reaches the threshold voltage of the transistor 104, the transistor 104 is brought into conduction and the potential of the node AD starts to decrease. Then, when the potential of the node AD reaches the threshold voltage of the transistor 110, the transistor 110 is brought into conduction and the potential of the node FD increases sharply. These operations are repeated, and the potential of the node FD is saturated rapidly. In addition, the potential of the node AD suddenly changes from "H" to "L".

The operation delays at the initial stage of the change in the potential of the node AD in the inverter circuit INV2, and the operation is inverted at a high speed when the potential of the node AD suddenly changes. Thus, the potential output to the wiring 126 suddenly changes from "L" to "H".

In Period T3, when the potential of the wiring 124 is set to "L", the potential of the node FD is retained and thus the potential output to the wiring 126 is fixed at "H". The read operation is performed after Period T3.

In the pixel 14a in Period T2, "L" is output to the wiring 126 until just before the transistor 110 is brought into conduction (corresponding to a dark state). In addition, "H" is output to the wiring 126 after the transistor 110 is brought into conduction (corresponding to a bright state).

Here, the operation of the inverter circuit INV1 includes the transient state, as in the description of the pixel 12a. By contrast, the inverter circuit INV2 does not operate at the initial stage of the change in the potential of the node AD because of the delay, and the operation is inverted in response to the sudden change in the potential of the node AD; accordingly, the transient state is not substantially caused. Thus, the pixel 14a can perform a binary output operation in which "H" is output to the wiring 126 when a bright state is detected and "L" is output to the wiring 126 when a dark state is detected.

Figure 11A:
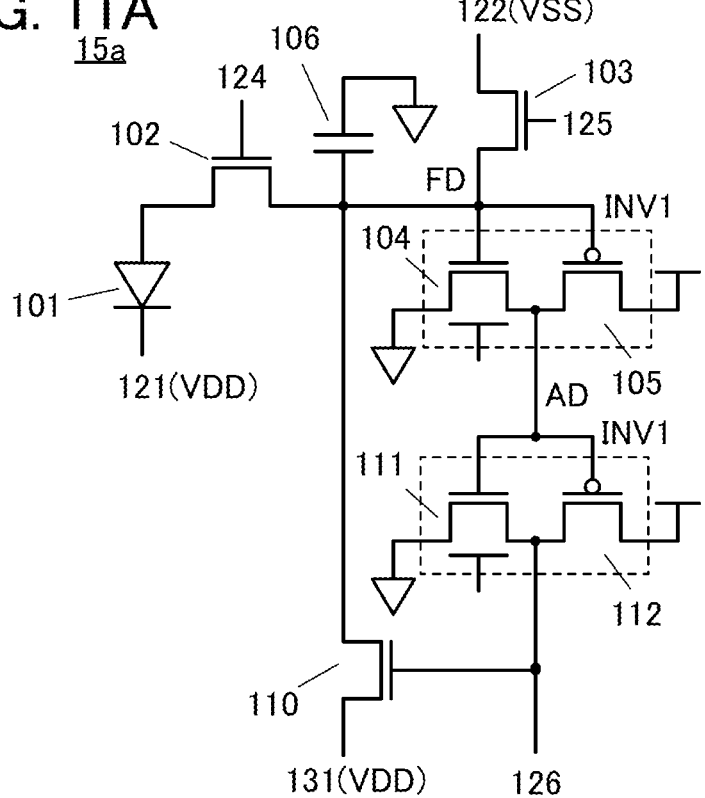
FIGS. 11A and 11B Diagrams illustrating pixel circuits.

Note that as in a pixel 15a illustrated in FIG. 11(A), a structure may be employed in which the transistor 110 in the structure of the pixel 14a is replaced by an n-channel transistor and the gate of the transistor 110 is electrically connected to the wiring 126. The pixel 15a can operate in accordance with the timing chart illustrated in FIG. 9(B), so that similar outputs can be obtained.

Figure 10A:
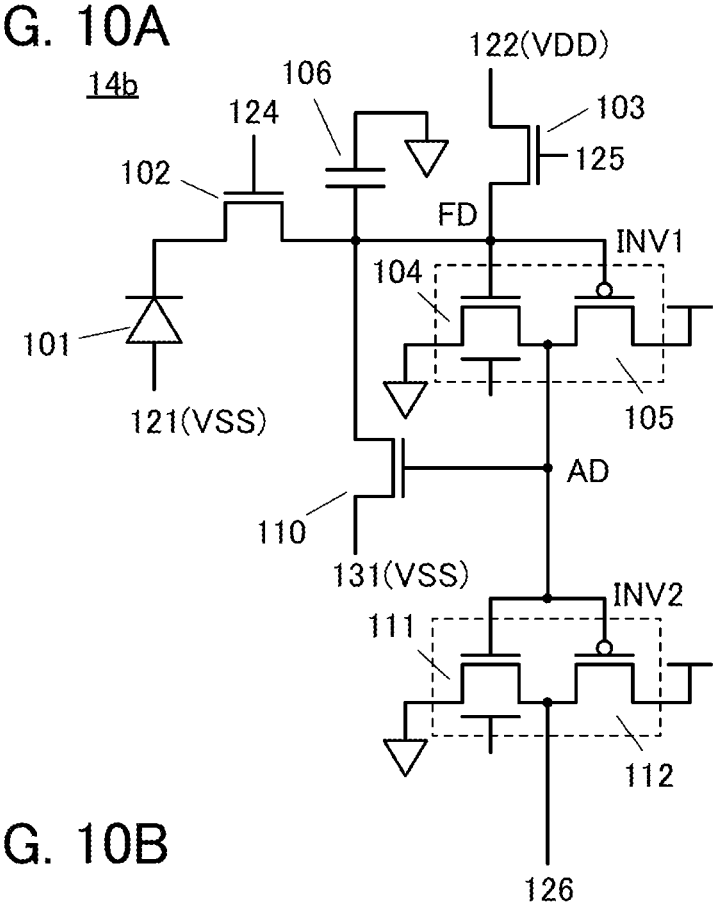
FIGS. 10A and 10B Diagrams illustrating a pixel circuit and the operation thereof.

FIG. 10(A) is a diagram illustrating a pixel 14b in which the connection direction of the photoelectric conversion element 101 is opposite to that in the pixel 14a. The cathode side of the photoelectric conversion element 101 is connected to the one of the source and the drain of the transistor 102, and the potential of the node FD is reset to a high potential in the operation. Thus, the wiring 121 is set to a low potential (VSS) and the wiring 122 is set to a high potential (VDD). The transistor 110 is an n-channel transistor. The other structures are the same as those of the pixel 14a.

Figure 10B:
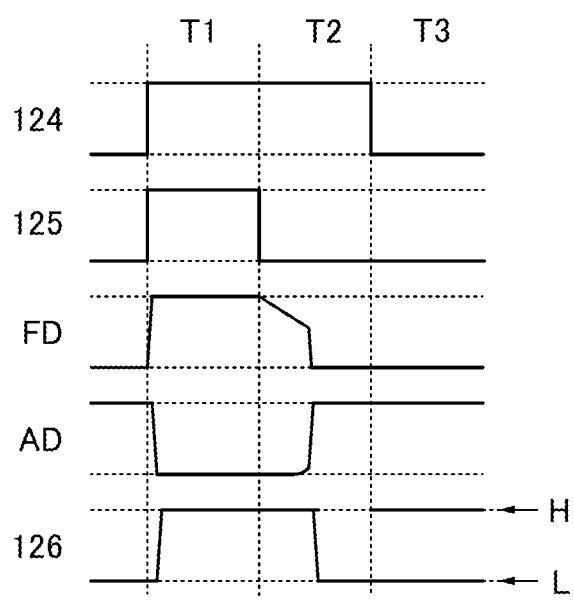

FIG. 10(B) is a timing chart showing the operation of the pixel 12b. The basic operation is the same as that of the pixel 14a, but the change in the potential of the node FD in response to the operation of the photoelectric conversion element 101 is opposite to that in the case of the pixel 14a. Thus, the pixel 14b can perform a binary output operation in which "L" is output to the wiring 126 when a bright state is detected and "H" is output to the wiring 126 when a dark state is detected.

Figure 11B:
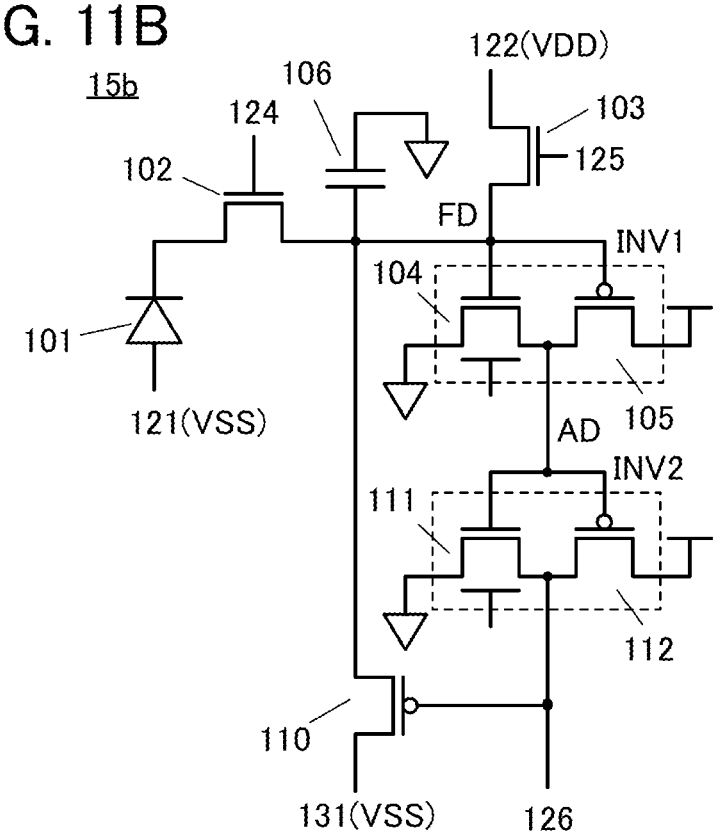

Note that as in a pixel 15b illustrated in FIG. 11(B), a structure may be employed in which the transistor 110 in the structure of the pixel 14b is replaced by a p-channel transistor and the gate of the transistor 110 is electrically connected to the wiring 126. The pixel 15b can operate in accordance with the timing chart illustrated in FIG. 10(B), so that similar outputs can be obtained.

Structure Example 5

Figure 12A:
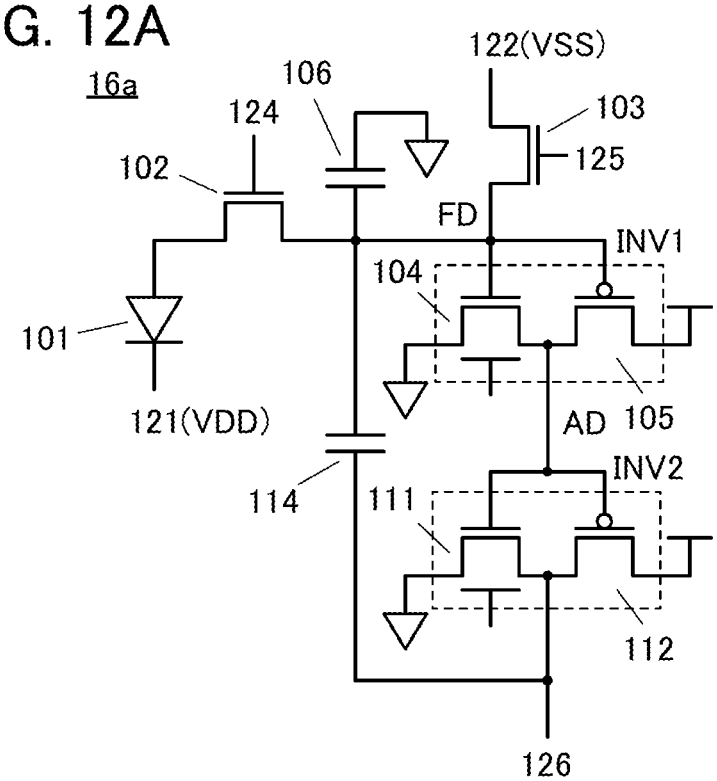
FIGS. 12A and 12B Diagrams illustrating a pixel circuit and the operation thereof.

FIG. 12(A) is a diagram illustrating a pixel 16a, which is a modification example of the pixel 13a. The pixel 16a has a structure in which a capacitor 114 is added to the pixel 13a. One electrode of the capacitor 114 is electrically connected to the wiring 126. The other electrode of the capacitor 114 is electrically connected to the input terminal of the inverter circuit INV1.

Figure 12B:
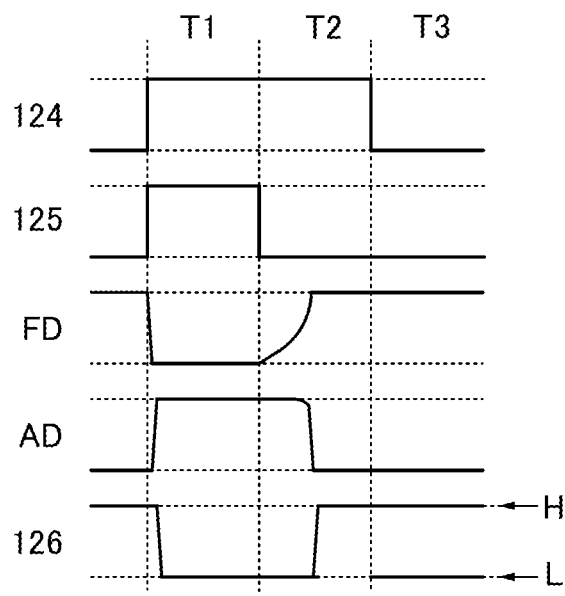

The operation of the pixel 16a will be described using a timing chart in FIG. 12(B).

In Period T1, when the potential of the wiring 124 is set to "H" and the potential of the wiring 125 is set to "H", the transistor 102 and the transistor 103 are brought into conduction and the node FD is reset to the potential "L" of the wiring 122 (reset operation). Since the transistor 105 is brought into conduction in the inverter circuit INV1 at this time, "H" is output to the node AD. Furthermore, since the transistor 111 is brought into conduction in the inverter circuit INV2, "L" is output to the wiring 126.

In Period T2, when the potential of the wiring 125 is set to "L", the potential of the node FD is increased in response to the operation of the photoelectric conversion element 101 (accumulation operation).

When the potential of the node FD is increased, each of the inverter circuit INV1 and the inverter circuit INV2 operates and the potential of the wiring 126 increases. Consequently, the potential of the node FD is further increased by capacitive coupling of the capacitor 114. These operations are repeated, and the potential of the node FD increases sharply.

Here, the operation of the inverter circuit INV1 includes the transient state, as in the description of the pixel 12a. By contrast, the operation of the inverter circuit INV2 is delayed at the initial stage of the change in the potential of the node AD, and the operation is inverted in response to the sudden change in the potential of the node AD; accordingly, the transient state is not substantially caused. Thus, the pixel 14a can perform a binary output operation in which "L" is output to the wiring 126 when a bright state is detected and "H" is output to the wiring 126 when a dark state is detected.

Figure 13A:
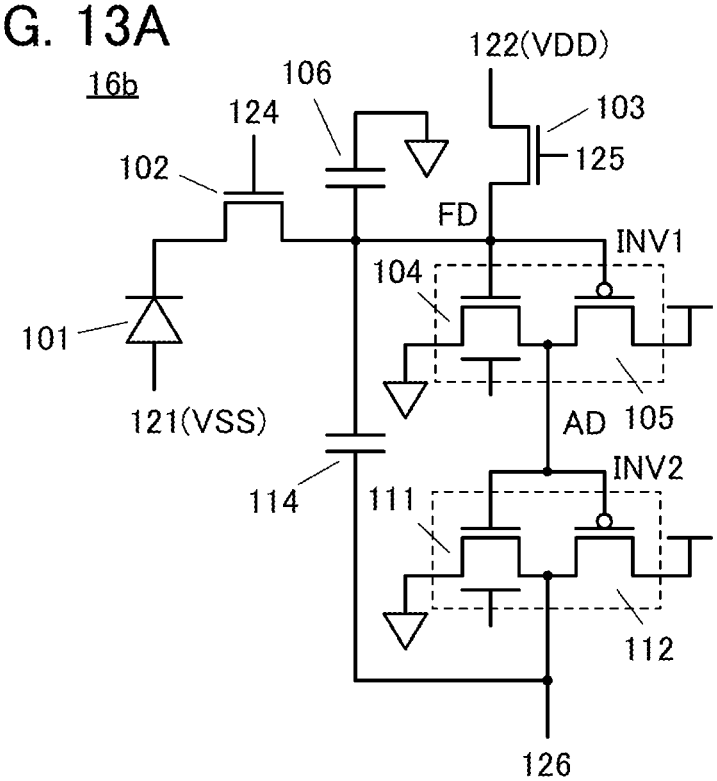
FIGS. 13A and 13B Diagrams illustrating a pixel circuit and the operation thereof.

FIG. 13(A) is a diagram illustrating a pixel 16b in which the connection direction of the photoelectric conversion element 101 is opposite to that in the pixel 16a. The cathode side of the photoelectric conversion element 101 is connected to the one of the source and the drain of the transistor 102, and the potential of the node FD is reset to a high potential in the operation. Thus, the wiring 121 is set to a low potential (VSS) and the wiring 122 is set to a high potential (VDD). The other structures are the same as those of the pixel 16a.

Figure 13B:
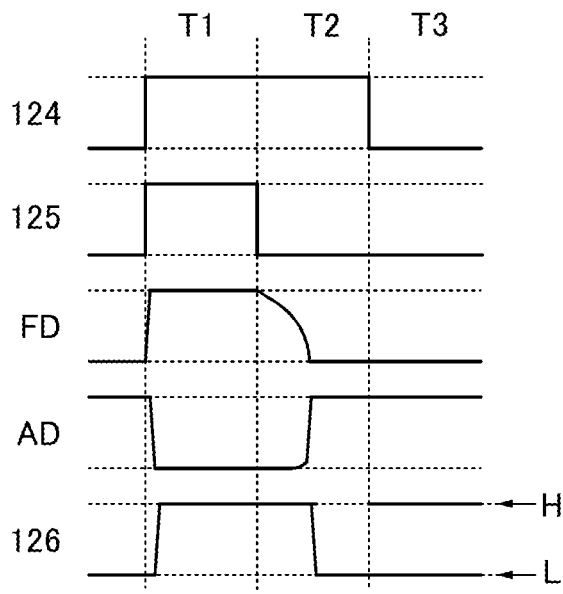

FIG. 13(B) is a timing chart showing the operation of the pixel 16b. The basic operation is the same as that of the pixel 16a, but the change in the potential of the node FD in response to the operation of the photoelectric conversion element 101 is opposite to that in the case of the pixel 16a. Thus, the pixel 16b can perform a binary output operation in which "H" is output to the wiring 126 when a bright state is detected and "L" is output to the wiring 126 when a dark state is detected.

Structure Example 6

Figure 14A:
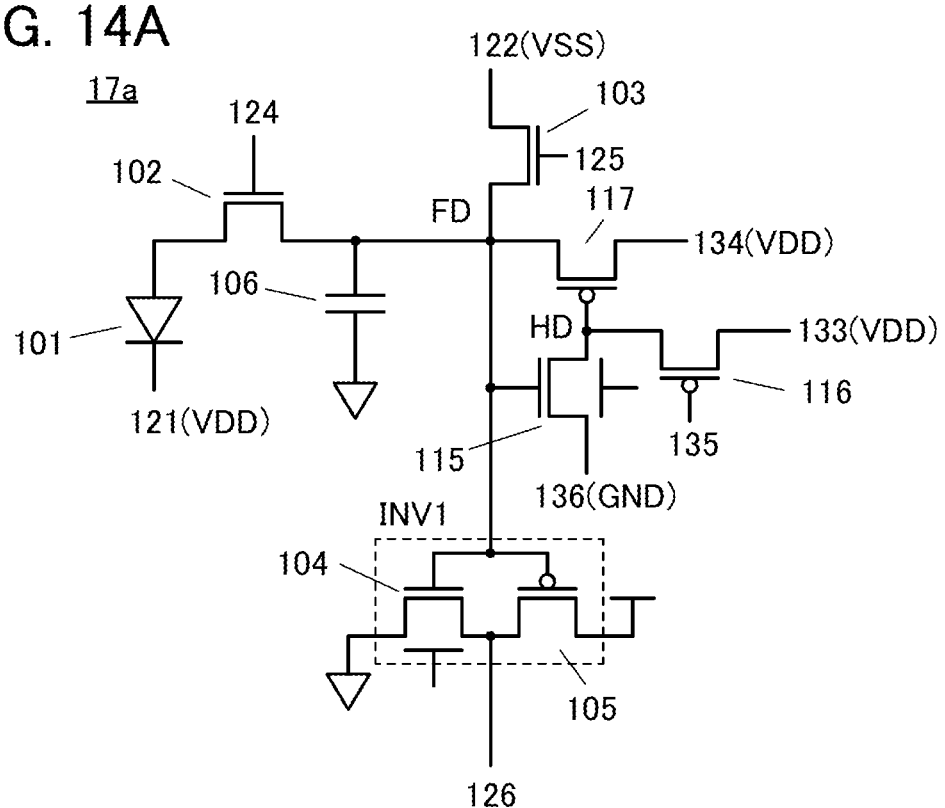
FIGS. 14A and 14B Diagrams illustrating a pixel circuit and the operation thereof.

FIG. 14(A) is a diagram illustrating a pixel 17a, which is a modification example of the pixel 11a. The pixel 17a has a structure in which transistors 115, 116, and 117 are added to the pixel 11a.

A gate of the transistor 115 is electrically connected to the other of the source and the drain of the transistor 102. One of a source and a drain of the transistor 115 is electrically connected to one of a source and a drain of the transistor 116. The one of the source and the drain of the transistor 116 is electrically connected to a gate of the transistor 117, and one of a source and a drain of the transistor 117 is electrically connected to the other of the source and the drain of the transistor 102. Note that in the structure of the pixel 17a, the transistor 115 is an n-channel transistor and the transistors 116 and 117 are p-channel transistors.

Here, a point for connecting the one of the source and the drain of the transistor 115, the one of the source and the drain of the transistor 116, and the gate of the transistor 117 is referred to as a node HD.

The other of the source and the drain of the transistor 115 is electrically connected to a wiring 136. The other of the source and the drain of the transistor 116 is electrically connected to a wiring 133. A gate of the transistor 116 is electrically connected to a wiring 135. The other of the source and the drain of the transistor 117 is electrically connected to a wiring 134. The wirings 133, 134, and 136 can function as power supply lines. In the structure of the pixel 17a, the wirings 133 and 134 are set to a high potential (VDD) and the wiring 136 is set to a low potential (GND or the like). The wiring 135 can function as a signal line for controlling the operation of the transistor 116.

Figure 14B:
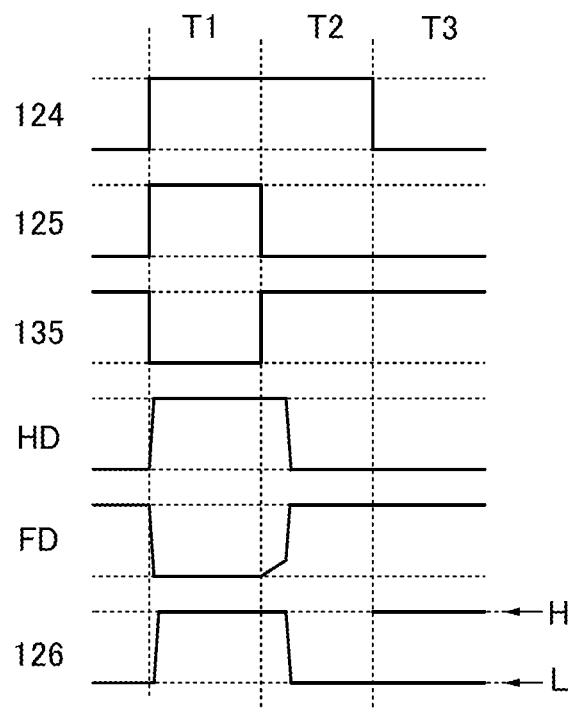

The operation of the pixel 17a will be described using a timing chart in FIG. 14(B).

In Period T1, when the potential of the wiring 124 is set to "H", the potential of the wiring 125 is set to "H", and the wiring 135 is set to "L", the transistor 102 and the transistor 103 are brought into conduction and the node FD is reset to the potential "L" of the wiring 122 (reset operation). Since the transistor 105 is brought into conduction in the inverter circuit INV1 at this time, "H" is output to the wiring 126. In Period T1, the transistors 115 and 117 are in a non-conduction state.

In Period T2, when the potential of the wiring 125 is set to "L" and the potential of the wiring 135 is set to "H", the potential of the node FD is increased in response to the operation of the photoelectric conversion element 101 (accumulation operation). The node HD is retained at a high potential.

When the potential of the node FD reaches the threshold voltage of the transistor 115, the transistor 115 is brought into conduction and the potential of the node HD starts to decrease. Then, when the potential of the node HD reaches the threshold voltage of the transistor 117, the transistor 117 is brought into conduction and the potential of the node FD increases sharply. These operations are repeated, and the potential of the node FD is saturated rapidly.

Thus, the potential output to the wiring 126 suddenly changes from "H" to "L".

In Period T3, when the potential of the wiring 124 is set to "L", the potential of the node FD is retained and thus the potential output to the wiring 126 is fixed at "L". The read operation is performed after Period T3.

In the pixel 17a in Period T2, "H" is output to the wiring 126 until just before the transistor 115 is brought into conduction (corresponding to a dark state). In addition, "L" is output to the wiring 126 after the transistor 115 is brought into conduction (corresponding to a bright state).

The operation of the inverter circuit INV1 is delayed at the initial stage of the change in the potential of the node FD, and the operation is inverted in response to the sudden change in the potential of the node FD; accordingly, the transient state is not substantially caused. Thus, the pixel 17a can perform a binary output operation in which "L" is output to the wiring 126 when a bright state is detected and "H" is output to the wiring 126 when a dark state is detected.

Note that the threshold voltage of the transistor 115 is controlled so that the potential of the node FD that corresponds to the upper limit in a dark state can be set. Accordingly, it is preferable to use, as the transistor 115, an OS transistor whose threshold voltage can be easily adjusted using a second gate.

In addition, since the transient state is not substantially caused in the inverter circuit INV1 of the pixel 17a, power consumption can be reduced. When the threshold voltages are controlled so that the transistor 115 is brought into conduction prior to the transistor 104, the transient state can be further less likely to be caused.

Figure 15A:
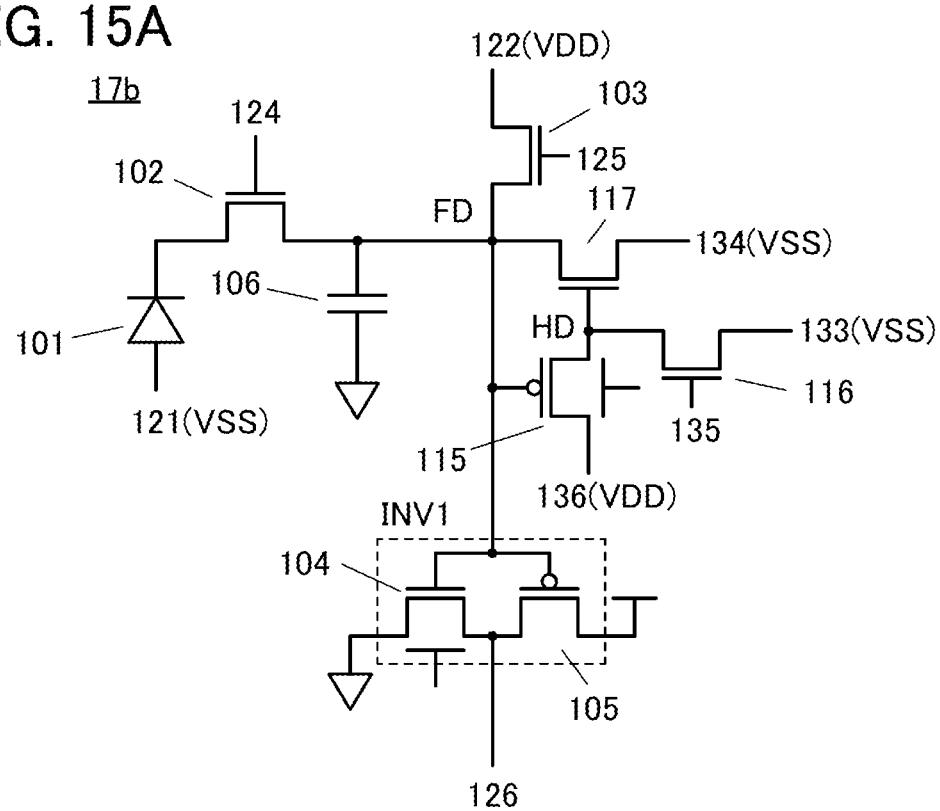
FIGS. 15A and 15B Diagrams illustrating a pixel circuit and the operation thereof.

FIG. 15(A) is a diagram illustrating a pixel 17b in which the connection direction of the photoelectric conversion element 101 is opposite to that in the pixel 17a. The cathode side of the photoelectric conversion element 101 is connected to the one of the source and the drain of the transistor 102, and the potential of the node FD is reset to a high potential in the operation. Thus, the wiring 121 is set to a low potential (VSS) and the wiring 122 is set to a high potential (VDD). Furthermore, the wiring 136 is set to a high potential (VDD) and the wirings 133 and 134 are set to a low potential (VSS). Note that in the pixel 17b, the transistor 115 is a p-channel transistor and the transistors 116 and 117 are n-channel transistors. The other structures are the same as those of the pixel 17a.

Figure 15B:
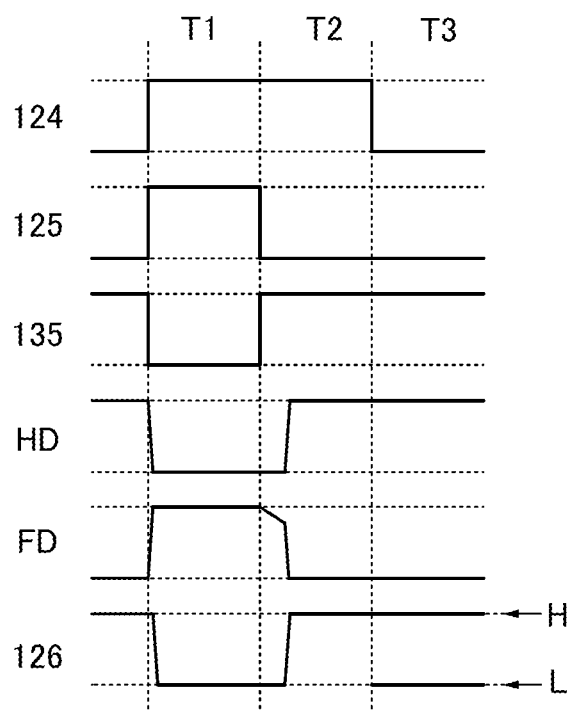

FIG. 15(B) is a timing chart showing the operation of the pixel 17b. The basic operation is the same as that of the pixel 17a, but the change in the potential of the node FD in response to the operation of the photoelectric conversion element 101 is opposite to that in the case of the pixel 17a. Thus, the pixel 17b can perform a binary output operation in which "H" is output to the wiring 126 when a bright state is detected and "L" is output to the wiring 126 when a dark state is detected.

Furthermore, the transistors 116 and 117 are n-channel transistors and OS transistors can be used. Thus, the potential retention capability of the node FD and the node HD can be increased and thus the operation can be stabilized.

Figure 16A:
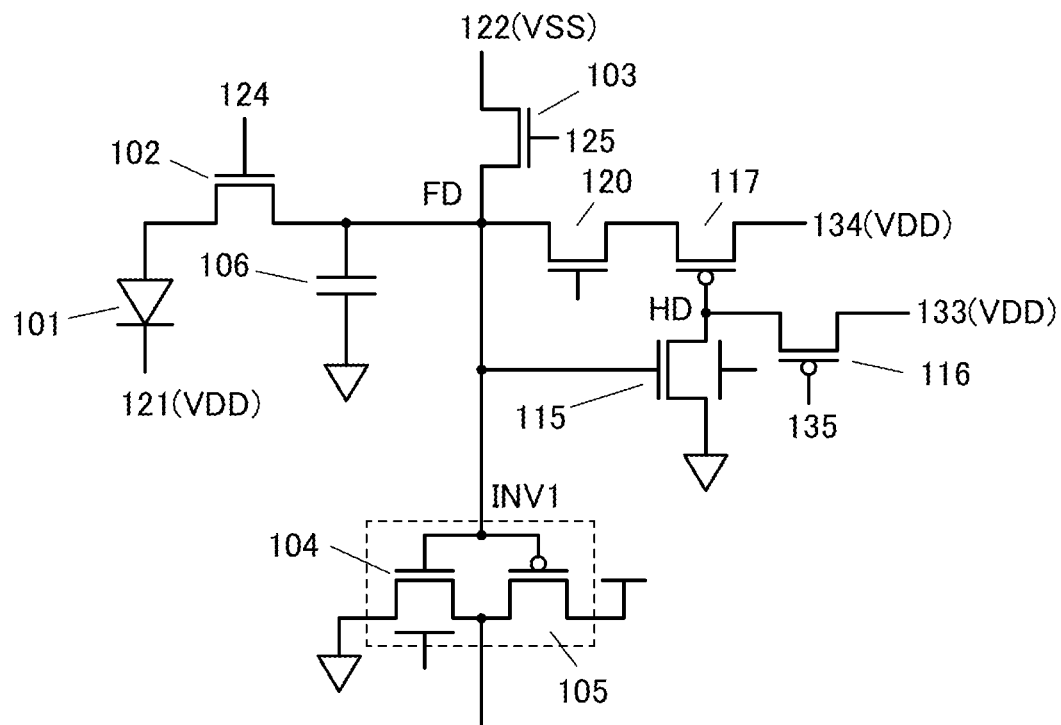
FIGS. 16A and 16B Diagrams illustrating pixel circuits.

Note that in the pixel 17a, the transistor 117 connected to the node FD is a p-channel transistor and a Si transistor is used. The Si transistor has a relatively high leakage current, so that the potential of the node FD might be changed unnecessarily. Hence, an n-channel transistor 120 may be provided between the node FD and the transistor 117 as illustrated in FIG. 16(A). When an OS transistor is used as the transistor 120, the change in the potential of the node FD due to the leakage current of the transistor 117 can be inhibited.

Figure 16B:
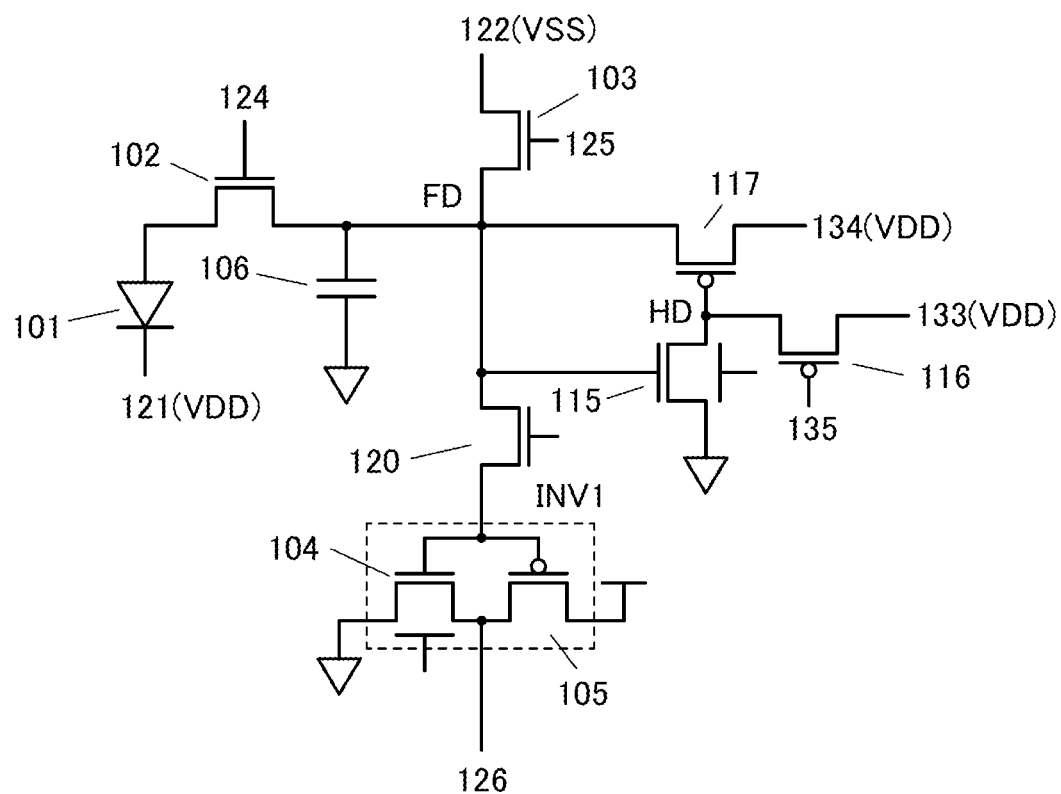

Alternatively, the transistor 120 may be provided between the node FD and the inverter circuit INV1 as illustrated in FIG. 16(B). When an OS transistor is used as the transistor 120 and the transistor 120 is brought into non-conduction after the potential of the node FD is fixed, the potential of the input terminal of the inverter circuit INV1 can be retained.

Application Example

Figure 17A:
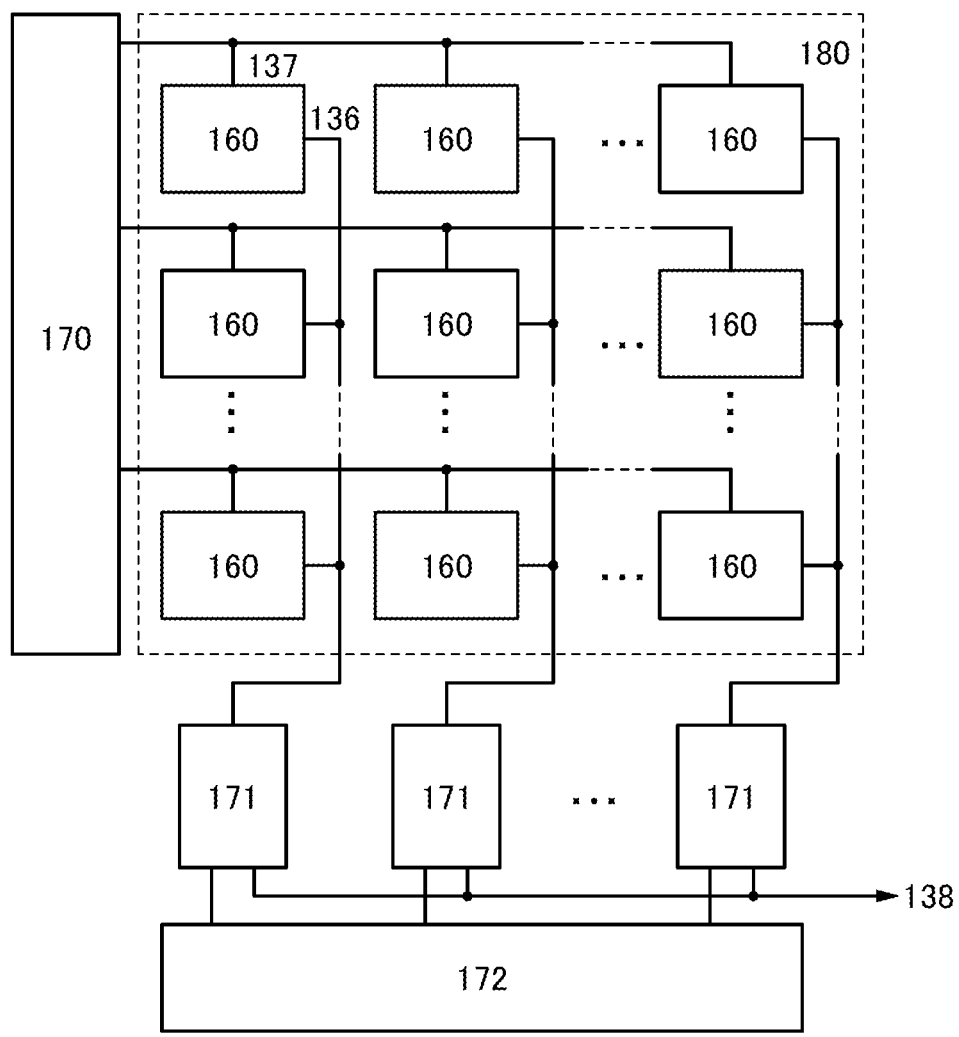
FIGS. 17A and 17B A block diagram illustrating an imaging device.

FIG. 17(A) is a block diagram illustrating an imaging device that includes a plurality of above-described pixels of one embodiment of the present invention. The imaging device includes a pixel array 180, a circuit 170, a circuit 171, and a circuit 172. The pixel array 180 includes circuits 160 arranged in a matrix.

Figure 17B:
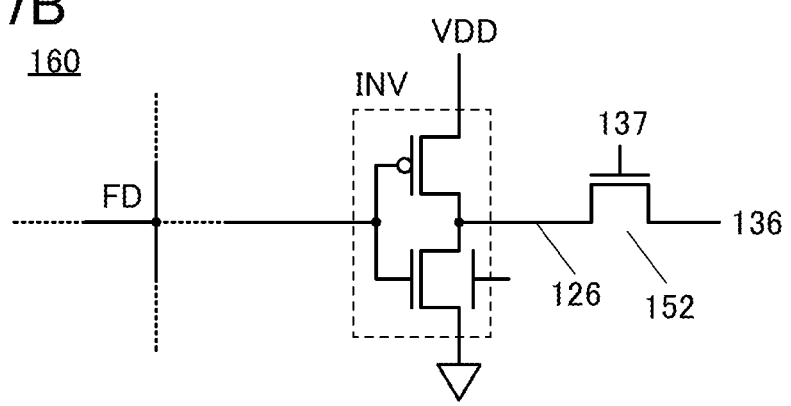

The circuit 160 can have a structure in which a transistor 152 is added to the above-described pixels 11a to 17b or their modification examples. One of a source and a drain of the transistor 152 is electrically connected to the wiring 126 in each pixel as illustrated in FIG. 17(B). The other of the source and the drain of the transistor 152 is connected to the wiring 136, and a gate is electrically connected to a wiring 137.

The transistor 152 has a function of a transistor for selecting a pixel and outputs data to the wiring 136 from a pixel in which a selection signal is input to the wiring 137. The circuit 160 is electrically connected to the circuit 170 through the wiring 137, and the circuit 160 is electrically connected to the circuit 171 through the wiring 136.

The circuit 170 can have a function of a row driver. For the circuit 170, a decoder or a shift register can be used, for example. A row where reading is performed can be selected by the circuit 170 and a signal generated in the circuit 160 can be output to the wiring 136.

The circuit 171 can have a function of a read circuit. The circuit 171 can have, for example, a structure including a comparator circuit. A signal potential input from the circuit 171 to the comparator circuit and a constant potential used as a reference are compared with each other, and "H" or "L" is output from the comparator circuit.

Although signals closer to an intermediate potential than "H" or "L" might be output from the pixels 11a to 13b, the operation of the circuit 171 can make the signals ideal binary. Note that since the pixels 14a to 17b can output binarized signals, a latch circuit or the like is used as the circuit 171.

The circuit 172 can have a function of a column driver. For the circuit 172, a decoder or a shift register can be used, for example. A column where reading is performed can be selected by the circuit 172 and a binary signal generated in the circuit 171 or a binary signal output from the circuit 160 can be output to a wiring 138.

With the above structure, a signal can be obtained from each of the circuits 160 arranged in a matrix. Note that there is no limitation on the connection destination of the wiring 138. For example, the connection destination can be a neural network, a memory device, a display device, a communication device, or the like.

When a neural network takes in a binary signal output to the wiring 138, for example, processing such as character recognition or shape recognition can be executed with high accuracy.

This embodiment can be combined with the description of other embodiments as appropriate.

Embodiment 2

In this embodiment, a structure example of a semiconductor device, which can be used in the application example described in Embodiment 1 and can be used in a neural network, will be described.

Figure 18A:
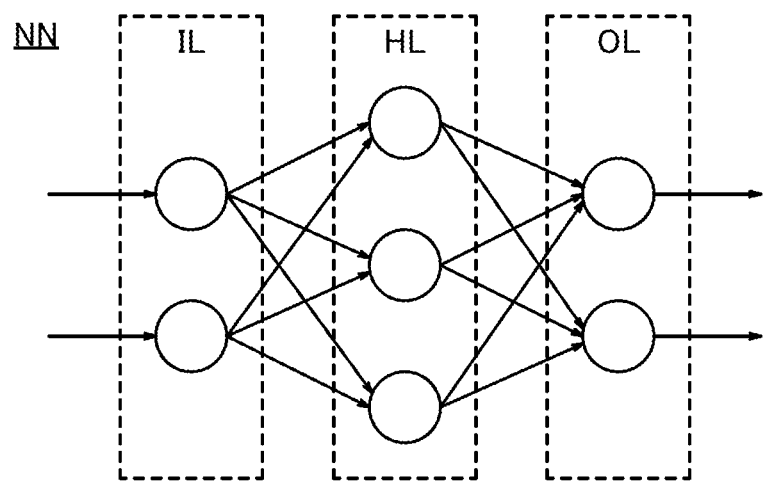
FIGS. 18A and 18B Diagrams illustrating a structure example of a neural network.

As illustrated in FIG. 18(A), a neural network NN can be formed of an input layer IL, an output layer OL, and a middle layer (hidden layer) HL. The input layer IL, the output layer OL, and the middle layer HL each include one or more neurons (units). Note that the middle layer HL may be composed of one layer or two or more layers. A neural network including two or more middle layers HL can also be referred to as DNN (deep neural network), and learning using a deep neural network can also be referred to as deep learning.

Input data are input to neurons of the input layer IL, output signals of neurons in the previous layer or the subsequent layer are input to neurons of the middle layer HL, and output signals of neurons in the previous layer are input to neurons of the output layer OL. Note that each neuron may be connected to all the neurons in the previous and subsequent layers (full connection), or may be connected to some of the neurons.

Figure 18B:
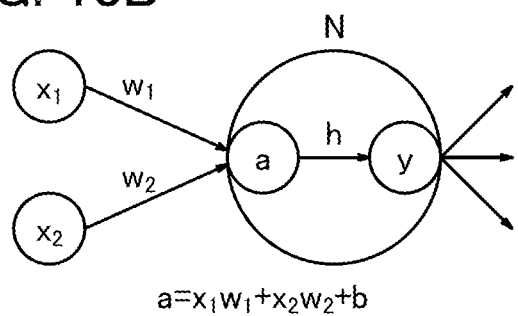

FIG. 18(B) illustrates an example of an operation with the neurons. Here, a neuron N and two neurons in the previous layer which output signals to the neuron N are illustrated. An output $x_1$ of a neuron in the previous layer and an output $x_2$ of a neuron in the previous layer are input to the neuron N. Then, in the neuron N, a total sum $x_1w_1+x_2w_2$ of a multiplication result ($x_1w_1$) of the output $x_1$ and a weight $w_1$ and a multiplication result ($x_2w_2$) of the output $x_2$ and a weight $w_2$ is calculated, and then a bias b is added as necessary, so that a value $a=x_1w_1+x_2w_2+b$ is obtained. Then, the value a is converted with an activation function h, and an output signal $y=h(a)$ is output from the neuron N.

As described above, the operation with the neurons includes the product-sum operation, that is, the operation that sums the products of the outputs and the weights of the neurons in the previous layer ($x_1w_1+x_2w_2$ described above). This product-sum operation may be performed using a program on software or using hardware. In the case where the product-sum operation is performed using hardware, a product-sum operation circuit can be used. Either a digital circuit or an analog circuit may be used as this product-sum operation circuit.

An analog circuit is used as the product-sum operation circuit in one embodiment of the present invention. Thus, the circuit scale of the product-sum operation circuit can be reduced, or an improved processing speed and lower power consumption can be achieved by reduced frequency of access to a memory.

The product-sum operation circuit may be formed using a Si transistor or may be formed using an OS transistor. An OS transistor is particularly suitable for a transistor included in an analog memory of the product-sum operation circuit because of its extremely low off-state current. Note that the product-sum operation circuit may be formed using both a Si transistor and an OS transistor. A configuration example of a semiconductor device having a function of the product-sum operation circuit will be described below.

Configuration Example of Semiconductor Device

Figure 19:
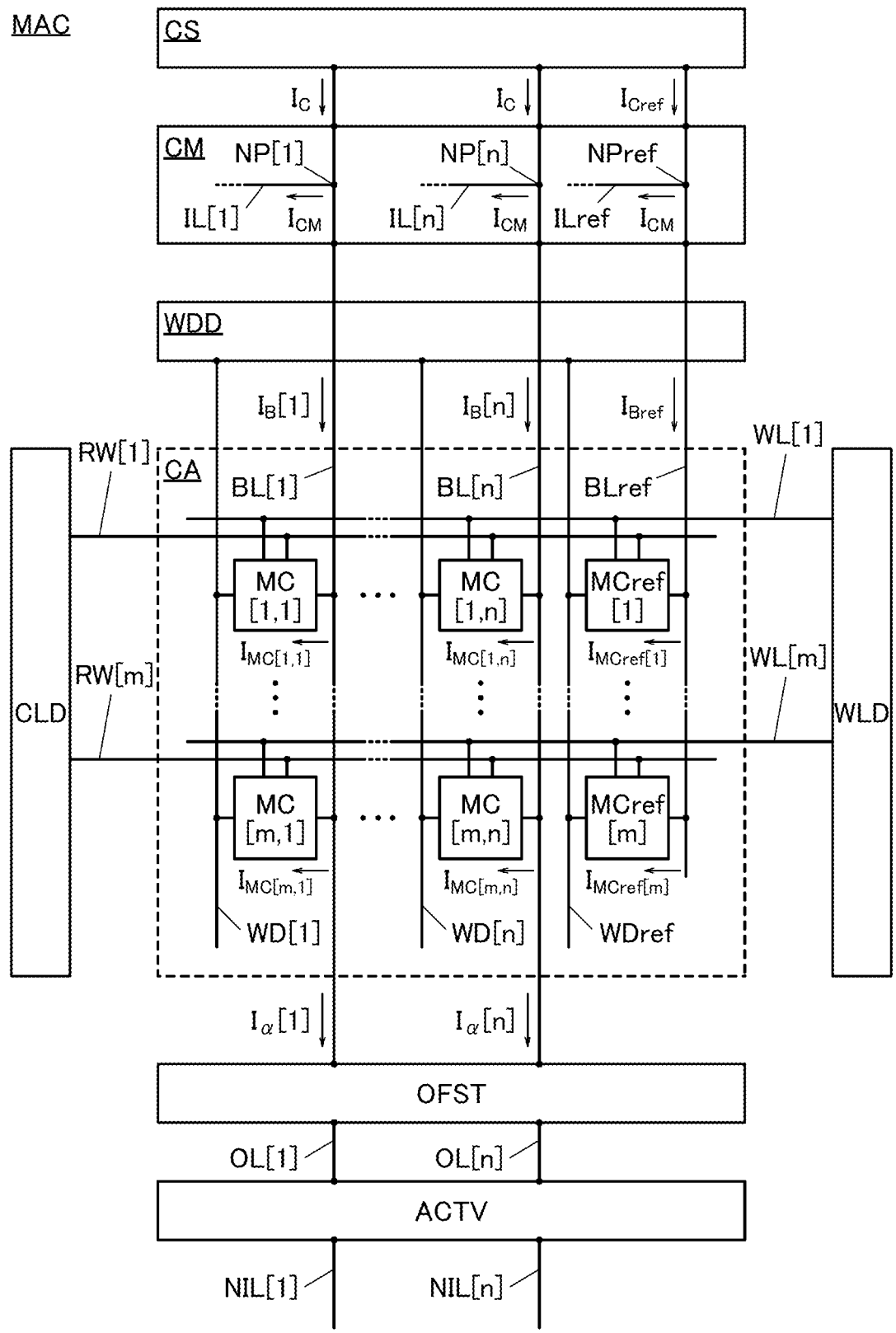
FIG. 19 A diagram illustrating a configuration example of a semiconductor device.

FIG. 19 illustrates a configuration example of a semiconductor device MAC having a function of performing an operation of a neural network. The semiconductor device MAC has a function of performing a product-sum operation of first data corresponding to the connection strength between neurons (weight) and second data corresponding to input data. Note that the first data and the second data can each be analog data or multilevel data (discrete data). The semiconductor device MAC also has a function of converting data obtained by the product-sum operation with an activation function.

The semiconductor device MAC includes a cell array CA, a current source circuit CS, a current mirror circuit CM, a circuit WDD, a circuit WLD, a circuit CLD, an offset circuit OFST, and an activation function circuit ACTV.

The cell array CA includes a plurality of memory cells MC and a plurality of memory cells MCref. FIG. 19 illustrates a configuration example in which the cell array CA includes the memory cells MC in m rows and n columns (MC[1, 1] to MC[m, n]) and the m memory cells MCref (MCref[1] to MCref[m]) (m and n are integers greater than or equal to 1). The memory cells MC each have a function of storing the first data. In addition, the memory cells MCref each have a function of storing reference data used for the product-sum operation. Note that the reference data can be analog data or multilevel data.

The memory cell MC[i, j] (i is an integer greater than or equal to 1 and less than or equal to m, and j is an integer greater than or equal to 1 and less than or equal to n) is connected to a wiring WL[i], a wiring RW[i], a wiring WD[j], and a wiring BL[j]. In addition, the memory cell MCref[i] is connected to the wiring WL[i], the wiring RW[i], a wiring WDref, and a wiring BLref. Here, a current flowing between the memory cell MC[i, j] and the wiring BL[j] is denoted by $I_{MC[i, j]}$, and a current flowing between the memory cell MCref[i] and the wiring BLref is denoted by $I_{MCref[i]}$.

Figure 20:
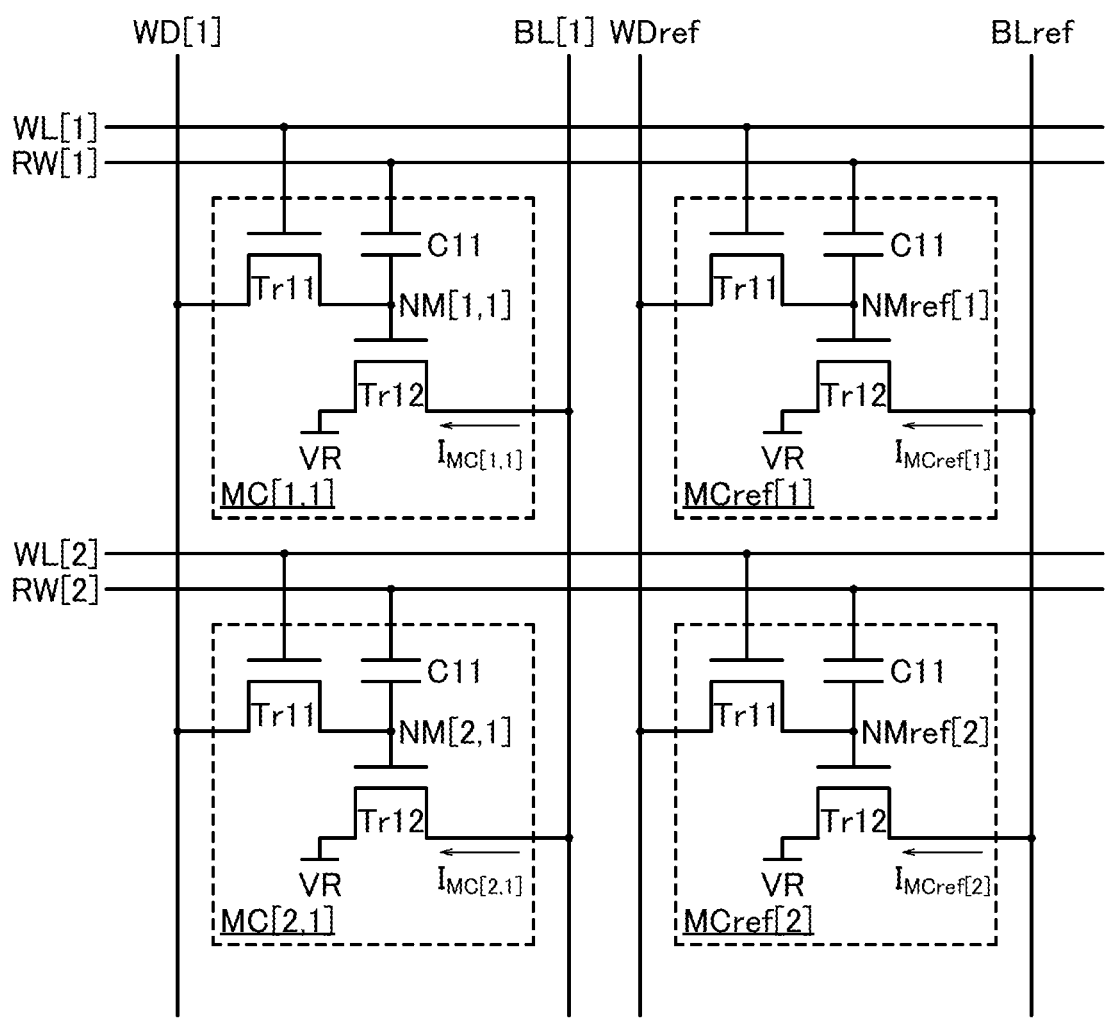
FIG. 20 A diagram illustrating a configuration example of a memory cell.

FIG. 20 illustrates a specific configuration example of the memory cells MC and the memory cells MCref. Although the memory cells MC[1, 1] and MC[2, 1] and the memory cells MCref[1] and MCref[2] are illustrated in FIG. 20 as typical examples, similar configurations can be used for other memory cells MC and memory cells MCref. The memory cells MC and the memory cells MCref each include transistors Tr11 and Tr12 and a capacitor C11. Here, the case where the transistor Tr11 and the transistor Tr12 are n-channel transistors will be described.

In the memory cell MC, a gate of the transistor Tr11 is connected to the wiring WL, one of a source and a drain is connected to a gate of the transistor Tr12 and a first electrode of the capacitor C11, and the other of the source and the drain is connected to the wiring WD. One of a source and a drain of the transistor Tr12 is connected to the wiring BL, and the other of the source and the drain is connected to a wiring VR. A second electrode of the capacitor C11 is connected to the wiring RW. The wiring VR is a wiring having a function of supplying a predetermined potential. Here, the case where a low power supply potential (e.g., a ground potential) is supplied from the wiring VR is described as an example.

Anode connected to the one of the source and the drain of the transistor Tr11, the gate of the transistor Tr12, and the first electrode of the capacitor C11 is referred to as a node NM. The nodes NM in the memory cells MC[1, 1] and MC[2, 1] are referred to as nodes NM[1, 1] and NM[2, 1], respectively.

The memory cells MCref have a configuration similar to that of the memory cell MC. However, the memory cells MCref are connected to the wiring WDref instead of the wiring WD and connected to the wiring BLref instead of the wiring BL. Nodes in the memory cells MCref[1] and MCref[2] each of which is connected to the one of the source and the drain of the transistor Tr11, the gate of the transistor Tr12, and the first electrode of the capacitor C11 are referred to as nodes NMref[1] and NMref[2], respectively.

The node NM and the node NMref function as holding nodes of the memory cell MC and the memory cell MCref, respectively. The first data is held in the node NM and the reference data is held in the node NMref. Currents $I_{MC[1, 1]}$ and $I_{MC[2, 1]}$ from the wiring BL[1] flow to the transistors Tr12 of the memory cells MC[1, 1] and MC[2, 1], respectively. Currents $I_{MCref[1]}$ and $I_{MCref[2]}$ from the wiring BLref flow to the transistors Tr12 of the memory cells MCref[1] and MCref[2], respectively.

Since the transistor Tr11 has a function of holding the potential of the node NM or the node NMref, the off-state current of the transistor Tr11 is preferably low. Thus, it is preferable to use an OS transistor, which has extremely low off-state current, as the transistor Tr11. This inhibits a change in the potential of the node NM or the node NMref, so that the operation accuracy can be improved. Furthermore, operations of refreshing the potential of the node NM or the node NMref can be performed less frequently, which leads to a reduction in power consumption.

There is no particular limitation on the transistor Tr12, and for example, a Si transistor, an OS transistor, or the like can be used. In the case where an OS transistor is used as the transistor Tr12, the transistor Tr12 can be manufactured with the same manufacturing apparatus as the transistor Tr11, and accordingly manufacturing cost can be reduced. Note that the transistor Tr12 may be an n-channel transistor or a p-channel transistor.

The current source circuit CS is connected to the wirings BL[1] to BL[n] and the wiring BLref. The current source circuit CS has a function of supplying currents to the wirings BL[1] to BL[n] and the wiring BLref. Note that the value of the current supplied to the wirings BL[1] to BL[n] may be different from the value of the current supplied to the wiring BLref. Here, the current supplied from the current source circuit CS to the wirings BL[1] to BL[n] is denoted by $I_C$, and the current supplied from the current source circuit CS to the wiring BLref is denoted by $I_{Cref}$.

The current mirror circuit CM includes wirings IL[1] to IL[n] and a wiring ILref. The wirings IL[1] to IL[n] are connected to the wirings BL[1] to BL[n], respectively, and the wiring ILref is connected to the wiring BLref. Here, portions where the wirings IL[1] to IL[n] are connected to the respective wirings BL[1] to BL[n] are referred to as nodes NP[1] to NP[n]. Furthermore, a portion where the wiring ILref is connected to the wiring BLref is referred to as a node NPref.

The current mirror circuit CM has a function of making a current $I_{CM}$ corresponding to the potential of the node NPref flow to the wiring ILref and a function of making this current $I_{CM}$ flow also to the wirings IL[1] to IL[n]. In the example illustrated in FIG. 19, the current $I_{CM}$ is discharged from the wiring BLref to the wiring ILref, and the current $I_{CM}$ is discharged from the wirings BL[1] to BL[n] to the wirings IL[1] to IL[n]. Furthermore, currents flowing from the current mirror circuit CM to the cell array CA through the wirings BL[1] to BL[n] are denoted by $I_B[1]$ to $I_B[n]$. Furthermore, a current flowing from the current mirror circuit CM to the cell array CA through the wiring BLref is denoted by $I_{Bref}$.

The circuit WDD is connected to the wirings WD[1] to WD[n] and the wiring WDref. The circuit WDD has a function of supplying a potential corresponding to the first data to be stored in the memory cells MC to the wirings WD[1] to WD[n]. The circuit WDD also has a function of supplying a potential corresponding to the reference data to be stored in the memory cell MCref to the wiring WDref. The circuit WLD is connected to wirings WL[1] to WL[m]. The circuit WLD has a function of supplying a signal for selecting the memory cell MC or the memory cell MCref to which data is to be written, to any of the wirings WL[1] to WL[m]. The circuit CLD is connected to the wirings RW[1] to RW[m]. The circuit CLD has a function of supplying a potential corresponding to the second data to the wirings RW[1] to RW[m].

The offset circuit OFST is connected to the wirings BL[1] to BL[n] and wirings OL[1] to OL[n]. The offset circuit OFST has a function of detecting the amount of currents flowing from the wirings BL[1] to BL[n] to the offset circuit OFST and/or the amount of change in the currents flowing from the wirings BL[1] to BL[n] to the offset circuit OFST. The offset circuit OFST also has a function of outputting detection results to the wirings OL[1] to OL[n]. Note that the offset circuit OFST may output currents corresponding to the detection results to the wirings OL, or may convert the currents corresponding to the detection results into voltages to output the voltages to the wirings OL. The currents flowing between the cell array CA and the offset circuit OFST are denoted by $I_\alpha[1]$ to $I_\alpha[n]$.

Figure 21:
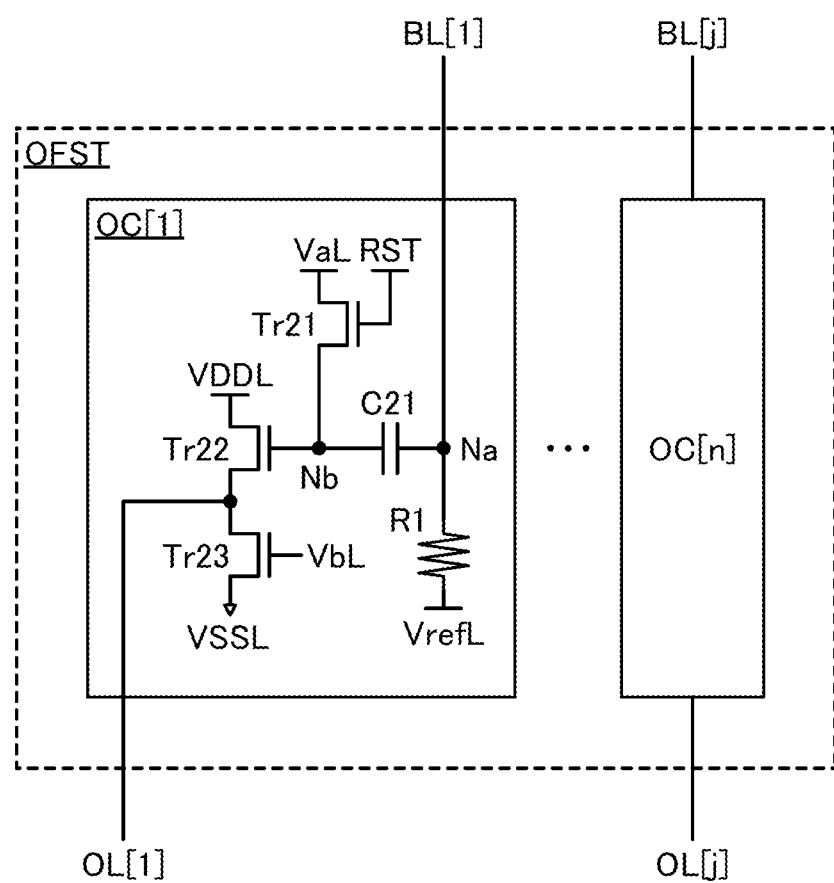
FIG. 21 A diagram illustrating a configuration example of an offset circuit.

FIG. 21 illustrates a configuration example of the offset circuit OFST. The offset circuit OFST illustrated in FIG. 21 includes circuits OC[1] to OC[n]. The circuits OC[1] to OC[n] each include a transistor Tr21, a transistor Tr22, a transistor Tr23, a capacitor C21, and a resistor R1. Connection relations of the elements are illustrated in FIG. 21. Note that a node connected to a first electrode of the capacitor C21 and a first terminal of the resistor R1 is referred to as a node Na. In addition, a node connected to a second electrode of the capacitor C21, one of a source and a drain of the transistor Tr21, and a gate of the transistor Tr22 is referred to as a node Nb.

A wiring VrefL has a function of supplying a potential Vref, a wiring VaL has a function of supplying a potential Va, and a wiring VbL has a function of supplying a potential Vb. Furthermore, a wiring VDDL has a function of supplying a potential VDD, and a wiring VSSL has a function of supplying a potential VSS. Here, the case where the potential VDD is a high power supply potential and the potential VSS is a low power supply potential is described. A wiring RST has a function of supplying a potential for controlling the conduction state of the transistor Tr21. The transistor Tr22, the transistor Tr23, the wiring VDDL, the wiring VSSL, and the wiring VbL form a source follower circuit.

Next, an operation example of the circuits OC[1] to OC[n] will be described. Note that although an operation example of the circuit OC[1] is described here as a typical example, the circuits OC[2] to OC[n] can operate in a similar manner. First, when a first current flows to the wiring BL[1], the potential of the node Na becomes a potential corresponding to the first current and the resistance value of the resistor R1.

At this time, the transistor Tr21 is in an on state, and thus the potential Va is supplied to the node Nb. Then, the transistor Tr21 is brought into an off state.

Next, when a second current flows to the wiring BL[1], the potential of the node Na changes to a potential corresponding to the second current and the resistance value of the resistor R1. At this time, since the transistor Tr21 is in an off state and the node Nb is in a floating state, the potential of the node Nb changes because of capacitive coupling, following the change in the potential of the node Na. Here, when the amount of change in the potential of the node Na is $\Delta V_{Na}$ and the capacitive coupling coefficient is 1, the potential of the node Nb is $Va+\Delta V_{Na}$. When the threshold voltage of the transistor Tr22 is $V_{th}$, a potential $Va+\Delta V_{Na}-V_{th}$ is output from the wiring OL[1]. Here, when $Va=V_{th}$, the potential $\Delta V_{Na}$ can be output from the wiring OL[1].

The potential $\Delta V_{Na}$ is determined by the amount of change from the first current to the second current, the resistor R1, and the potential Vref. Here, since the resistor R1 and the potential Vref are known, the amount of change in the current flowing to the wiring BL can be found from the potential $\Delta V_{Na}$.

A signal corresponding to the amount of current and/or the amount of change in the current that are/is detected by the offset circuit OFST as described above is input to the activation function circuit ACTV through the wirings OL[1] to OL[n].

The activation function circuit ACTV is connected to the wirings OL[1] to OL[n] and wirings NIL[1] to NIL[n]. The activation function circuit ACTV has a function of performing an operation for converting the signal input from the offset circuit OFST in accordance with the predefined activation function. As the activation function, for example, a sigmoid function, a tan h function, a softmax function, a ReLU function, a threshold function, or the like can be used. The signal converted by the activation function circuit ACTV is output as output data to the wirings NIL[1] to NIL[n].

Operation Example of Semiconductor Device

The product-sum operation of the first data and the second data can be performed with the above semiconductor device MAC. An operation example of the semiconductor device MAC at the time of performing the product-sum operation is described below.

Figure 22:
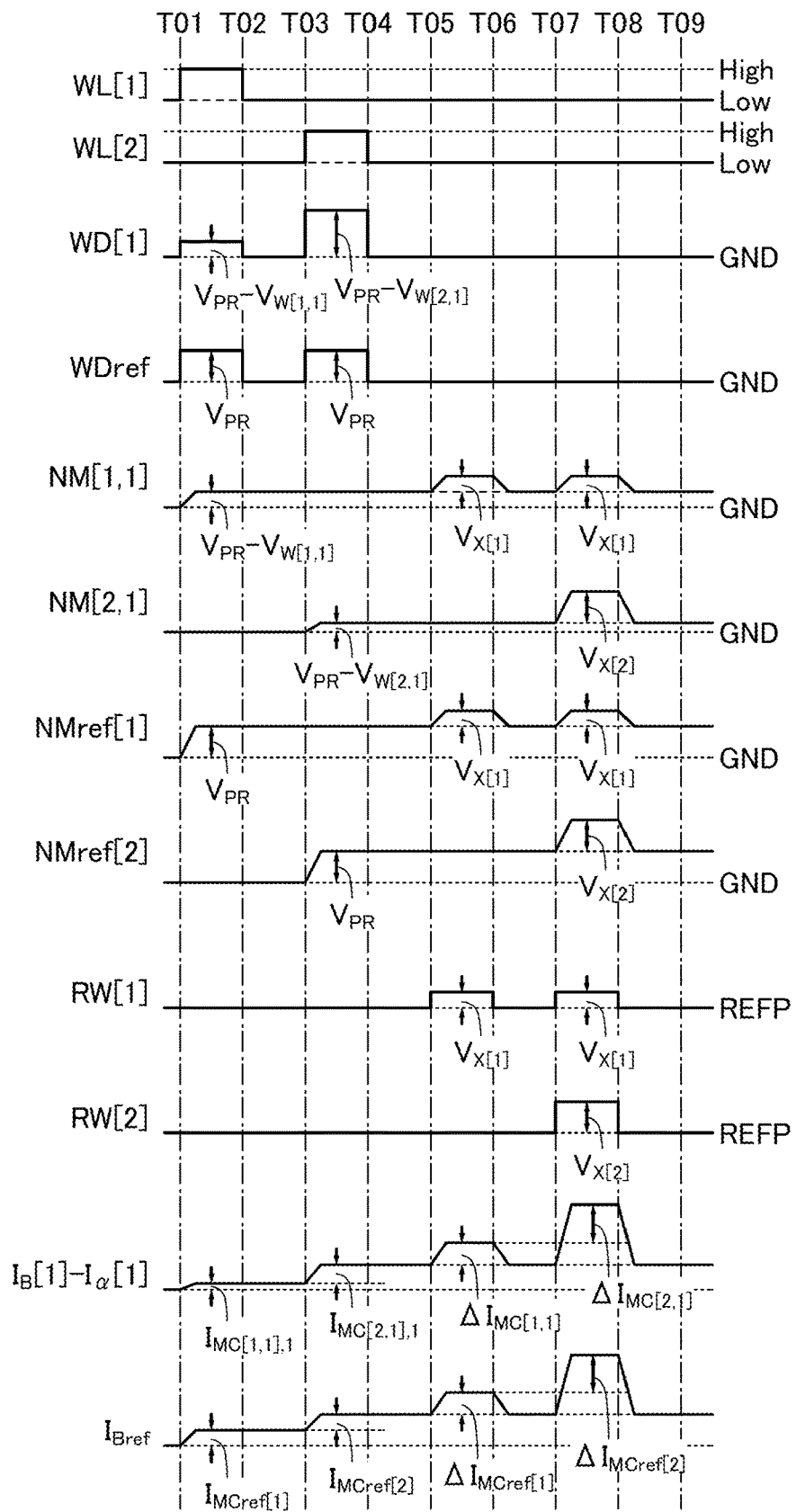
FIG. 22 A timing chart showing the operation of a semiconductor device.

FIG. 22 illustrates a timing chart of the operation example of the semiconductor device MAC. FIG. 22 shows changes in the potentials of the wiring WL[1], the wiring WL[2], the wiring WD[1], and the wiring WDref, the node NM[1, 1], the node NM[2, 1], the node NMref[1], and the node NMref[2], and the wiring RW[1] and the wiring RW[2] in FIG. 20 and changes in the values of a current $I_B[1]-I_\alpha[1]$ and the current $I_{Bref}$. The current $I_B[1]-I_\alpha[1]$ corresponds to the sum total of the currents flowing from the wiring BL[1] to the memory cells MC[1, 1] and MC[2, 1].

Although an operation is described with a focus on the memory cells MC[1, 1] and MC[2, 1] and the memory cells MCref[1] and MCref[2] illustrated in FIG. 20 as a typical example, the other memory cells MC and the other memory cells MCref can also be operated in a similar manner.

[Storage of First Data]

First, from Time T01 to Time T02, the potential of the wiring WL[1] becomes a high level, the potential of the wiring WD[1] becomes a potential greater than a ground potential (GND) by $V_{PR}-V_{W[1, 1]}$, and the potential of the wiring WDref becomes a potential greater than the ground potential by $V_{PR}$. The potentials of the wiring RW[1] and the wiring RW[2] become reference potentials (REFP). Note that the potential $V_{W[1, 1]}$ is the potential corresponding to the first data stored in the memory cell MC[1, 1]. The potential $V_{PR}$ is the potential corresponding to the reference data. Thus, the transistors Tr11 included in the memory cell MC[1, 1] and the memory cell MCref[1] are turned on, and the potential of the node NM[1, 1] and the potential of the node NMref[1] become $V_{PR}-V_{W[1, 1]}$ and $V_{PR}$, respectively.

In this case, a current $I_{MC[1, 1], 0}$ flowing from the wiring BL[1] to the transistor Tr12 in the memory cell MC[1, 1] can be expressed by the formula shown below. Here, k is a constant determined by the channel length, the channel width, the mobility, the capacitance of a gate insulating film, and the like of the transistor Tr12. Furthermore, $V_{th}$ is the threshold voltage of the transistor Tr12.

$$I_{MC[1,1],0}=k(V_{PR}-V_{W[1,1]}-V_{th})^2 \quad (E1)$$

Furthermore, a current $I_{MCref[1], 0}$ flowing from the wiring BLref to the transistor Tr12 in the memory cell MCref[1] can be expressed by the formula shown below.

$$I_{MCref[1],0}=k(V_{PR}-V_{th})^2 \quad (E2)$$

Next, from Time T02 to Time T03, the potential of the wiring WL[1] becomes a low level. Consequently, the transistors Tr11 included in the memory cell MC[1, 1] and the memory cell MCref[1] are turned off, and the potentials of the node NM[1, 1] and the node NMref[1] are held.

As described above, an OS transistor is preferably used as the transistor Tr11. This can suppress the leakage current of the transistor Tr11, so that the potentials of the node NM[1, 1] and the node NMref[1] can be accurately held.

Next, from Time T03 to Time T04, the potential of the wiring WL[2] becomes the high level, the potential of the wiring WD[1] becomes a potential greater than the ground potential by $V_{PR}-V_{W[2, 1]}$, and the potential of the wiring WDref becomes a potential greater than the ground potential by $V_{PR}$. Note that the potential $V_{W[2, 1]}$ is a potential corresponding to the first data stored in the memory cell MC[2, 1]. Thus, the transistors Tr11 included in the memory cell MC[2, 1] and the memory cell MCref[2] are turned on, and the potentials of the node NM[1, 1] and the node NMref[1] become $V_{PR}-V_{W[2, 1]}$ and $V_{PR}$, respectively.

Here, a current $I_{MC[2, 1], 0}$ flowing from the wiring BL[1] to the transistor Tr12 in the memory cell MC[2, 1] can be expressed by the formula shown below.

$$IMC_{[2,1],0}=k(V_{PR}-V_{W[2,1]}-V_{th})^2 \quad (E3)$$

Furthermore, a current $I_{MCref[2], 0}$ flowing from the wiring BLref to the transistor Tr12 in the memory cell MCref[2] can be expressed by the formula shown below.

$$I_{MCref[2],0}=k(V_{PR}-V_{th})^2 \quad (E4)$$

Next, from Time T04 to Time T05, the potential of the wiring WL[2] becomes the low level. Consequently, the transistors Tr11 included in the memory cell MC[2, 1] and the memory cell MCref[2] are turned off, and the potentials of the node NM[2, 1] and the node NMref[2] are held.

Through the above operation, the first data is stored in the memory cells MC[1, 1] and MC[2, 1], and the reference data is stored in the memory cells MCref[1] and MCref[2].

Here, currents flowing through the wiring BL[1] and the wiring BLref from Time T04 to Time T05 are considered. A current from the current source circuit CS is supplied to the wiring BLref. The current flowing through the wiring BLref is discharged to the current mirror circuit CM and the memory cells MCref[1] and MCref[2]. The formula shown below holds where $I_{Cref}$ is the current supplied from the current source circuit CS to the wiring BLref and $I_{CM, 0}$ is the current discharged from the wiring BLref to the current mirror circuit CM.

$$I_{Cref} - I_{CM,0} = I_{MCref[1],0} + I_{MCref[2],0} \quad (E5)$$

A current from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{C, 0}$ is the current supplied from the current source circuit CS to the wiring BL[1] and $I_{\alpha, 0}$ is the current flowing from the wiring BL[1] to the offset circuit OFST.

$$I_C - I_{CM,0} = I_{MC[1,1],0} + IMC_{[2,1],0} + I_{\alpha,0} \quad (E6)$$

[Product-Sum Operation of First Data and Second Data]

Next, from Time T05 to Time T06, the potential of the wiring RW[1] becomes a potential greater than the reference potential by $V_{X[1]}$. At this time, the potential $V_{X[1]}$ is supplied to the capacitors C11 in the memory cell MC[1, 1] and the memory cell MCref[1], so that the potentials of the gates of the transistors Tr12 are increased owing to capacitive coupling. Note that the potential $V_{x[1]}$ is the potential corresponding to the second data supplied to the memory cell MC[1, 1] and the memory cell MCref[1].

The amount of change in the potential of the gate of the transistor Tr12 corresponds to the value obtained by multiplying the amount of change in the potential of the wiring RW by a capacitive coupling coefficient determined by the memory cell configuration. The capacitive coupling coefficient is calculated using the capacitance of the capacitor C11, the gate capacitance of the transistor Tr12, the parasitic capacitance, and the like. In the following description, for convenience, the amount of change in the potential of the wiring RW is equal to the amount of change in the potential of the gate of the transistor Tr12, that is, the capacitive coupling coefficient is 1. In practice, the potential $V_x$ can be determined in consideration of the capacitive coupling coefficient.

When the potential $V_{X[1]}$ is supplied to the capacitors C11 in the memory cell MC[1] and the memory cell MCref[1], the potentials of the node NN[1] and the node NMref[1] each increase by $V_{X[1]}$.

Here, a current $I_{MC[1, 1], 1}$ flowing from the wiring BL[1] to the transistor Tr12 in the memory cell MC[1, 1] from Time T05 to Time T06 can be expressed by the formula shown below.

$$I_{MC[1,1],1} = k(V_{PR} - V_{W[1,1]} + V_{X[1]} - V_{th})^2 \quad (E7)$$

That is, when the potential $V_{X[1]}$ is supplied to the wiring RW[1], the current flowing from the wiring BL[1] to the transistor Tr12 in the memory cell MC[1, 1] increases by $\Delta I_{MC[1, 1]} = I_{MC[1, 1], 1} - I_{MC[1, 1], 0}$.

A current $I_{MCref[1], 1}$ flowing from the wiring BLref to the transistor Tr12 in the memory cell MCref[1] from Time T05 to Time T06 can be expressed by the formula shown below.

$$I_{MCref[1],1} = k(V_{PR} + V_{X[1]} - V_{th})^2 \quad (E8)$$

That is, when the potential $V_{X[1]}$ is supplied to the wiring RW[1], the current flowing from the wiring BLref to the transistor Tr12 in the memory cell MCref[1] increases by $\Delta I_{MCref[1]} = I_{MCref[1], 1} - I_{MCref[1], 0}$.

Furthermore, currents flowing through the wiring BL[1] and the wiring BLref are considered. A current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM, 1}$ is the current discharged from the wiring BLref to the current mirror circuit CM.

$$I_{Cref} - I_{CM,1} = I_{MCref[1],1} + I_{MCref[2],0} \quad (E9)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha, 1}$ is the current flowing from the wiring BL[1] to the offset circuit OFST.

$$I_C - I_{CM,1} = I_{MC[1,1],1} + I_{MC[2,1],1} + I_{\alpha,1} \quad (E10)$$

In addition, from the formula (E1) to the formula (E10), a difference between the current $I_{\alpha, 0}$ and the current $I_{\alpha, 1}$ (differential current $\Delta I_\alpha$) can be expressed by the formula shown below.

$$\Delta I_\alpha = I_{\alpha,0} - I_{\alpha,1} = 2kV_{W[1,1]}V_{X[1]} \quad (E11)$$

Thus, the differential current $\Delta I_\alpha$ is a value corresponding to the product of the potentials $V_{W[1, 1]}$ and $V_{X[1]}$.

After that, from Time T06 to Time T07, the potential of the wiring RW[1] becomes the ground potential, and the potentials of the node NM[1, 1] and the node NMref[1] become similar to the potentials thereof from Time T04 to Time T05.

Next, from Time T07 to Time T08, the potential of the wiring RW[1] becomes the potential greater than the reference potential by $V_{X[1]}$, and a potential greater than the reference potential by $V_{X[2]}$ is supplied as the potential of the wiring RW[2]. Accordingly, the potential $V_{X[1]}$ is supplied to the capacitors C11 in the memory cell MC[1, 1] and the memory cell MCref[1], and the potentials of the node NM[1, 1] and the node NMref[1] each increase by $V_{X[1]}$ due to capacitive coupling. Furthermore, the potential $V_{X[2]}$ is supplied to the capacitors C11 in the memory cell MC[2, 1] and the memory cell MCref[2], and the potentials of the node NM[2, 1] and the node NMref[2] each increase by $V_{X[2]}$ due to capacitive coupling.

Here, the current $I_{MC[2, 1], 1}$ flowing from the wiring BL[1] to the transistor Tr12 in the memory cell MC[2, 1] from Time T07 to Time T08 can be expressed by the formula shown below.

$$I_{MC[2,1],1} = k(V_{PR} - V_{W[2,1]} + V_{X[2]} - V_{th})^2 \quad (E12)$$

That is, when the potential $V_{X[2]}$ is supplied to the wiring RW[2], the current flowing from the wiring BL[1] to the transistor Tr12 in the memory cell MC[2, 1] increases by $\Delta I_{MC[2, 1]} = IMC_{[2, 1], 1} - IMC_{[2, 1], 0}$.

Here, a current $I_{MCref[2], 1}$ flowing from the wiring BLref to the transistor Tr12 in the memory cell MCref[2] from Time T05 to Time T06 can be expressed by the formula shown below.

$$I_{MCref[2],1} = k(V_{PR} + V_{X[2]} - V_{th})^2 \quad (E13)$$

That is, when the potential $V_{X[2]}$ is supplied to the wiring RW[2], the current flowing from the wiring BLref to the transistor Tr12 in the memory cell MCref[2] increases by $\Delta I_{MCref[2]} = I_{MCref[2], 1} - I_{MCref[2], 0}$.

Furthermore, currents flowing through the wiring BL[1] and the wiring BLref are considered. The current $I_{Cref}$ is supplied from the current source circuit CS to the wiring BLref. The current flowing through the wiring BLref is discharged to the current mirror circuit CM and the memory cells MCref[1] and MCref[2]. The formula shown below holds where $I_{CM, 2}$ is the current discharged from the wiring BLref to the current mirror circuit CM.

$$I_{Cref} - I_{CM,2} = I_{MCref[1],1} + I_{MCref[2],1} \quad (E14)$$

The current $I_C$ from the current source circuit CS is supplied to the wiring BL[1]. The current flowing through the wiring BL[1] is discharged to the current mirror circuit CM and the memory cells MC[1, 1] and MC[2, 1]. Furthermore, the current flows from the wiring BL[1] to the offset circuit OFST. The formula shown below holds where $I_{\alpha, 2}$ is the current flowing from the wiring BL[1] to the offset circuit OFST.

$$I_C - I_{CM,2} = I_{MC[1,1],1} + I_{MC[2,1],1} + I_{\alpha,2} \quad (E15)$$

In addition, from the formula (E1) to the formula (E8) and the formula (E12) to the formula (E15), a difference between the current $I_{\alpha, 0}$ and the current $I_{\alpha, 2}$ (differential current $\Delta I_\alpha$) can be expressed by the formula shown below.

$$\Delta I_\alpha = I_{\alpha,0} - I_{\alpha,2} = 2(V_{W[1,1]} V_{X[1]} + V_{W[2,1]} V_{X[2]}) \quad (E16)$$

Thus, the differential current $\Delta I_\alpha$ is a value corresponding to the sum of the product of the potential $V_{W[1, 1]}$ and the potential $V_{X[1]}$ and the product of the potential $V_{W[2, 1]}$ and the potential $V_{X[2]}$.

After that, from Time T08 to Time T09, the potentials of the wirings RW[1] and RW[2] become the ground potential, and the potentials of the nodes NM[1, 1] and NM[2, 1] and the nodes NMref[1] and NMref[2] become similar to the potentials thereof from Time T04 to Time T05.

As represented by the formula (E9) and the formula (E16), the differential current $\Delta I_\alpha$ input to the offset circuit OFST is a value corresponding to the sum of the products of the potentials $V_X$ corresponding to the first data (weight) and the potentials $V_W$ corresponding to the second data (input data). Thus, measurement of the differential current $\Delta I_\alpha$ with the offset circuit OFST gives the result of the product-sum operation of the first data and the second data.

Note that although the memory cells MC[1, 1] and MC[2, 1] and the memory cells MCref[1] and MCref[2] are particularly focused on in the above description, the number of the memory cells MC and the memory cells MCref can be set to any number. In the case where the number m of rows of the memory cells MC and the memory cells MCref is an arbitrary number, the differential current $\Delta I_\alpha$ can be expressed by the formula shown below.

$$\Delta I_\alpha = 2k \Sigma_i V_{W[i,1]} V_{X[i]} \quad (E17)$$

When the number n of columns of the memory cells MC and the memory cells MCref is increased, the number of product-sum operations executed in parallel can be increased.

The product-sum operation of the first data and the second data can be performed using the semiconductor device MAC as described above. Note that the use of the configuration of the memory cells MC and the memory cells MCref in FIG. 20 allows the product-sum operation circuit to be formed of fewer transistors. Accordingly, the circuit scale of the semiconductor device MAC can be reduced.

In the case where the semiconductor device MAC is used for the operation in the neural network, the number m of rows of the memory cells MC can correspond to the number of pieces of input data supplied to one neuron and the number n of columns of the memory cells MC can correspond to the number of neurons. For example, the case where a product-sum operation using the semiconductor device MAC is performed in the middle layer HL in FIG. 18(A) is considered. In this case, the number m of rows of the memory cells MC can be set to the number of pieces of input data supplied from the input layer IL (the number of neurons in the input layer IL), and the number n of columns of the memory cells MC can be set to the number of neurons in the middle layer HL.

Note that there is no particular limitation on the configuration of the neural network for which the semiconductor device MAC is used. For example, the semiconductor device MAC can also be used for a convolutional neural network (CNN), a recurrent neural network (RNN), an autoencoder, a Boltzmann machine (including a restricted Boltzmann machine), or the like.

The product-sum operation of the neural network can be performed using the semiconductor device MAC as described above. Furthermore, the memory cells MC and the memory cells MCref illustrated in FIG. 20 are used for the cell array CA, which can provide the integrated circuit IC with improved operation accuracy, lower power consumption, or a reduced circuit scale.

Figure 23:
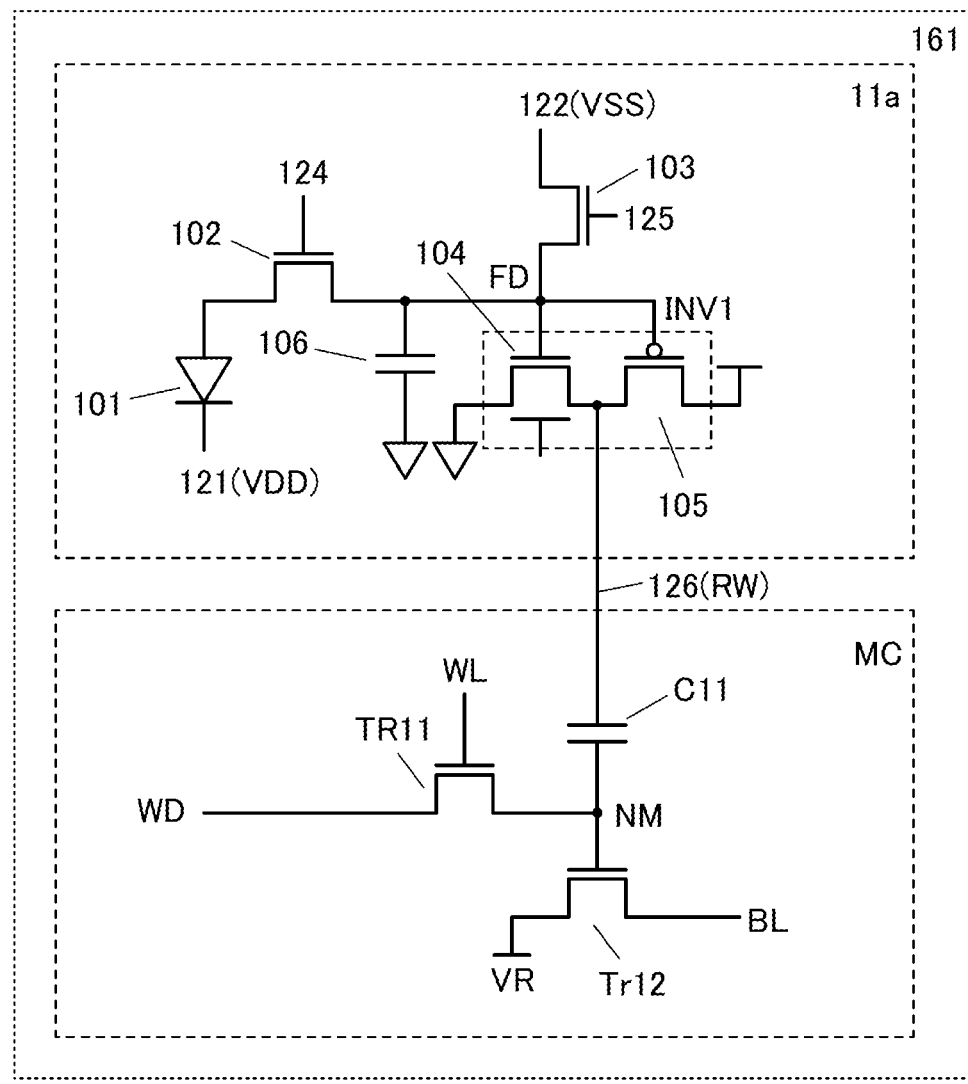
FIG. 23 A diagram illustrating connection between a pixel and a memory cell in an imaging device.

Data subjected to the operation may be written to the memory cell MC directly. FIG. 23 is a diagram illustrating a pixel 161 having a connection mode between the structure of the pixel 11a described in Embodiment 1 and a memory cell 20 that corresponds to the memory cell MC. Note that the pixel 11a may be replaced by another pixel described in Embodiment 1.

In the employed structure, the pixel 11a and the memory cell 20 are connected by the wiring 126 and the wiring RW. Thus, in the case of a plurality of pixels 161, massively parallel processing in which processings of all pixels can be executed concurrently.

Figure 24:
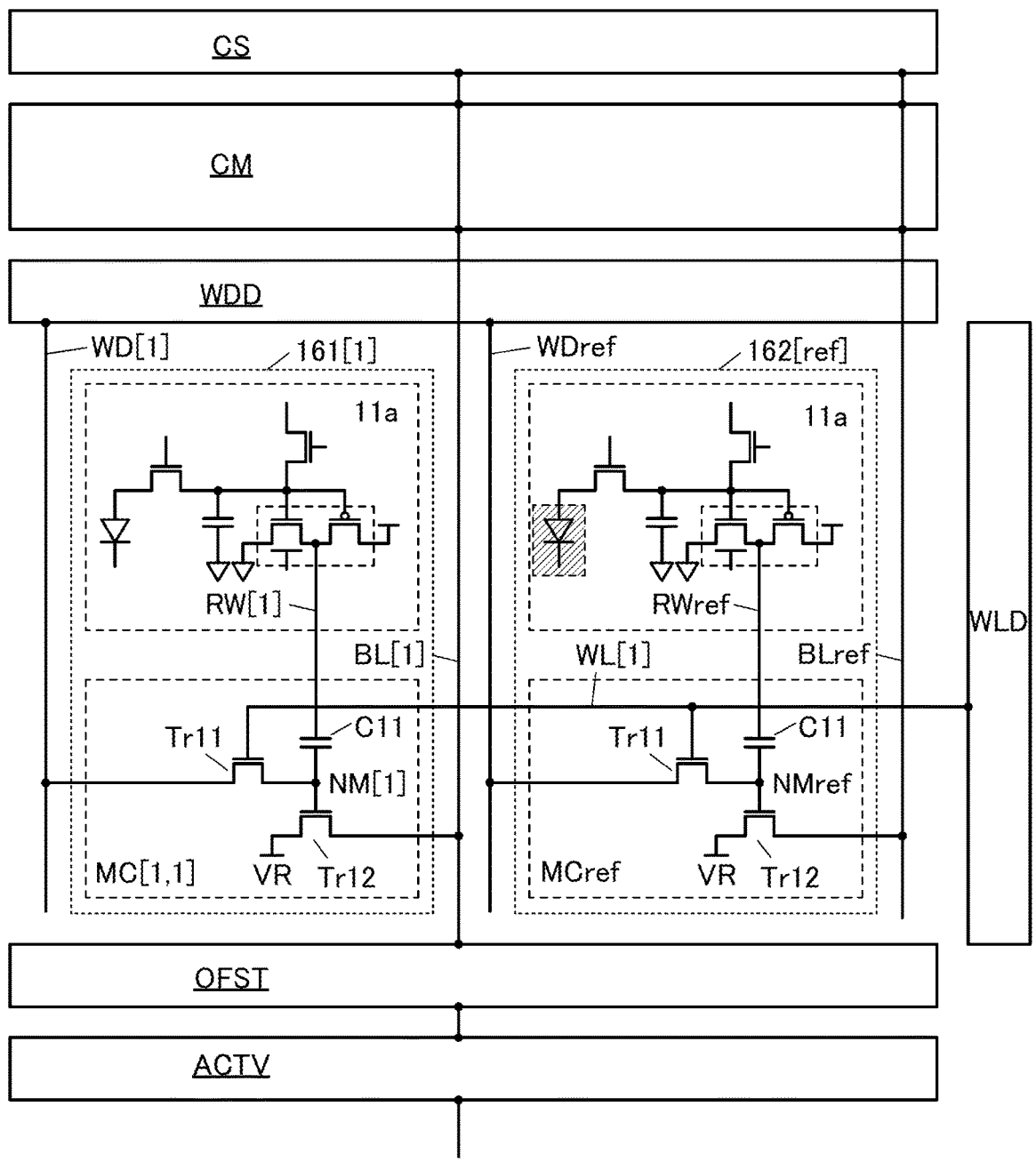
FIG. 24 A diagram illustrating a configuration example of a semiconductor device.

The entire structure for executing the product-sum operation processing can be a structure in which the circuit CLD in the structure of the semiconductor device MAC illustrated in FIG. 19 is replaced by the pixel 11a as illustrated in FIG. 24. Note that FIG. 24 illustrates the minimum necessary components: a pixel 161[1] subjected to the operation and a reference pixel 162[ref]. There is no limitation on the number of the pixels 161 subjected to the operation, and the pixels may be arranged in a matrix. The reference pixels 162, the number of which is the same as that of rows of the pixels 161, are provided in any column. The current source circuit CS, the current mirror circuit CM, the circuit WDD, the circuit WLD, the offset circuit OFST, and the activation function circuit ACTV may be provided for the plurality of pixels 161.

The reference pixel 162[ref] can have basically the same structure as the pixel 161; for the generation of reference data, the photoelectric conversion element is preferably operated in a dark state. Thus, a light-blocking film is preferably provided at least in the vicinity of the photoelectric conversion element included in the reference pixel 162[ref].

Figure 25A:
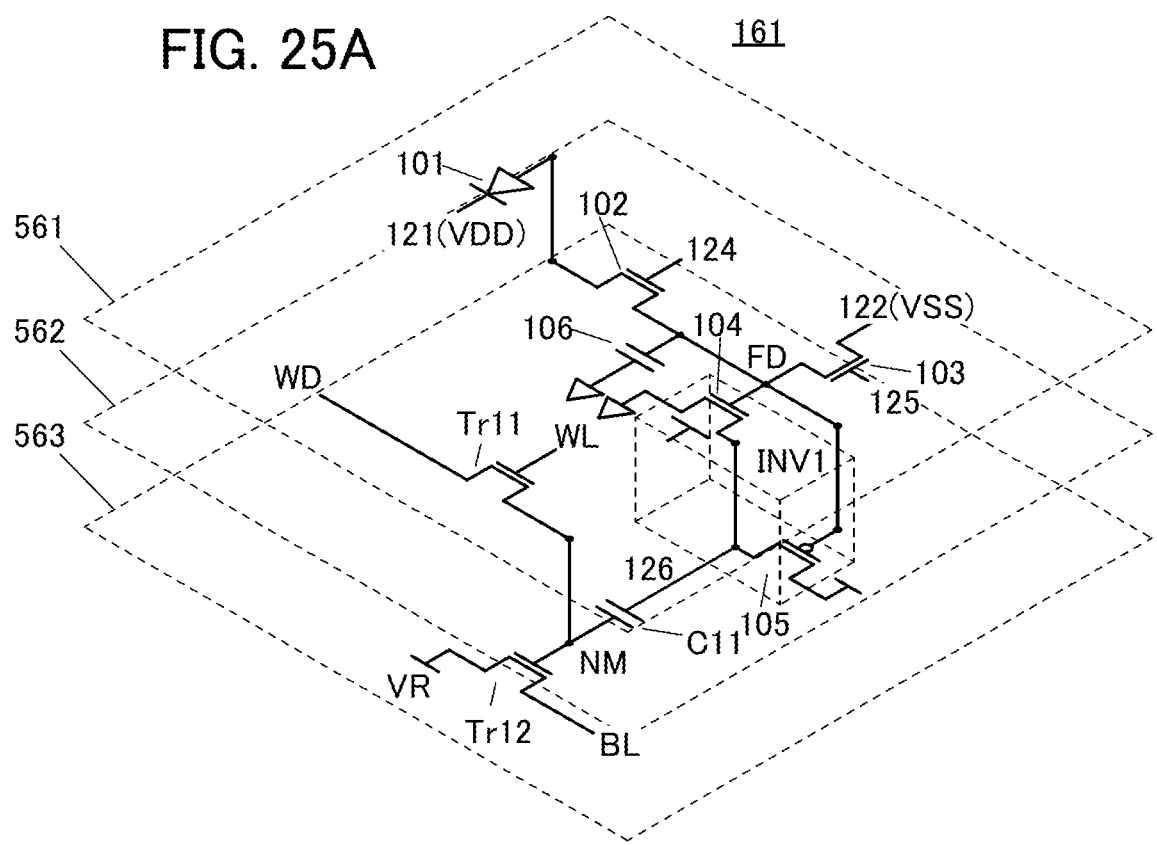
FIGS. 25A and 25B Diagrams each illustrating connection between a pixel and a memory cell in an imaging device.

Si transistors, OS transistors, and a photoelectric conversion element which are included in the pixel 161 can be formed in layers 563, 562, and 561, respectively, to be stacked as illustrated in FIG. 25(A). Note that although FIG. 25(A) illustrates a circuit diagram for simplicity, the photoelectric conversion element, the Si transistors, and the OS transistors can actually be formed to have an overlap region. Consequently, the area of the pixel can be small. Furthermore, the photoelectric conversion element can overlap with substantially the entire pixel region, and the aperture ratio of a light-receiving portion can be increased.

Figure 25B:
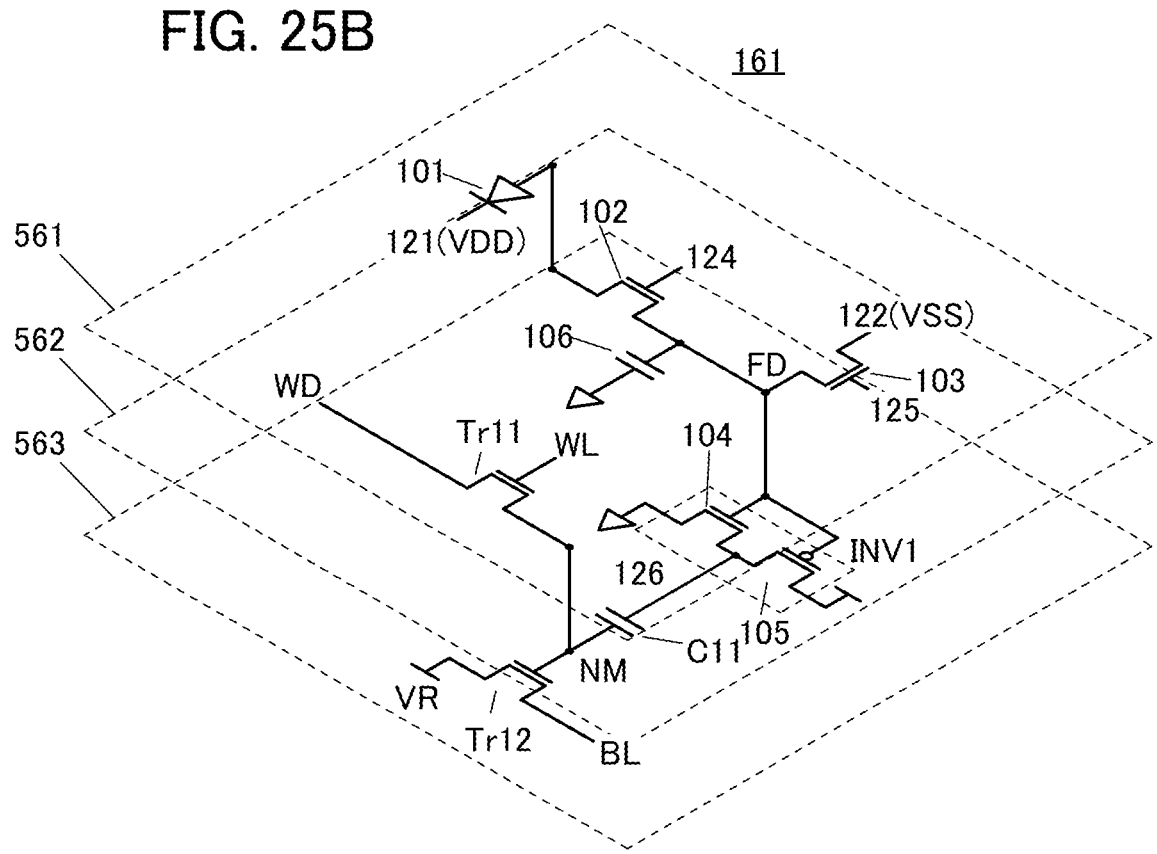

Although FIG. 25(A) illustrates an example in which the transistor 104 of the inverter circuit INV1 is formed using an OS transistor, the transistor 104 may be formed using a Si transistor as illustrated in FIG. 25(B). Alternatively, all n-channel transistors included in the pixel 161 may be formed using OS transistors and provided in the layer 562. The capacitors 106 and C11 can be provided in either of the layer 563 and the layer 562.

Since both the pixel 11a and the memory cell 20 can be formed using OS transistors and Si transistors in combination as described above, the manufacturing steps are not increased.

Data output from the combination of the above-described imaging device and neural network can be used for inference in image analysis. However, since the pixel in the imaging device generates various noise, the value of data might be greatly changed by noise if product-sum operations are repeated even when the noise is small, which results in an adverse effect at the time of inference. Learning using teaching data in which the noise is faithfully reproduced leads to accurate inference; however, it is hard to obtain such teaching data as long as the data is generated by using a real machine, leading to inaccurate inference.

Meanwhile, in the case of number determination, character determination, and the like, each pixel only needs to determine two values, white or black. In that case, even when the pixel generates noise, an existing binary image which does not include noise can be used as teaching data as long as it does not affect black and white determination (two-value determination). Accordingly, the use of the pixel of one embodiment of the present invention leads to accurate inference.

This embodiment can be combined with the description of other embodiments as appropriate.

Embodiment 3

In this embodiment, a configuration example and the like of an imaging device of one embodiment of the present invention will be described.

Figure 26A:
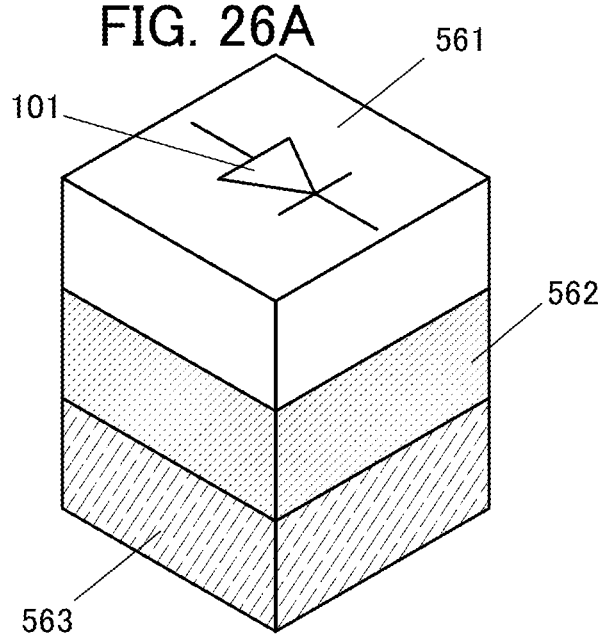
FIGS. 26A to 26C Diagrams illustrating structures of a pixel in an imaging device.

FIG. 26(A) shows an example of a structure of a pixel included in an imaging device. A pixel shown in FIG. 26(A) has a stacked-layer structure of the layer 561, the layer 562, and the layer 563.

The layer 561 includes the photoelectric conversion element 101. The photoelectric conversion element 101 can have a stacked-layer structure of a layer 565a, a layer 565b, and a layer 565c as shown in FIG. 26(B).

Figure 26B:
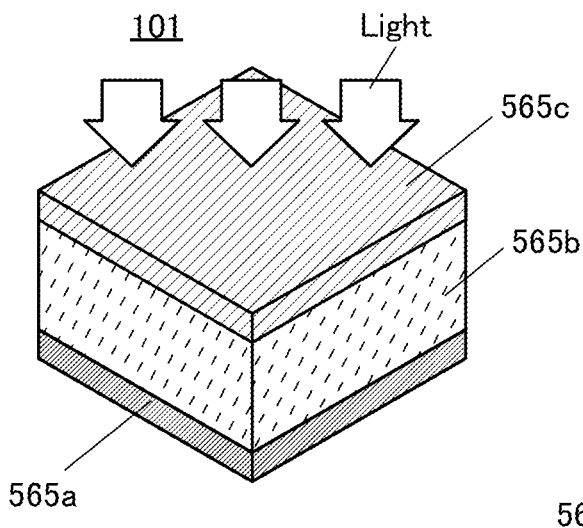

The photoelectric conversion element 101 shown in FIG. 26(B) is a pn-junction photodiode; for example, a p$^+$-type semiconductor can be used for the layer 565a, an n-type semiconductor can be used for the layer 565b, and an n$^+$-type semiconductor can be used for the layer 565c. Alternatively, an n$^+$-type semiconductor may be used for the layer 565a, a p-type semiconductor may be used for the layer 565b, and a p$^+$-type semiconductor may be used for the layer 565c. Alternatively, a pin-junction photodiode in which the layer 565b is an i-type semiconductor may be used.

The pn-junction photodiode or the pin-junction photodiode can be formed using single crystal silicon. The pin-junction photodiode can also be formed using a thin film of amorphous silicon, microcrystalline silicon, polycrystalline silicon, or the like.

Figure 26C:
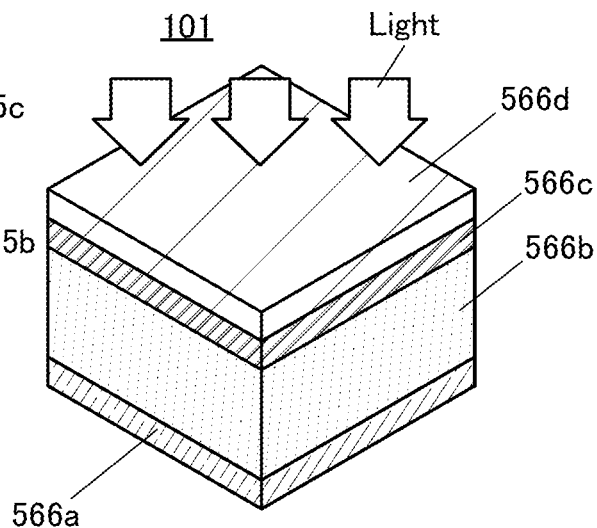

The photoelectric conversion element 101 included in the layer 561 may be a stacked layer of a layer 566a, a layer 566b, a layer 566c, and a layer 566d, as shown in FIG. 26(C). The photoelectric conversion element 101 shown in FIG. 26(C) is an example of an avalanche photodiode, and the layer 566a and the layer 566d correspond to electrodes and the layers 566b and 566c correspond to a photoelectric conversion portion.

The layer 566a is preferably a low-resistance metal layer or the like. For example, aluminum, titanium, tungsten, tantalum, silver, or a stacked layer thereof can be used.

A conductive layer having a high light-transmitting property with respect to visible light is preferably used for the layer 566d. For example, an indium oxide, a tin oxide, a zinc oxide, an indium tin oxide, a gallium zinc oxide, an indium gallium zinc oxide, graphene, or the like can be used. Note that a structure in which the layer 566d is omitted can be also employed.

A structure of a pn-junction photodiode containing a selenium-based material in a photoelectric conversion layer can be used for the layers 566b and 566c of the photoelectric conversion portion, for example. A selenium-based material, which is a p-type semiconductor, is preferably used for the layer 566b, and a gallium oxide or the like, which is an n-type semiconductor, is preferably used for the layer 566c.

A photoelectric conversion element containing a selenium-based material has characteristics of high external quantum efficiency with respect to visible light. In the photoelectric conversion element, electrons are greatly amplified with respect to the amount of incident light by utilizing the avalanche multiplication. A selenium-based material has a high light-absorption coefficient and thus has advantages in production; for example, a photoelectric conversion layer can be formed using a thin film. A thin film of a selenium-based material can be formed by a vacuum evaporation method, a sputtering method, or the like.

As a selenium-based material, crystalline selenium such as single crystal selenium or polycrystalline selenium, amorphous selenium, a compound of copper, indium, and selenium (CIS), a compound of copper, indium, gallium, and selenium (CIGS), or the like can be used.

An n-type semiconductor is preferably formed using a material with a wide band gap and a light-transmitting property with respect to visible light. For example, a zinc oxide, a gallium oxide, an indium oxide, a tin oxide, or a mixed oxide thereof can be used. In addition, these materials have a function of a hole-injection blocking layer, so that a dark current can be decreased.

The layer 562 can include an OS transistor. Specifically, the transistors 102, 103, and 104 or the like in the pixels 11a to 17b can be provided in the layer 562.

As a semiconductor material used for the OS transistor, a metal oxide whose energy gap is greater than or equal to 2 eV, preferably greater than or equal to 2.5 eV, further preferably greater than or equal to 3 eV can be used. A typical example thereof is an oxide semiconductor containing indium, and for example, a CAC-OS described later or the like can be used.

The semiconductor layer can be, for example, a film represented by an In-M-Zn-based oxide that contains indium, zinc, and M (a metal such as aluminum, titanium, gallium, germanium, yttrium, zirconium, lanthanum, cerium, tin, neodymium, or hafnium).

In the case where the oxide semiconductor contained in the semiconductor layer is an In-M-Zn-based oxide, it is preferable that the atomic ratio of metal elements of a sputtering target used for forming a film of the In-M-Zn oxide satisfy In M and Zn M. The atomic ratio of metal elements in such a sputtering target is preferably, for example, InM:Zn=1:1:1, In:M:Zn=1:1:1.2, In:M:Zn=3:1:2, InM:Zn=4:2:3, In:M:Zn=4:2:4.1, In:M:Zn=5:1:6, In:M:Zn=5:1:7, or In:M:Zn=5:1:8. Note that the atomic ratio in the formed semiconductor layer varies from the above atomic ratios of metal elements of the sputtering targets in a range of ±40%.

An oxide semiconductor with low carrier density is used as the semiconductor layer. For example, for the semiconductor layer, an oxide semiconductor whose carrier density is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$, even further preferably lower than $1\times10^{10}/cm^3$, and higher than or equal to $1\times10^{-9}/cm^3$ can be used. Such an oxide semiconductor is referred to as a highly purified intrinsic or substantially highly purified intrinsic oxide semiconductor. The oxide semiconductor has a low impurity concentration and a low density of defect states and can thus be referred to as an oxide semiconductor having stable characteristics.

However, the composition is not limited to those described above, and a material having the appropriate composition may be used depending on required semiconductor characteristics and electrical characteristics of the transistor (e.g., field-effect mobility and threshold voltage). To obtain the required semiconductor characteristics of the transistor, it is preferable that the carrier density, the impurity concentration, the defect density, the atomic ratio between a metal element and oxygen, the interatomic distance, the density, and the like of the semiconductor layer be set to appropriate values.

When silicon or carbon which is one of elements belonging to Group 14 is contained in the oxide semiconductor contained in the semiconductor layer, oxygen vacancies are increased, and the semiconductor layer becomes n-type. Thus, the concentration of silicon or carbon (the concentration obtained by secondary ion mass spectrometry) in the semiconductor layer is set to lower than or equal to $2\times10^{18}$ atoms/$cm^3$, preferably lower than or equal to $2\times10^{17}$ atoms/$cm^3$.

Alkali metal and alkaline earth metal might generate carriers when bonded to an oxide semiconductor, in which case the off-state current of the transistor might be increased. Therefore, the concentration of alkali metal or alkaline earth metal in the semiconductor layer (the concentration obtained by secondary ion mass spectrometry) is set to lower than or equal to $1\times10^{18}$ atoms/$cm^3$, preferably lower than or equal to $2\times10^{16}$ atoms/$cm^3$.

When nitrogen is contained in the oxide semiconductor contained in the semiconductor layer, electrons serving as carriers are generated and the carrier density increases, so that the semiconductor layer easily becomes n-type. As a result, a transistor using an oxide semiconductor that contains nitrogen is likely to be normally on. Hence, the nitrogen concentration (the concentration obtained by secondary ion mass spectrometry) in the semiconductor layer is preferably set to lower than or equal to $5\times10^{18}$ atoms/$cm^3$.

The semiconductor layer may have a non-single-crystal structure, for example. Examples of the non-single-crystal structure include CAAC-OS (C-Axis Aligned Crystalline Oxide Semiconductor, or C-Axis Aligned and A-B-plane Anchored Crystalline Oxide Semiconductor) including a c-axis aligned crystal, a polycrystalline structure, a microcrystalline structure, and an amorphous structure. Among the non-single-crystal structures, the amorphous structure has the highest density of defect states, whereas the CAAC-OS has the lowest density of defect states.

An oxide semiconductor film having an amorphous structure has disordered atomic arrangement and no crystalline component, for example. Alternatively, an oxide film having an amorphous structure has, for example, a completely amorphous structure and no crystal part.

Note that the semiconductor layer may be a mixed film including two or more of a region having an amorphous structure, a region having a microcrystalline structure, a region having a polycrystalline structure, a CAAC-OS region, and a region having a single crystal structure. The mixed film has, for example, a single-layer structure or a stacked-layer structure including two or more of the above regions in some cases.

The composition of a CAC (Cloud-Aligned Composite)-OS, which is one embodiment of a non-single-crystal semiconductor layer, will be described below.

A CAC-OS refers to one composition of a material in which elements constituting an oxide semiconductor are unevenly distributed with a size greater than or equal to 0.5 nm and less than or equal to 10 nm, preferably greater than or equal to 1 nm and less than or equal to 2 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 2 nm, or a similar size in an oxide semiconductor is hereinafter referred to as a mosaic pattern or a patch-like pattern.

Note that an oxide semiconductor preferably contains at least indium. It is particularly preferable that indium and zinc are contained. Moreover, in addition to these, one kind or a plurality of kinds selected from aluminum, gallium, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like may be contained.

For instance, a CAC-OS in an In—Ga—Zn oxide (an In—Ga—Zn oxide in the CAC-OS may be particularly referred to as CAC-IGZO) has a composition in which materials are separated into indium oxide (hereinafter $InO_{X1}$ (X1 is a real number greater than 0)) or indium zinc oxide (hereinafter $In_{X2}Zn_{Y2}O_{Z2}$ (X2, Y2, and Z2 are real numbers greater than 0)) and gallium oxide (hereinafter $GaO_{X3}$ (X3 is a real number greater than 0)) or gallium zinc oxide (hereinafter $Ga_{X4}Zn_{Y4}O_{Z4}$ (X4, Y4, and Z4 are real numbers greater than 0)), for example, so that a mosaic pattern is formed, and mosaic-like $InO_{X1}$ or $In_{X2}Zn_{Y2}O_{Z2}$ is evenly distributed in the film (which is hereinafter also referred to as cloud-like).

That is, the CAC-OS is a composite oxide semiconductor having a composition in which a region including $GaO_{X3}$ as a main component and a region including $In_{X2}Zn_{Y2}O_{Z2}$ or $InO_{X1}$ as a main component are mixed. Note that in this specification, for example, when the atomic ratio of In to an element M in a first region is larger than the atomic ratio of In to the element M in a second region, the first region is regarded as having a higher In concentration than the second region.

Note that IGZO is a commonly known name and sometimes refers to one compound formed of In, Ga, Zn, and O. A typical example is a crystalline compound represented by $InGaO_3(ZnO)_{m1}$ (m1 is a natural number) or $In_{(1+x0)}Ga_{(1-x0)}O_3(ZnO)_{m0}$ ($-1 \leq x0 \leq 1$; m0 is a given number).

The above crystalline compound has a single crystal structure, a polycrystalline structure, or a CAAC structure. Note that the CAAC structure is a crystal structure in which a plurality of IGZO nanocrystals have c-axis alignment and are connected in the a-b plane without alignment.

On the other hand, the CAC-OS relates to the material composition of an oxide semiconductor. The CAC-OS refers to a composition in which, in the material composition containing In, Ga, Zn, and O, some regions that include Ga as a main component and are observed as nanoparticles and some regions that include In as a main component and are observed as nanoparticles are randomly dispersed in a mosaic pattern. Therefore, the crystal structure is a secondary element for the CAC-OS.

Note that the CAC-OS is regarded as not including a stacked-layer structure of two or more kinds of films with different compositions. For example, a two-layer structure of a film including In as a main component and a film including Ga as a main component is not included.

Note that a clear boundary cannot sometimes be observed between the region including $GaO_{X3}$ as a main component and the region including $In_{X2}Zn_{Y2}O_{Z2}$ or $InO_{X1}$ as a main component.

Note that in the case where one kind or a plurality of kinds selected from aluminum, yttrium, copper, vanadium, beryllium, boron, silicon, titanium, iron, nickel, germanium, zirconium, molybdenum, lanthanum, cerium, neodymium, hafnium, tantalum, tungsten, magnesium, and the like are contained instead of gallium, the CAC-OS refers to a composition in which some regions that include the metal element(s) as a main component and are observed as nanoparticles and some regions that include In as a main component and are observed as nanoparticles are randomly dispersed in a mosaic pattern.

The CAC-OS can be formed by a sputtering method under a condition where a substrate is not heated intentionally, for example. Moreover, in the case of forming the CAC-OS by a sputtering method, any one or more selected from an inert gas (typically, argon), an oxygen gas, and a nitrogen gas are used as a deposition gas. Furthermore, the ratio of the flow rate of an oxygen gas to the total flow rate of the deposition gas at the time of deposition is preferably as low as possible, and for example, the ratio of the flow rate of the oxygen gas is preferably higher than or equal to 0% and lower than 30%, further preferably higher than or equal to 0% and lower than or equal to 10%.

The CAC-OS is characterized in that no clear peak is observed in measurement using θ/2θ scan by an Out-of-plane method, which is one of X-ray diffraction (XRD) measurement methods. That is, it is found from the X-ray diffraction that no alignment in the a-b plane direction and the c-axis direction is observed in a measured region.

In addition, in an electron diffraction pattern of the CAC-OS which is obtained by irradiation with an electron beam with a probe diameter of 1 nm (also referred to as a nanobeam electron beam), a ring-like high-luminance region and a plurality of bright spots in the ring region are observed. It is therefore found from the electron diffraction pattern that the crystal structure of the CAC-OS includes an nc (nanocrystal) structure with no alignment in the plan-view direction and the cross-sectional direction.

Moreover, for example, it can be confirmed by EDX mapping obtained using energy dispersive X-ray spectroscopy (EDX) that the CAC-OS in the In—Ga—Zn oxide has a composition in which regions including $GaO_{X3}$ as a main component and regions including $In_{X2}Zn_{Y2}O_{Z2}$ or $InO_{X1}$ as a main component are unevenly distributed and mixed.

The CAC-OS has a composition different from that of an IGZO compound in which the metal elements are evenly distributed, and has characteristics different from those of the IGZO compound. That is, the CAC-OS has a composition in which regions including $GaO_{X3}$ or the like as a main component and regions including $In_{X2}Zn_{Y2}O_{Z2}$ or $InO_{X1}$ as a main component are phase-separated from each other and form a mosaic pattern.

Here, a region including $In_{X2}Zn_{Y2}O_{Z2}$ or $InO_{X1}$ as a main component is a region whose conductivity is higher than that of a region including $GaO_{X3}$ or the like as a main component. In other words, when carriers flow through the regions including $In_{X2}Zn_{Y2}O_{Z2}$ or $InO_{X1}$ as a main component, the conductivity of an oxide semiconductor is exhibited. Accordingly, when the regions including $In_{X2}Zn_{Y2}O_{Z2}$ or $InO_{X1}$ as a main component are distributed in an oxide semiconductor like a cloud, high field-effect mobility (μ) can be achieved.

By contrast, a region including $GaO_{X3}$ or the like as a main component is a region whose insulating property is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, leakage current can be suppressed and a favorable switching operation can be achieved.

Accordingly, when the CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$) and high field-effect mobility (μ) can be achieved.

A semiconductor element using the CAC-OS has high reliability. Thus, the CAC-OS is suitably used as a constituent material of a variety of semiconductor devices.

For the layer 563, for example, a silicon substrate can be used. The silicon substrate includes a Si transistor or the like. With the use of the Si transistor, as well as a pixel circuit, a circuit for driving the pixel circuit, a circuit for reading an image signal, an image processing circuit, or the like can be provided. Specifically, the transistor 105 and other p-channel transistors included in the pixels 11a to 17b and the transistor Tr12 and the like included in the memory cell MC can be provided in the layer 563. Furthermore, some or all of the components, such as transistors, included in the current source circuit CS, the current mirror circuit CM, the circuit WDD, the circuit WLD, the offset circuit OFST, the activation function circuit ACTV, and the like can be provided in the layer 563.

With such a structure, components in the pixel circuit and peripheral circuits can be dispersed in a plurality of layers, and can be provided such that the components overlap with each other or the component overlap with the peripheral circuit, resulting in a reduction in the area of the imaging device.

Figure 27A:
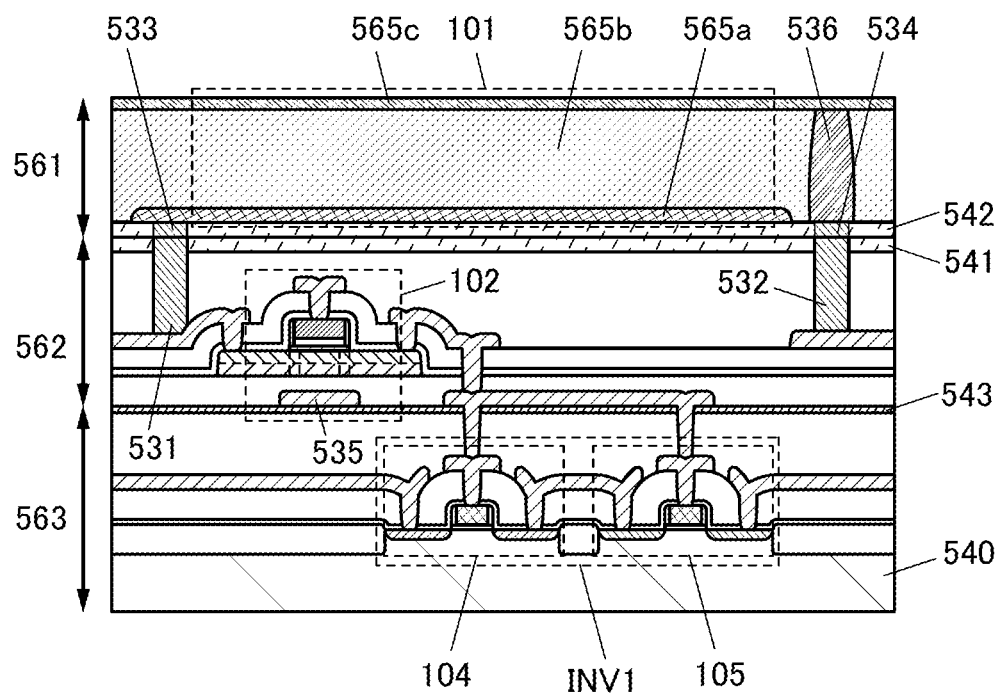
FIGS. 27A and 27B Diagrams illustrating structures of a pixel in an imaging device.

FIG. 27(A) is a view illustrating an example of a cross section of the pixel shown in FIG. 26(A). The layer 561 includes a pn-junction photodiode which uses silicon in its photoelectric conversion layer, as the photoelectric conversion element 101. The layer 562 includes an OS transistor and FIG. 27(A) illustrates the transistor 102 of the pixel 11a, as an example. The layer 563 includes a Si transistor, and FIG. 27(A) illustrates the n-channel transistor 104 and the p-channel transistor 105 included in the inverter circuit INV1 in the pixel 11a, as an example.

In the photoelectric conversion element 101, the layer 565a can be a $p^+$-type region, the layer 565b can be an n-type region, and the layer 565c can be an $n^+$-type region. The layer 565b is provided with a region 536 for connecting a power supply line to the layer 565c. For example, the region 536 can be a $p^+$-type region.

Figure 28A:
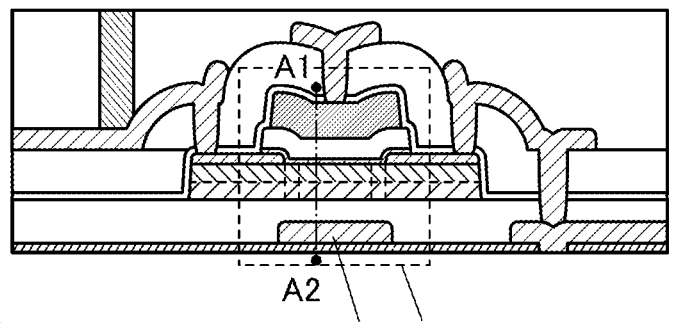
FIGS. 28A to 28E Diagrams illustrating structures of a pixel in an imaging device.

Although the OS transistors having a self-aligned structure are shown in FIG. 27(A), top-gate transistors having a non-self-aligned structure may be employed as shown in FIG. 28(A).

Figure 28B:
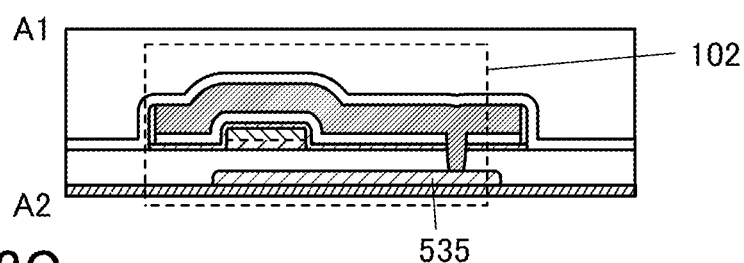

Although a structure in which the transistor 102 includes a back gate 535 (second gate) is shown, a structure without the back gate 535 may be employed. As shown in FIG. 28(B), the back gate 535 might be electrically connected to a front gate (first gate) of the transistor, which is provided to face the back gate. Alternatively, different fixed potentials may be supplied to the back gate 535 and the front gate.

Figure 28C:
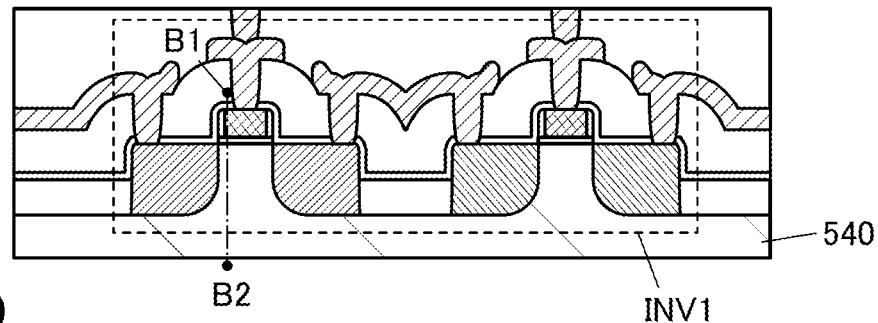
Figure 28D:
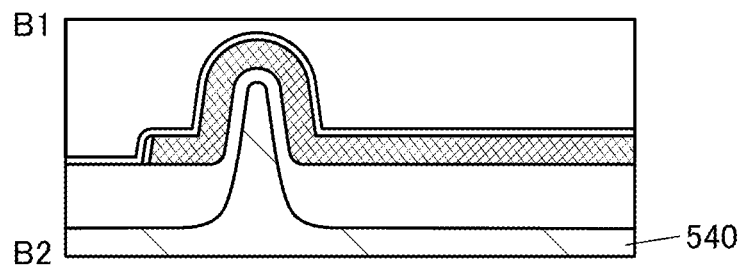

Although the Si transistor shown in FIG. 27(A) is of a planar type including a channel formation region in the silicon substrate 540, the Si transistor may include a fin semiconductor layer in the silicon substrate 540 as shown in FIGS. 28(C) and 28(D). FIG. 28(C) corresponds to a cross section in the channel length direction, and FIG. 28(D) corresponds to a cross section in the channel width direction.

Figure 28E:
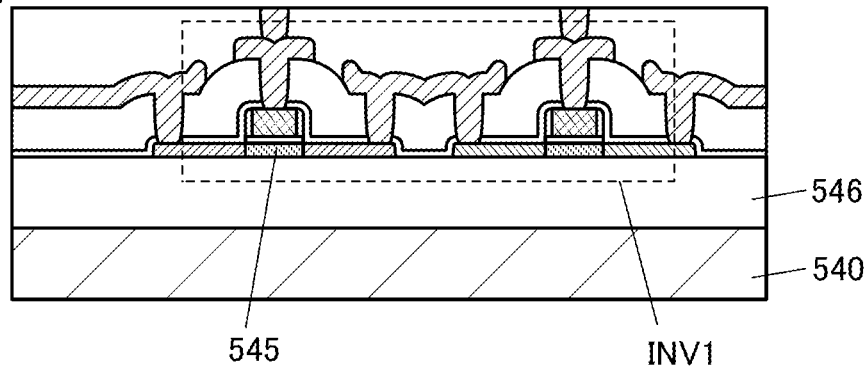

Alternatively, as shown in FIG. 28(E), a transistor including a semiconductor layer 545 of a silicon thin film may be used. The semiconductor layer 545 can be single crystal silicon (SOI (Silicon on Insulator) formed on an insulating layer 546 on the silicon substrate 540, for example.

An insulating layer 543 that has a function of inhibiting diffusion of hydrogen is provided between a region where an OS transistor is formed and a region where a Si transistor is formed. Hydrogen in the insulating layer provided in the vicinity of the channel formation region of the Si transistor terminates a dangling bond of silicon. Meanwhile, hydrogen in the insulating layer provided in the vicinity of the channel formation region of the OS transistor is a factor of generating a carrier in the oxide semiconductor layer.

Hydrogen is confined in one layer using the insulating layer 543, whereby the reliability of the Si transistor can be improved. Furthermore, diffusion of hydrogen from the one layer to the other layer is inhibited, so that the reliability of the OS transistor can also be improved.

For the insulating layer 543, aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like can be used, for example.

Here, FIG. 27(A) shows an example of a structure in which electrical connection between components included in the layer 561 and components included in the layer 562 is obtained by a bonding technique.

An insulating layer 542, a conductive layer 533, and a conductive layer 534 are provided in the layer 561. The conductive layer 533 and the conductive layer 534 each include a region embedded in the insulating layer 542. The conductive layer 533 is electrically connected to the layer 565a. The conductive layer 534 is electrically connected to the region 536. Furthermore, the surfaces of the insulating layer 542, the conductive layer 533, and the conductive layer 534 are planarized to have the same level.

An insulating layer 541, a conductive layer 531, and a conductive layer 532 are provided in the layer 562. The conductive layer 531 and the conductive layer 532 each include a region embedded in the insulating layer 541. The conductive layer 531 is electrically connected to a power supply line. The conductive layer 532 is electrically connected to the source or the drain of the transistor 102. Furthermore, the surfaces of the insulating layer 541, the conductive layer 531, and the conductive layer 532 are planarized to have the same level.

Here, a main component of the conductive layer 531 and a main component of the conductive layer 533 are preferably the same metal element. A main component of the conductive layer 532 and a main component of the conductive layer 534 are preferably the same metal element. Furthermore, it is preferable that the insulating layer 541 and the insulating layer 542 be formed of the same component.

For example, for the conductive layers 531, 532, 533, and 534, Cu, Al, Sn, Zn, W, Ag, Pt, Au, or the like can be used. Preferably, Cu, Al, W, or Au is used for easy bonding. In addition, for the insulating layers 541 and 542, silicon oxide, silicon oxynitride, silicon nitride oxide, silicon nitride, titanium nitride, or the like can be used.

That is, the same metal material selected from the above-described metal elements is preferably used for the combination of the conductive layer 531 and the conductive layer 533, and the same metal material selected from the above-described metal elements is preferably used for the combination of the conductive layer 532 and the conductive layer 534. Furthermore, the same insulating material selected from the above-described insulating materials is preferably used for the insulating layer 541 and the insulating layer 542. With this structure, bonding where a boundary between the layer 561 and the layer 562 is a bonding position can be performed.

This bonding enables an electric connection between the conductive layer 531 and the conductive layer 533 and between the conductive layer 532 and the conductive layer 534. In addition, connection between the insulating layer 541 and the insulating layer 542 with mechanical strength can be obtained.

For bonding the metal layers to each other, a surface activated bonding method in which an oxide film, a layer adsorbing impurities, and the like on the surface are removed by sputtering or the like and the cleaned and activated surfaces are brought into contact to be bonded to each other can be used. Alternatively, a diffusion bonding method in which the surfaces of the metal layers are bonded to each other by using temperature and pressure together can be used, for example. Both methods cause bonding at an atomic level, and therefore not only electrically but also mechanically excellent bonding can be obtained.

Furthermore, for bonding the insulating layers to each other, a hydrophilic bonding method or the like can be used; in the method, after high planarity is obtained by polishing or the like, the surfaces of the insulating layers subjected to hydrophilicity treatment with oxygen plasma or the like are arranged in contact with and bonded to each other temporarily, and then dehydrated by heat treatment to perform final bonding. The hydrophilic bonding method can also cause bonding at an atomic level; thus, mechanically excellent bonding can be obtained.

When the layer 561 and the layer 562 are bonded to each other, the insulating layers and the metal layers coexist on their bonding surfaces; therefore, the surface activated bonding method and the hydrophilic bonding method are performed in combination, for example.

For example, a method can be used in which the surfaces are made clean after polishing, the surfaces of the metal layers are subjected to antioxidant treatment and hydrophilicity treatment, and then bonding is performed. Furthermore, hydrophilicity treatment may be performed on the surfaces of the metal layers being hardly oxidizable metal such as Au. Note that a bonding method other than the above-mentioned methods may be used.

Figure 27B:
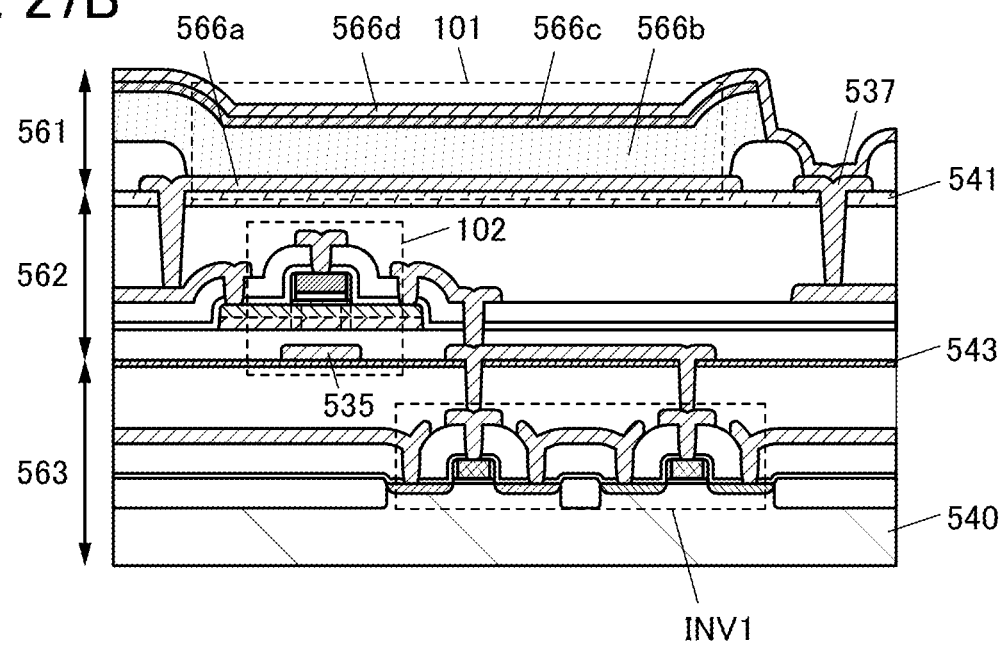

FIG. 27(B) is a cross-sectional view in the case where a pn-junction photodiode in which a selenium-based material is used for a photoelectric conversion layer is used for the layer 561 of the pixel shown in FIG. 26(A). A layer 566a is included as one electrode, layers 566b and 566c are included as a photoelectric conversion layer, and a layer 566d is included as the other electrode.

In that case, the layer 561 can be directly formed on the layer 562. The layer 566a is electrically connected to the source or the drain of the transistor 102. The layer 566d is electrically connected to the power supply line through the conductive layer 537.

Figure 29A:
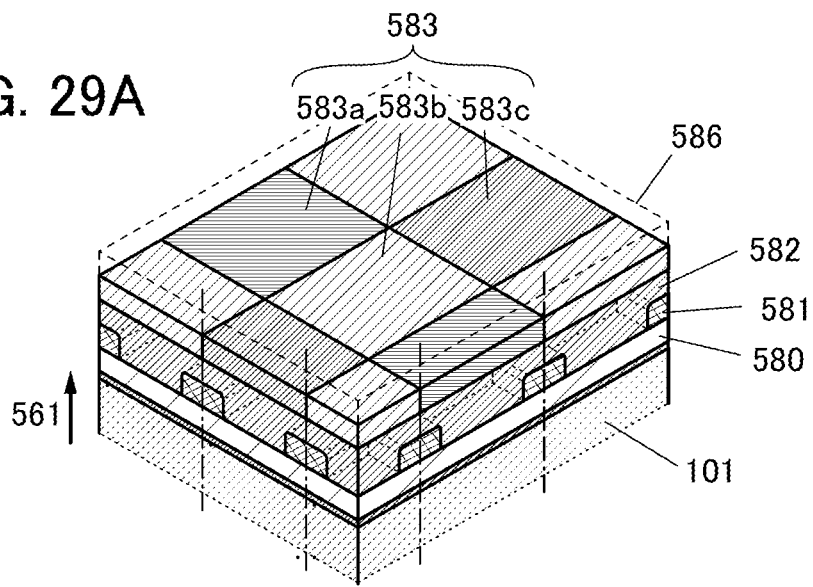
FIGS. 29A to 29C Diagrams illustrating structures of a pixel in an imaging device.

FIG. 29(A) is a perspective view showing an example in which a color filter and the like are added to a pixel of the imaging device of one embodiment of the present invention. The perspective view also shows cross sections of a plurality of pixels. An insulating layer 580 is formed over the layer 561 where the photoelectric conversion element 101 is formed. As the insulating layer 580, a silicon oxide film with a high light-transmitting property with respect to visible light can be used. In addition, a silicon nitride film may be stacked as a passivation film. A dielectric film of hafnium oxide or the like may be stacked as an anti-reflection film.

A light-blocking layer 581 may be formed over the insulating layer 580. The light-blocking layer 581 has a function of inhibiting color mixing of light passing through the upper color filter. As the light-blocking layer 581, a metal layer of aluminum, tungsten, or the like can be used. The metal layer and a dielectric film having a function of an anti-reflection film may be stacked.

An organic resin layer 582 can be provided as a planarization film over the insulating layer 580 and the light-blocking layer 581. A color filter 583 (color filters 583a, 583b, and 583c) is formed in each pixel. Color images can be obtained, for example, when colors of R (red), G (green), B (blue), Y (yellow), C (cyan), M (magenta), and the like are assigned to the color filters 583a, 583b, and 583c.

An insulating layer 586 having a light-transmitting property with respect to visible light can be provided over the color filter 583, for example.

Figure 29B:
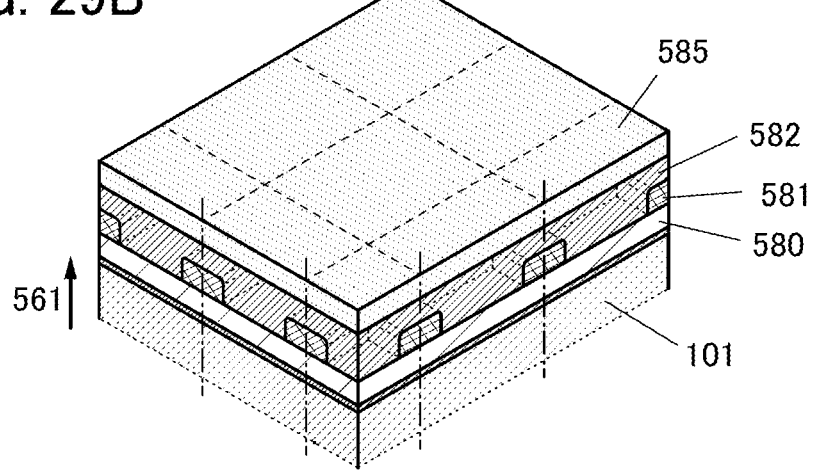

As shown in FIG. 29(B), an optical conversion layer 585 may be used instead of the color filter 583. Such a structure enables the imaging device to obtain images in various wavelength regions.

For example, when a filter that blocks light having a wavelength shorter than or equal to that of visible light is used as the optical conversion layer 585, an infrared imaging device can be obtained. When a filter that blocks light having a wavelength shorter than or equal to that of near infrared light is used as the optical conversion layer 585, a far-infrared imaging device can be obtained. When a filter that blocks light having a wavelength longer than or equal to that of visible light is used as the optical conversion layer 585, an ultraviolet imaging device can be obtained.

Alternatively, a color filter for visible light and a filter for infrared rays or ultraviolet rays may be combined. With such a structure, a feature obtained by combining different wavelength data can be detected.

Furthermore, when a scintillator is used as the optical conversion layer 585, an imaging device that obtains an image visualizing the intensity of radiation, which is used for an X-ray imaging device or the like, can be obtained. Radiation such as X-rays passes through an object and enters the scintillator, and then is converted into light (fluorescence) such as visible light or ultraviolet light owing to a photoluminescence phenomenon. Then, the photoelectric conversion element 101 detects the light to obtain image data. Furthermore, the imaging device having this structure may be used in a radiation detector or the like.

A scintillator contains a substance that, when irradiated with radiation such as X-rays or gamma-rays, absorbs energy of the radiation to emit visible light or ultraviolet light. For example, a resin or ceramics in which $Gd_2O_2S:Tb$, $Gd_2O_2S:Pr$, $Gd_2O_2S:Eu$, $BaFCl:Eu$, $NaI$, $CsI$, $CaF_2$, $BaF_2$, $CeF_3$, $LiF$, $LiI$, $ZnO$, or the like is dispersed can be used.

In the photoelectric conversion element 101 containing a selenium-based material, radiation such as X-rays can be directly converted into charge; thus, a structure that does not require a scintillator can be employed.

Figure 29C:
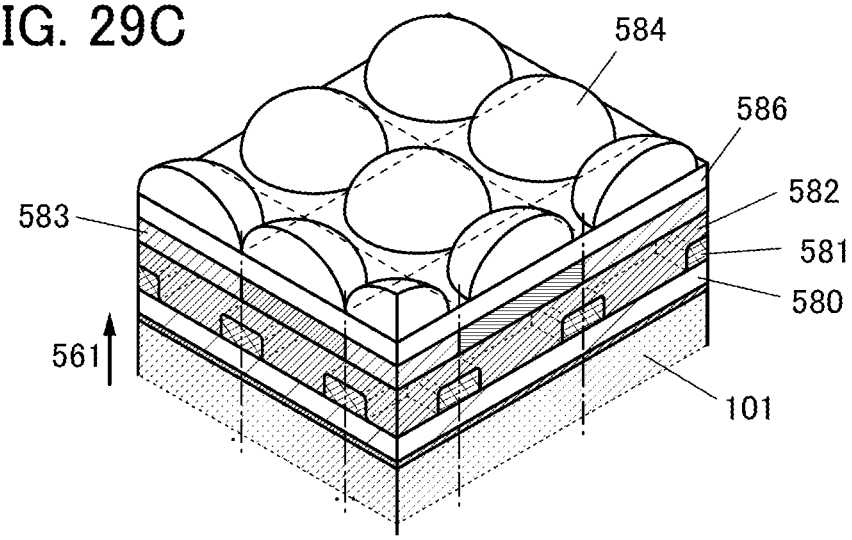

As shown in FIG. 29(C), a microlens array 584 may be provided over the color filter 583. Light penetrating lenses included in the microlens array 584 goes through the color filter 583 positioned thereunder to irradiate the photoelectric conversion element 101. The microlens array 584 may be provided over the optical conversion layer 585 shown in FIG. 29(B).

Examples of a package and a camera module in each of which an image sensor chip is placed will be described below. For the image sensor chip, the structure of the above imaging device can be used.

FIG. 30(A1) is an external perspective view of the top surface side of a package in which an image sensor chip is placed. The package includes a package substrate 610 to which an image sensor chip 650 is fixed, a cover glass 620, an adhesive 630 for bonding them, and the like.

FIG. 30(A2) is an external perspective view of the bottom surface side of the package. A BGA (Ball Grid Array) in which solder balls are used as bumps 640 on the bottom surface of the package is employed. Note that, without being limited to the BGA, an LGA (Land Grid Array), a PGA (Pin Grid Array), or the like may be employed.

FIG. 30(A3) is a perspective view of the package, in which parts of the cover glass 420 and the adhesive 630 are not illustrated. Electrode pads 660 are formed over the package substrate 410, and the electrode pads 660 and the bumps 640 are electrically connected to each other via through-holes. The electrode pads 660 are electrically connected to the image sensor chip 650 through wires 670.

FIG. 30(B1) is an external perspective view of the top surface side of a camera module in which an image sensor chip is placed in a package with a built-in lens. The camera module includes a package substrate 611 to which an image sensor chip 451 is fixed, a lens cover 621, a lens 635, and the like. Furthermore, an IC chip 690 having a function of a driver circuit, a signal conversion circuit, or the like of an imaging device is provided between the package substrate 611 and the image sensor chip 651; thus, the structure as an SiP (System in Package) is formed.

FIG. 30(B2) is an external perspective view of the bottom surface side of the camera module. A QFN (Quad Flat No-lead package) structure in which lands 641 for mounting are provided on the bottom surface and side surfaces of the package substrate 611 is employed. Note that this structure is only an example, and a QFP (Quad Flat Package) or the above-mentioned BGA may also be provided.

FIG. 30(B3) is a perspective view of the module, in which parts of the lens cover 621 and the lens 635 are not illustrated. The lands 641 are electrically connected to electrode pads 661, and the electrode pads 661 are electrically connected to the image sensor chip 451 or the IC chip 690 through wires 671.

The image sensor chip placed in a package having the above form can be easily mounted on a printed substrate or the like, and the image sensor chip can be incorporated into a variety of semiconductor devices and electronic devices.

This embodiment can be combined with the description of other embodiments as appropriate.

Embodiment 4

As electronic devices that can include the imaging device of one embodiment of the present invention, display devices, personal computers, image memory devices or image reproducing devices provided with storage media, mobile phones, game machines including portable game machines, portable data terminals, e-book readers, cameras such as video cameras and digital still cameras, goggle-type displays (head mounted displays), navigation systems, audio reproducing devices (car audio players, digital audio players, and the like), copiers, facsimiles, printers, multifunction printers, automated teller machines (ATM), vending machines, and the like are given. Specific examples of these electronic devices are illustrated in FIGS. 31(A) to 31(F).

Figure 31A:
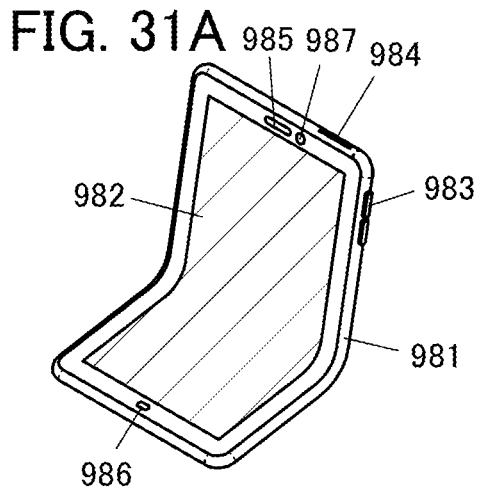
FIGS. 31A to 31F Diagrams illustrating electronic devices.

FIG. 31(A) is an example of a mobile phone, which includes a housing 981, a display portion 982, an operation button 983, an external connection port 984, a speaker 985, a microphone 986, a camera 987, and the like. The display portion 982 of the mobile phone includes a touch sensor. A variety of operations such as making a call and inputting text can be performed by touch on the display portion 982 with a finger, a stylus, or the like. The imaging device of one embodiment of the present invention can be included, as a component for capturing an image, in the mobile phone.

Figure 31B:
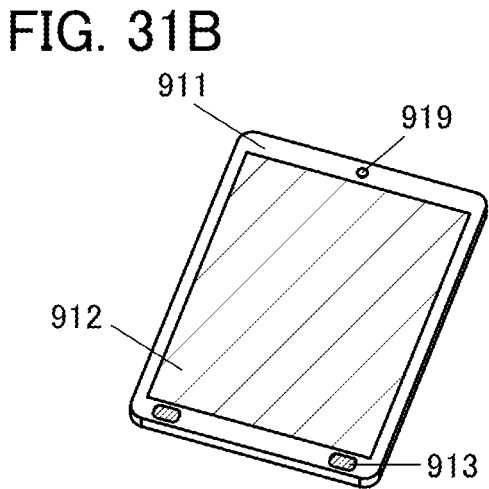

FIG. 31(B) is a portable data terminal, which includes a housing 911, a display portion 912, a speaker 913, a camera 919, and the like. A touch panel function of the display portion 912 enables input and output of information. Furthermore, a character or the like in an image that is captured by the camera 919 can be recognized and the character can be voice-output from the speaker 913. The imaging device of one embodiment of the present invention can be included, as a component for capturing an image, in the portable data terminal.

Figure 31C:
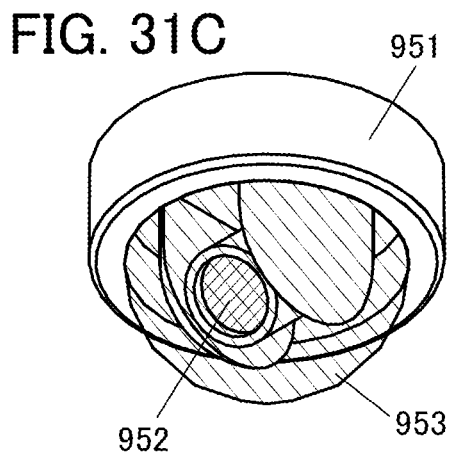

FIG. 31(C) is a surveillance camera, which includes a support base 951, a camera unit 952, a protection cover 953, and the like. By providing the camera unit 952 provided with a rotating mechanism and the like on a ceiling, an image of the entire circumstance can be taken. The imaging device of one embodiment of the present invention can be provided, as a component for capturing an image, in the camera unit. Note that a surveillance camera is a name in common use and does not limit the use thereof. A device that has a function of a surveillance camera can also be called a camera or a video camera, for example.

Figure 31D:
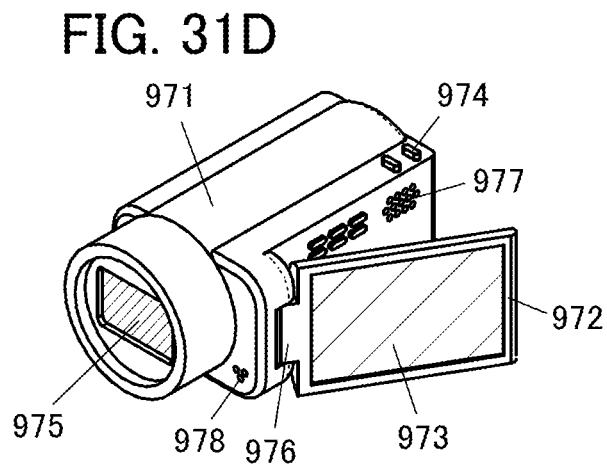

FIG. 31(D) is a video camera, which includes a first housing 971, a second housing 972, a display portion 973, an operation key 974, a lens 975, a connection portion 976, a speaker 977, a microphone 978, and the like. The operation key 974 and the lens 975 are provided on the first housing 971, and the display portion 973 is provided on the second housing 972. The imaging device of one embodiment of the present invention can be included, as a component for capturing an image, in the video camera.

Figure 31E:
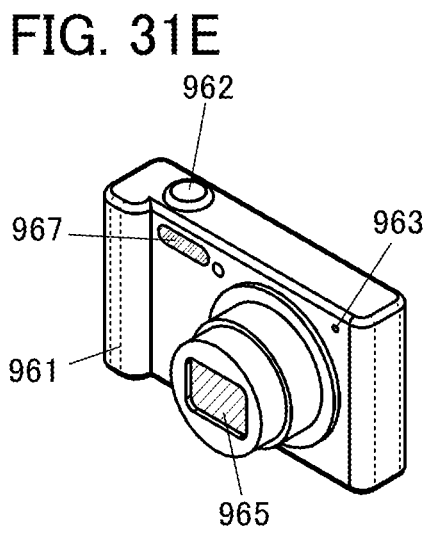

FIG. 31(E) is a digital camera, which includes a housing 961, a shutter button 962, a microphone 963, a light-emitting portion 967, a lens 965, and the like. The imaging device of one embodiment of the present invention can be included, as a component for capturing an image, in the digital camera.

Figure 31F:
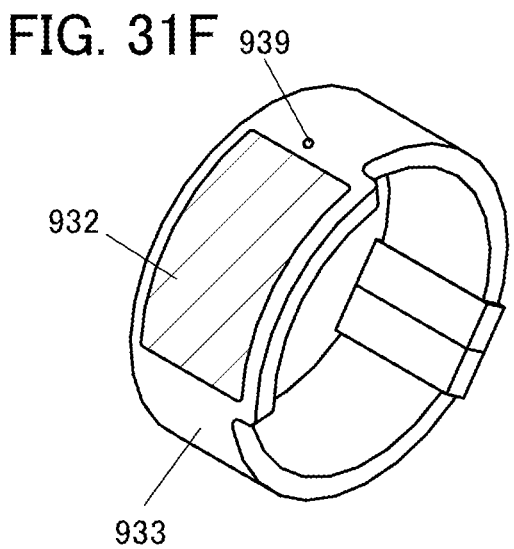

FIG. 31(F) is a wrist-watch-type information terminal, which includes a display portion 932, a housing and wristband 933, a camera 939, and the like. The display portion 932 is provided with a touch panel for performing the operation of the information terminal. The display portion 932 and the housing and wristband 933 have flexibility and fit a body well. The imaging device of one embodiment of the present invention can be included, as a component for capturing an image, in the information terminal.

This embodiment can be combined with the description of other embodiments as appropriate.

REFERENCE NUMERALS

11a: pixel, 11b: pixel, 12a: pixel, 12b: pixel, 13a: pixel, 13b: pixel, 14a: pixel, 14b: pixel, 15a: pixel, 15b: pixel, 16a: pixel, 16b: pixel, 17a: pixel, 17b: pixel, 20: memory cell, 101: photoelectric conversion element, 102: transistor, 103: transistor, 104: transistor, 105: transistor, 106: capacitor, 107: transistor, 108: transistor, 109: transistor, 110: transistor, 111: transistor, 112: transistor, 113: wiring, 114: capacitor, 115: transistor, 116: transistor, 117: transistor, 120: transistor, 121: wiring, 122: wiring, 123: wiring, 124: wiring, 125: wiring, 126: wiring, 128: wiring, 131: wiring, 133: wiring, 134: wiring, 135: wiring, 136: wiring, 137: wiring, 138: wiring, 151: transistor, 152: transistor, 160: circuit, 161: pixel, 162: reference pixel, 170: circuit, 171: circuit, 172: circuit, 173: circuit, 180: pixel array, 410: package substrate, 420: cover glass, 451: image sensor chip, 531: conductive layer, 532: conductive layer, 533: conductive layer, 534: conductive layer, 535: back gate, 536: region, 537: conductive layer, 540: silicon substrate, 541: insulating layer, 542: insulating layer, 543: insulating layer, 545: semiconductor layer, 546: insulating layer, 561: layer, 562: layer, 563: layer, 565a: layer, 565b: layer, 565c: layer, 566a: layer, 566b: layer, 566c: layer, 566d: layer, 580: insulating layer, 581: light-blocking layer, 582: organic resin layer, 583: color filter, 583a: color filter, 583b: color filter, 583c: color filter, 584: microlens array, 585: optical conversion layer, 586: insulating layer, 610: package substrate, 611: package substrate, 620: cover glass, 621: lens cover, 630: adhesive, 635: lens, 640: bump, 641: land, 650: image sensor chip, 651: image sensor chip, 660: electrode pad, 661: electrode pad, 670: wire, 671: wire, 690: IC chip, 911: housing, 912: display portion, 913: speaker, 919: camera, 932: display portion, 933: housing and wristband, 939: camera, 951: support base, 952: camera unit, 953: protection cover, 961: housing, 962: shutter button, 963: microphone, 965: lens, 967: light-emitting portion, 971: housing, 972: housing, 973: display portion, 974: operation key, 975: lens, 976: connection portion, 977: speaker, 978: microphone, 981: housing, 982: display portion, 983: operation button, 984: external connection port, 985: speaker, 986: microphone, 987: camera

The invention claimed is:
1. An imaging device comprising:
a photoelectric conversion element;
a first transistor;
a second transistor; and
a first inverter circuit,
wherein one of a source and a drain of the first transistor is electrically connected to one electrode of the photoelectric conversion element,
wherein one of a source and a drain of the second transistor is electrically connected to the one electrode of the photoelectric conversion element, wherein an input terminal of the first inverter circuit is electrically connected to the one electrode of the photoelectric conversion element, and wherein the first transistor and the second transistor are each a transistor comprising a metal oxide in a channel formation region.

2. The imaging device according to claim 1, further comprising:

a second inverter circuit, wherein an input terminal of the second inverter circuit is electrically connected to an output terminal of the first inverter circuit.

3. The imaging device according to claim 1, further comprising:

a third transistor, wherein a gate of the third transistor is electrically connected to an output terminal of the first inverter circuit, and wherein one of a source and a drain of the third transistor is electrically connected to the input terminal of the first inverter circuit.

4. The imaging device according to claim 2, further comprising:

a fourth transistor, wherein a gate of the fourth transistor is electrically connected to an output terminal of the second inverter circuit, and wherein one of a source and a drain of the fourth transistor is electrically connected to the input terminal of the first inverter circuit.

5. The imaging device according to claim 2, further comprising:

a first capacitor, wherein one electrode of the first capacitor is electrically connected to an output terminal of the second inverter circuit, and wherein the other electrode of the first capacitor is electrically connected to the input terminal of the first inverter circuit.

6. The imaging device according to claim 2, further comprising:

a second capacitor, wherein one electrode of the second capacitor is electrically connected to the output terminal of the first inverter circuit, and wherein the other electrode of the second capacitor is electrically connected to the input terminal of the first inverter circuit.

7. The imaging device according to claim 1, further comprising:

a fifth transistor; a sixth transistor; and a seventh transistor, wherein one of a source and a drain of the fifth transistor is electrically connected to the other of the source and the drain of the first transistor, wherein the one of the source and the drain of the fifth transistor is electrically connected to a gate of the sixth transistor, wherein one of a source and a drain of the sixth transistor is electrically connected to one of a source and a drain of the seventh transistor, and wherein the one of the source and the drain of the sixth transistor is electrically connected to a gate of the fifth transistor.

8. The imaging device according to claim 7, wherein the sixth transistor has an opposite polarity to the fifth transistor and the seventh transistor.

9. The imaging device according to claim 1, further comprising:

an eighth transistor; and a ninth transistor, wherein the other of a source and a drain of the eighth transistor is electrically connected to the other of the source and the drain of the first transistor, wherein one of a source and a drain of the ninth transistor is electrically connected to one power supply terminal of the first inverter circuit, and wherein the one of the source and the drain of the ninth transistor is electrically connected to a gate of the eighth transistor.

10. The imaging device according to claim 1, wherein the metal oxide comprises In, Zn, and M, and wherein M is one of Al, Ti, Ga, Sn, Y, Zr, La, Ce, Nd, and Hf.

11. An imaging device comprising:

a pixel portion; and a memory portion electrically connected to the pixel portion, wherein the pixel portion is configured to obtain first data by photoelectric conversion and generate second data by binarizing the first data, wherein the pixel portion comprises a photoelectric conversion element, a first transistor, a second transistor, and an inverter circuit, wherein one of a source and a drain of the first transistor is electrically connected to one electrode of the photoelectric conversion element, wherein one of a source and a drain of the second transistor is electrically connected to the one electrode of the photoelectric conversion element, and wherein an input terminal of the inverter circuit is electrically connected to the one electrode of the photoelectric conversion element.

12. The imaging device according to claim 11, wherein the memory portion comprises a capacitor, a third transistor, and a fourth transistor, wherein one electrode of the capacitor is electrically connected to an output terminal of the inverter circuit, wherein the other electrode of the capacitor is electrically connected to one of a source and a drain of the third transistor, and wherein the one of the source and the drain of the third transistor is electrically connected to a gate of the fourth transistor.

13. The imaging device according to claim 12, wherein the first transistor and the second transistor are each a transistor comprising a metal oxide in a channel formation region.

14. The imaging device according to claim 13, wherein the metal oxide comprises In, Zn, and M, and wherein M is one of Al, Ti, Ga, Sn, Y, Zr, La, Ce, Nd, and Hf.

* * * * *